US009863595B2

(12) United States Patent
Takahira et al.

(10) Patent No.: US 9,863,595 B2
(45) Date of Patent: Jan. 9, 2018

(54) LIGHT-EMITTING UNIT WITH OPTICAL PLATE REFLECTING EXCITATION LIGHT AND TRANSMITTING FLUORESCENT LIGHT, AND LIGHT-EMITTING DEVICE, ILLUMINATION DEVICE, AND VEHICLE HEADLIGHT INCLUDING THE UNIT

(71) Applicant: Sharp Kabushiki Kaisha, Osaka-shi (Province Osaka) (JP)

(72) Inventors: Yoshiyuki Takahira, Osaka (JP); Koji Takahashi, Osaka (JP); Yosuke Maemura, Osaka (JP); Tomohiro Sakaue, Osaka (JP); Kensei Toyota, Osaka (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 94 days.

(21) Appl. No.: 14/456,666

(22) Filed: Aug. 11, 2014

(65) Prior Publication Data
US 2015/0062943 A1 Mar. 5, 2015

(30) Foreign Application Priority Data

Aug. 28, 2013 (JP) ................................ 2013-177316
Oct. 29, 2013 (JP) ................................ 2013-224748
Mar. 11, 2014 (JP) ................................ 2014-048151

(51) Int. Cl.
*F21S 8/10* (2006.01)
*F21V 9/16* (2006.01)
(Continued)

(52) U.S. Cl.
CPC ........ *F21S 48/1145* (2013.01); *B60Q 1/0023* (2013.01); *F21S 48/1225* (2013.01);
(Continued)

(58) Field of Classification Search
CPC ............... F21S 48/1136; F21S 48/1225; F21S 48/1241; F21S 48/1317; F21S 48/1323; F21S 48/1388; F21S 48/1394; F21S 48/1145–48/1163; F21V 9/16; F21K 9/56; B60Q 2400/20; B60Q 1/2696
See application file for complete search history.

(56) References Cited

U.S. PATENT DOCUMENTS 5,998,925 A 12/1999 Shimizu et al.
2003/0198060 A1* 10/2003 Ishida .................. F21S 48/1159
362/516
(Continued)

FOREIGN PATENT DOCUMENTS

JP 2000-208815 7/2000
JP 2005-150041 6/2005
(Continued)

Primary Examiner — Anh Mai
Assistant Examiner — Steven Horikoshi
(74) Attorney, Agent, or Firm — Morrison & Foerster LLP

(57) ABSTRACT

A light-emitting unit according to the present invention includes: a fluorescent section for emitting light upon irradiation with a laser beam; and a wavelength selection filter being provided so as to face the fluorescent section. The wavelength selection filter reflects the laser beam toward the fluorescent section and transmits fluorescence emitted from the fluorescent section.

18 Claims, 34 Drawing Sheets

(51) Int. Cl.
*B60Q 1/00* (2006.01)
*F21Y 115/30* (2016.01)
*F21Y 115/10* (2016.01)

(52) U.S. Cl.
CPC ....... *F21S 48/1317* (2013.01); *F21S 48/1388* (2013.01); *F21S 48/1757* (2013.01); *F21S 48/328* (2013.01); *F21V 9/16* (2013.01); *F21Y 2115/10* (2016.08); *F21Y 2115/30* (2016.08); *H01L 2224/48091* (2013.01)

(56) References Cited

U.S. PATENT DOCUMENTS

| | | | |
|---|---|---|---|
| 2004/0145913 | A1* | 7/2004 | Ouderkirk .............. H01L 33/46 362/555 |
| 2005/0105301 | A1 | 5/2005 | Takeda et al. |
| 2005/0270775 | A1 | 12/2005 | Harbers et al. |
| 2006/0139926 | A1 | 6/2006 | Morioka et al. |
| 2006/0203468 | A1* | 9/2006 | Beeson ............... G02B 27/286 362/84 |
| 2010/0046234 | A1* | 2/2010 | Abu-Ageel ......... G02B 3/0006 362/308 |
| 2010/0295438 | A1* | 11/2010 | Ott ..................... F21K 9/00 313/46 |
| 2011/0157865 | A1* | 6/2011 | Takahashi ............. F21S 48/115 362/84 |
| 2011/0182056 | A1* | 7/2011 | Trottier ................ H01L 33/507 362/84 |
| 2011/0249436 | A1* | 10/2011 | Li ............................ F21V 9/16 362/235 |
| 2011/0280039 | A1* | 11/2011 | Kishimoto ........... B60Q 1/0011 362/554 |
| 2012/0104934 | A1 | 5/2012 | Fukai et al. |
| 2012/0224384 | A1 | 9/2012 | Takahira et al. |
| 2013/0057833 | A1 | 3/2013 | Katou |
| 2013/0314937 | A1 | 11/2013 | Takahashi et al. |
| 2014/0355240 | A1* | 12/2014 | Farchtchian ........... H04N 9/315 362/84 |

FOREIGN PATENT DOCUMENTS

| | | |
|---|---|---|
| JP | 2005-347263 | 12/2005 |
| JP | 2006-210887 | 8/2006 |
| JP | 2010-232044 | 10/2010 |
| JP | 2011-142000 | 7/2011 |
| JP | 2012-48847 | 3/2012 |
| JP | 2012-54084 | 3/2012 |
| JP | 2012-99283 | 5/2012 |
| JP | 2012-182281 | 9/2012 |
| JP | 2012-185939 | 9/2012 |
| JP | 2013-246943 | 12/2013 |
| WO | WO-2011/145208 | 11/2011 |
| WO | WO-2013/055412 | 4/2013 |
| WO | WO-2013/094222 | 6/2013 |

* cited by examiner (a)

FLUORESCENT SECTION SIDE (b)

FLUORESCENT SECTION SIDE

LIGHT-EMITTING UNIT WITH OPTICAL PLATE REFLECTING EXCITATION LIGHT AND TRANSMITTING FLUORESCENT LIGHT, AND LIGHT-EMITTING DEVICE, ILLUMINATION DEVICE, AND VEHICLE HEADLIGHT INCLUDING THE UNIT

CROSS-REFERENCE TO RELATED APPLICATIONS

This nonprovisional application claims priority under 35 U.S.C. §119 on Patent Application No. 2013-177316 filed in Japan on Aug. 28, 2013, Patent Application No. 2013-224748 filed in Japan on Oct. 29, 2013, and Patent Application No. 2014-048151 filed in Japan on Mar. 11, 2014, the entire contents of which are hereby incorporated by reference.

FIELD OF THE INVENTION

The present invention relates to a light-emitting unit, a light-emitting device, an illumination device, and a vehicle headlight each of which emits, as illumination light, light that is generated by irradiating a light emitting section with excitation light.

BACKGROUND OF THE INVENTION

In recent years, there has been suggested an illumination device which emits, as illumination light, fluorescence that is generated by irradiating a light emitting section containing particles of a fluorescent material with excitation light emitted by an excitation light source (i.e. semiconductor light emitting element) such as a semiconductor laser (LD; Laser Diode).

The above light emitting section, which contains particles of a fluorescent material, can be classified, according to a light emission method, into: (1) a light emitting section configured to exit fluorescence from a counter surface thereof, which is an opposite side thereof with respect to an excitation light irradiation surface thereof to be irradiated with excitation light; and (2) a light emitting section configured to exit fluorescence from an excitation light irradiation surface thereof to be irradiated with excitation light (this type of light emitting section is referred hereinafter to as "reflection-type light emitting section").

Examples of an illumination device including such a reflection-type light emitting section include illumination devices disclosed by Patent Literatures 1 and 2. The illumination device disclosed by Patent Literature 1 is configured such that a reflector for controlling distribution of fluorescence that is generated by a light emitting section is provided between an excitation light source and the light emitting section, and a wavelength selection filter for removing excitation light and selectively transmitting fluorescence is provided at an opening of the reflector. In this illumination device, excitation light emitted from the excitation light source passes through a light passage hole of the reflector, so that the light emitting section is irradiated with the excitation light. Then, fluorescence generated by that irradiation is reflected by the reflector and then cast in desired light distribution under control of the reflector.

Here, in the illumination device disclosed by Patent Literature 1, the light emitting section is provided in such a position that a direction in which fluorescence is extracted is opposite to a direction in which the illumination device casts light. Thus, the illumination device disclosed by Patent Literature 1 needs to reflect, in the direction in which the illumination device casts light (i.e. toward the opening of the reflector), fluorescence generated by the light emitting section. This arrangement disables the use of a lens or other light distribution controlling member, instead of the reflector, and places limitation on the type of the light distribution controlling member available for this arrangement.

On the contrary, Patent Literature 2 discloses an illumination device in which an excitation light source and other component(s) are placed between a light emitting section and a convex lens for controlling light distribution of fluorescence generated by the light emitting section. In this illumination device, excitation light emitted from the excitation light source enters the light emitting section. Then, fluorescence generated by that irradiation is cast in desired light distribution under control of a convex lens.

According to the illumination device disclosed by Patent Literature 2, the light emitting section is so placed that a direction in which fluorescence is extracted is identical to a direction in which light is cast by the illumination device. This makes it possible to suitably use a light distribution controlling member such as a lens.

FIG. 35 is a cross-sectional view illustrating the configuration of the conventional illumination device 300, which is disclosed by Patent Literature 2. As illustrated in FIG. 35, the illumination device 300 includes an excitation light source 301, a collimator lens 305, a light emitting section 308, and a convex lens 310.

The light emitting section 308 is a reflection-type light emitting section configured such that fluorescence is extracted from an excitation light irradiation surface (upper surface) 308a to be irradiated with excitation light L3. In order to irradiate the excitation light irradiation surface 308a of the light emitting section 308 with the excitation light L3, the excitation light source 301 and the collimator lens 305 are provided between the light emitting section 308 and the convex lens 310 and provided to be slanted with respect to the excitation light irradiation surface 308a.

PATENT LITERATURES

Patent Literature 1
Japanese Patent Application Publication, Tokukai, No. 2005-150041 (Published on Jun. 9, 2005)
Patent Literature 2
Japanese Patent Application Publication, Tokukai, No. 2010-232044 (Published on Oct. 14, 2010)

SUMMARY OF THE INVENTION

Unfortunately, the illumination device 300, which is configured such that the excitation light source 301 and the collimator lens 305 are placed between the light emitting section 308 and the convex lens 310, problematically decreases the efficiency of light use.

Specifically, the configuration in which the excitation light source 301 and other component(s) are placed between the light emitting section 308 and the convex lens 310 causes a portion of fluorescence emitted from the light emitting section 308 in Lambertian distribution to be blocked by the excitation light source 301 and the other component. This results in inefficient use of fluorescence.

In order for the convex lens 310 to cast, without losses of light, the fluorescence released in Lambertian distribution from the light emitting section 308, it is preferable that the convex lens 310 be placed as closely to the light emitting section 308 as possible. However, the illumination device 300 requires finding a room to place the excitation light source 301 and the collimator lens 305 in between the light emitting section 308 and the convex lens 310. For this reason, it is difficult to place the convex lens 310 closely to the light emitting section 308.

The present invention has been attained to solve the above problem, and an object of the present invention is to provide a light-emitting unit having improved efficiency of light use.

In order to solve the above problem, a light-emitting unit according to one aspect of the present invention includes: a light emitting section for emitting emission light upon irradiation with excitation light; and an optical plate being provided so as to face the light emitting section, the optical plate (i) reflecting, toward the light emitting section, the excitation light emitted from an excitation light source and (ii) transmitting the emission light emitted from the light emitting section upon irradiation with the excitation light.

According to one aspect of the present invention, the present invention yields the effect of providing a light-emitting unit having improved efficiency of light use.

DETAILED DESCRIPTION OF THE INVENTION

The following will describe an embodiment of the present invention with reference to FIGS. 1 through 11. In Embodiment 1, an example of a light-emitting device including a light-emitting unit in accordance with the present invention will be described.

First, a light-emitting device 100 in accordance with Embodiment 1 will be described with reference to FIG. 1. The light-emitting device 100 emits, as illumination light, fluorescence (emission light) L2 that is generated by illuminating the fluorescent section 8, which contains particles of a fluorescent material, with the laser beam L1.

Figure 1:
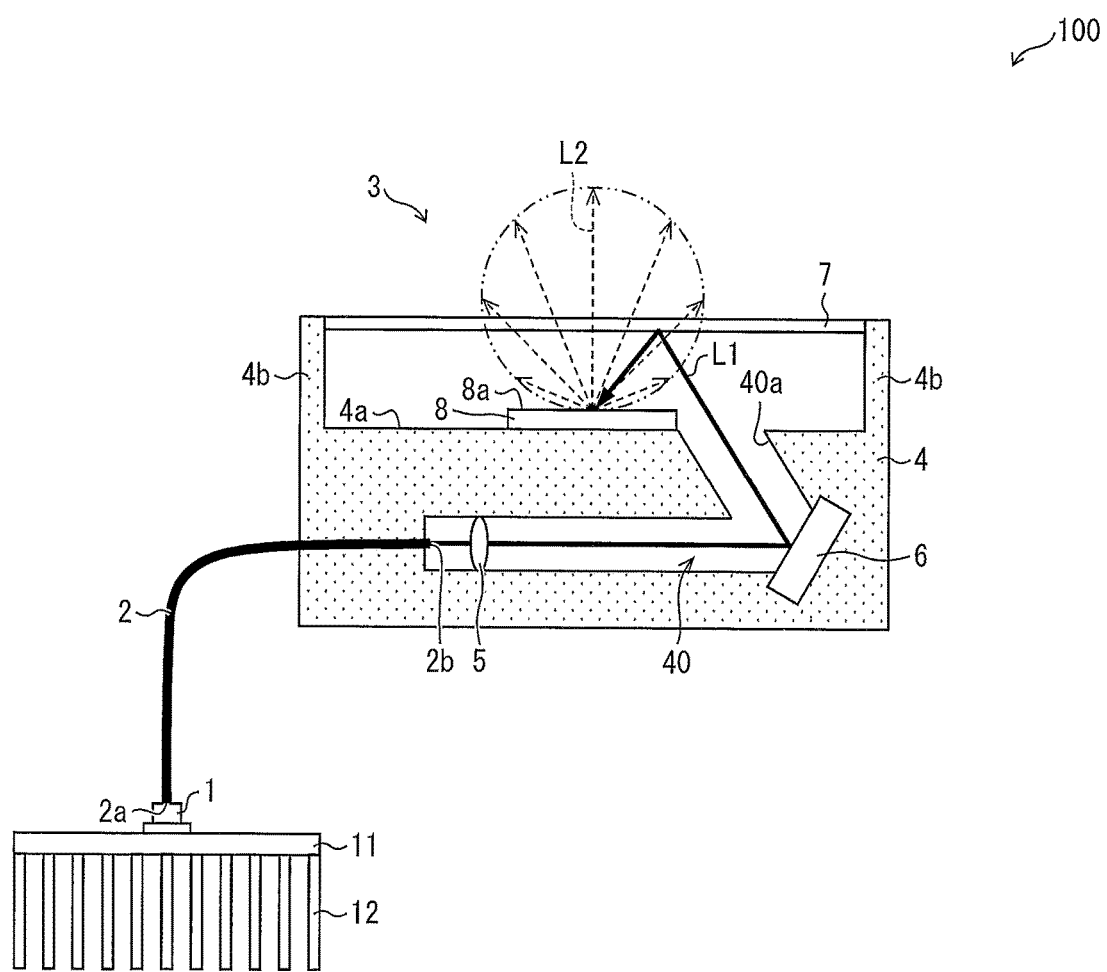
FIG. 1 is a cross-sectional view illustrating the configuration of a light-emitting device in accordance with Embodiment 1.

FIG. 1 is a cross-sectional view illustrating the configuration of the light-emitting device 100 in accordance with Embodiment 1. As illustrated in FIG. 1, the light-emitting device 100 includes a laser element (excitation light source) 1, an optical fiber (light guiding section) 2, and a light-emitting unit 3. The light-emitting device 100 is configured such that the laser element 1 and the light-emitting unit 3 are connected to each other via the optical fiber 2. The following will describe how the sections included in the light-emitting device 100 are configured.

The laser element 1 is a light emitting element functioning as an excitation light source to emit laser light (excitation light). The laser element 1 can have, per chip, a single light emitting point or a plurality of light emitting points. The wavelength of a laser beam L1 emitted from the laser element 1 is, for example, in a range from 365 nm to 439 nm, and preferably from 390 nm (bluish-purple) to 410 nm (bluish-purple). However, the wavelength of the laser beam L1 is not limited to such wavelengths, and can therefore be appropriately selected in accordance with, for example, (i) a type of fluorescent material contained in the fluorescent section (light emitting section) 8, which is included in the light-emitting unit 3, and (ii) wavelength selectivity of a wavelength selection filter 7, which will be described later. A preferred concrete example of the wavelength of the laser beam L1 emitted from the laser element 1 will be described together with characteristics of the wavelength selection filter 7.

The laser element 1 is connected to a heat sink 11. The heat sink 11 dissipates heat generated by the laser element 1, through a heat dissipating fin 12 or the like. Thus, a metallic material having high thermal conductivity, such as aluminum, is preferably used for the heat sink 11.

The heat dissipating fin 12 is provided in the heat sink 11 and functions as a heat dissipation system to dissipate heat of the heat sink 11 into the air. The heat dissipating fin 12 is constituted by a plurality of heat dissipating plates. This intends to increase an area exposed to the air, thereby enhancing heat dissipation efficiency. As in the case with the heat sink 11, a material having high thermal conductivity is preferably used for the heat dissipating fin 12.

The laser element 1 has a capability of generating heat when it emits a laser beam L1. However, such a capability cannot be fully exerted in a high temperature condition. Hence, with the heat sink 11 and the heat dissipating fin 12 provided, it is possible to prevent the laser element 1 from being exposed to high temperatures. Note that a water-cooled system or a forced-air cooled system may be used as a heat dissipation system of the laser element 1.

In Embodiment 1, one (1) laser element 1 is used as the excitation light source of the light-emitting device 100. However, this is not the only possibility.

For example, excitation intensity may be increased by any of the following methods: a (1) method of using a plurality of laser elements 1 so that laser beams L1 emitted from the respective laser elements 1 may be coupled to an optical fiber 2 by means of an optical element (optical member) such as a lens or a mirror; and a (2) method of causing laser beams L1 emitted respectively from a plurality of laser elements 1 to be coupled to a plurality of optical fibers 2 tied into bundle, respectively.

Alternatively, the excitation light source may be, for example, an LED (Light Emitting Diode). However, the excitation light source is preferably the laser element 1 because the laser element 1 is higher than the LED in coupling efficiency with respect to the optical fiber 2.

The optical fiber 2 is a light guiding section to guide, to the light-emitting unit 3, a laser beam L1 emitted from the laser element 1. The optical fiber 2 has: an entry end 2a to receive a laser beam L1 emitted from the laser element 1; and an emission end 2b to emit the incoming laser beam L1 from the entry end 2a. The entry end 2a is connected to the laser element 1, and the emission end 2b is connected to the light-emitting unit 3.

The optical fiber 2 has a double layer structure in which a central core is covered with a clad which has a refractive index lower than that of the central core. The central core contains, in major proportions, quartz glass (silicon oxide) which causes almost no absorption loss of an incoming laser beam L1. The clad contains, in major proportions, one of a quartz glass and a synthetic resin material both of which have a refractive index lower than that of the central core.

For example, the optical fiber 2, made of quartz, has a core diameter of 200 μm, a clad diameter of 240 μm, and a numerical aperture NA of 0.22. Note, however, that the structure of, the diameter of, and the material for the optical fiber 2 are not limited to the ones mentioned above. As such, a cross section of the optical fiber 2, which cross section is perpendicular to a long axis direction of the optical fiber 2, can have any shape, such as a rectangular shape.

In a case where a plurality of laser elements 1 are to be employed, a bundle fiber may be employed in which a plurality of optical fibers 2 tied into bundle are optically coupled to the respective laser elements 1. In this case, it is preferable to employ a light guiding section in which an emission end of a bundle fiber is placed in proximity to a multimode fiber having a core diameter of 200 μm or abuts the multimode fiber so that the bundle fiber and the multimode fiber are optically coupled to each other.

The multimode fiber guides a plurality of laser beams L1 entered from a plurality of optical fibers 2 tied into bundle. In such a configuration, these laser beams L1 in the multimode fiber travel while being repeatedly reflected inside the multimode fiber. As such, these laser beams L1 are mixed with each other by being guided through the multimode fiber. With an appropriately selected length of the multimode fiber, a resultant laser beam L1 to be emitted from the emission end of the multimode fiber can have a continuous and smooth intensity distribution.

Thus, with use of the light guiding section in which the (a) bundle fiber and the (b) multimode fiber are optically coupled to each other, it is possible to generate, from a plurality of laser beams L1 emitted from respective light emitting points of a plurality of laser elements 1, a resulting laser beam L1 having a continuous, smooth, top hat type intensity distribution and emitted from a single light emitting point (the emission end of the multimode fiber).

It should be noted that the "single light emitting point" used herein refers to a light emitting point which does not have a maximum value that is 50% or more of a peak intensity. It is therefore possible to use a lens 5 to form, on a laser beam irradiation surface 8a of the fluorescent section 8, an image corresponding to a laser beam L1 having a top hat type intensity distribution. This obviates local excitation of only a part of the fluorescent section 8 even when a high-power laser beam L1 is directed to the fluorescent section 8.

This, in turn, makes it possible to curb deterioration of the fluorescent section 8 and decreased efficiency in light emission of the fluorescent section 8, while achieving a high-power laser beam L1. Further, since local excitation of only a part of the fluorescent section 8 does not occur, it is possible to reduce the occurrence of uneven luminance of the fluorescence L2 to be emitted from the fluorescent section 8.

As the light guiding section to optically couple the laser element 1 to the light-emitting unit 3, a member other than the optical fiber 2 may be employed, and the type of the light guiding section is not particularly limited. Further, as described later, a laser beam(s) L1 emitted from the laser element(s) 1 may be caused to directly enter the light-emitting unit 3, without using the optical fiber 2.

The light-emitting unit 3 intends to generate fluorescence L2 by irradiation of the fluorescent section 8, which contains a fluorescent material, with a laser beam L1 emitted from the laser element 1 and then release the fluorescence L2 thus generated. The light-emitting unit 3 includes: a casing (placement section) 4; a lens 5; a mirror (reflection mirror) 6; a wavelength selection filter (optical plate) 7; and the fluorescent section 8.

The casing (heat dissipation base) 4 is a support on which the fluorescent section 8 is placed. The casing 4 is made from, for example, a highly thermally conductive material such as metal (aluminum, stainless steel, copper, or iron). The casing 4 has a placement surface 4a on which the fluorescent section 8 is placed, and the fluorescent section 8 is placed in such a state so as to abut on the placement surface 4a. This allows the casing 4 to efficiently dissipate, by conduction, heat generated by the fluorescent section 8.

It should be noted that the casing 4 is not limited to the one made from a metal, and can therefore be a member containing, other than metal, a highly thermally conductive substance (such as ceramic). It is preferable that the placement surface 4a on which the fluorescent section 8 abuts functions as a reflective surface. Since the placement surface 4a on which the fluorescent section 8 abuts is a reflective surface, fluorescence L2, which is generated by conversion of a laser beam L1 entering the laser beam irradiation surface 8a, i.e., a top surface of the fluorescent section 8, to be irradiated with the laser beam L1, can be reflected by the reflective surface so as to be directed toward the wavelength selection filter 7. Alternatively, the laser beam L1 entering the laser beam irradiation surface 8a can be reflected by the reflective surface so as to be directed again toward the interior of the fluorescent section 8, thereby being converted into fluorescence L2.

It should be noted that the casing 4 may include a heat dissipation fin (not illustrated). The heat dissipation fin functions as a cooling section for cooling down the casing 4. The heat dissipation fin is made up of a plurality of heat dissipating plates. A heat dissipation efficiency of the heat dissipation fin is enhanced by increasing an area where the casing 4 comes into contact with air. The cooling section for cooling down the casing 4 is not limited to a specific one as long as it has a cooling (heat radiation) function. The heat dissipation fin may be replaced with a heat pipe, a water-cooled system, or a forced-air-cooled system.

The casing 4 includes an internal passage 40 having an open end provided in a region of the placement surface 4a in which region the fluorescent section 8 is absent. The internal passage 40 is a tubular pathway through which a laser beam L1 is to be passed. The internal passage 40 allows the laser beam L1 entering the internal passage 40 from a starting end (the other end) of the internal passage 40 to exit from an opening 40a which is located at an ending end (one end) of the internal passage 40.

In Embodiment 1, the starting end of the internal passage 40 is located within the casing 4. The internal passage 40 extends along an in-plane direction of the placement surface 4a. Also, the internal passage 40 has a bending part which bends (at an angle of approximately 135 degrees) toward the placement surface 4a with respect to the in-plane direction, and the internal passage 40 has an open end at the placement surface 4a.

The starting end of the internal passage 40 is connected to the emission end 2b of the optical fiber 2 inserted into the casing 4 through a side surface of the casing 4, so that a laser beam L1 entering the starting end passes through the internal passage 40 and then exits from the opening 40a toward the wavelength selection filter 7. In the internal passage 40, the lens 5 and the mirror 6 are provided in this order when seen from an upstream side of the internal passage 40 along a direction in which the laser beam L1 travels through the internal passage 40.

The lens 5 is an optical element for adjusting (enlarging and reducing) a beam diameter (irradiation range) of an incoming laser beam L1 so that the laser beam L1 can properly strike the mirror 6. The lens 5, which is provided in the internal passage 40 of the casing 4, performs control over a beam diameter and an optical path of a laser beam L1 emitted from the emission end 2b of the optical fiber 2 and then directs the resulting laser beam L1 toward the mirror 6. The lens 5 is constituted by, for example, a convex lens.

Adjustment of the beam diameter with use of the lens 5 facilitates controlling a spot size of a final laser beam L1 with which the fluorescent section 8 is to be irradiated.

The mirror 6 intends to reflect a laser beam L1 toward the wavelength selection filter 7. Specifically, the mirror 6 has a flat reflective surface and is provided at the bending part of the internal passage 40. The mirror 6 reflects, at the bending part, a laser beam L1 entering the starting end of the internal passage 40, toward the opening 40a. This makes it possible to cause the laser beam L1 to (i) exit from the opening 40a and (ii) be directed toward the wavelength selection filter 7.

With the mirror 6 provided, it is possible to adjust the angle of incidence of a laser beam L1 with respect to the wavelength selection filter 7 by changing an installation angle (inclination) of the mirror 6. This allows an easy adjustment of the incidence angle of the laser beam L1 with respect to the wavelength selection filter 7, as compared with the arrangement in which a change is made in installation angle of the emission end 2b of the optical fiber 2.

Further, folding an optical path of the laser beam L1 in the light-emitting unit 3 with use of the mirror 6 enables offering a high degree of freedom in designing the layout of an interior of the light-emitting unit 3 and thus enables significant reductions in size and volume of the light-emitting unit 3. It should be noted that depending upon the layout of the inner pathway 40 in the light-emitting unit 3, the mirror 6 can be omitted, as described later.

It should be noted that the mirror 6 may be replaced with another optical element (reflection mirror) such as a dielectric multilayer film mirror or a concave mirror. This allows the light-emitting unit 3 to have various functions while maintaining a small size of the light-emitting unit 3. The arrangement in which a dielectric multilayer film mirror or a concave mirror is employed as a reflection mirror will be described later.

The wavelength selection filter 7 is a plate-shaped light transmission member having transparency to light and is provided so as to face the laser beam irradiation surface 8a of the fluorescent section 8. An outer edge of the wavelength selection filter 7 is supported by a supporting part 4b of the casing 4 and is provided in substantially parallel to the laser beam irradiation surface 8a of the fluorescent section 8.

The wavelength selection filter 7 reflects a laser beam L1, while transmitting fluorescence L2. That is, the wavelength selection filter 7 has wavelength selectivity of reflecting the laser beam L1 and transmitting the fluorescence L2.

Owing to such wavelength selectivity of the wavelength selection filter 7, the wavelength selection filter 7 reflects, toward the fluorescent section 8, the laser beam L1 exiting from the opening 40a so as to irradiate the fluorescent section 8 with the laser beam L1 thus reflected.

As described above, the wavelength selection filter 7 reflects, toward the fluorescent section 8, the laser beam L1 exiting from the opening 40a, which is provided at the placement surface 4a where the fluorescent section 8 is placed. This facilitates placing the laser element 1 on the placement surface 4a side with respect to the fluorescent section 8, thus allowing the laser element 1 to be suitably placed at such a position that fluorescence L2 emitted from the fluorescent section 8 is not blocked by the laser element 1.

Further, the wavelength selection filter 7 transmits fluorescence L2 emitted from the laser beam irradiation surface 8a of the fluorescent section 8 upon irradiation with the laser beam L1. In this arrangement, it is preferable that the wavelength selection filter 7 reflects, toward the fluorescent section 8, a portion of the laser beam L1 which portion has failed to be converted into the fluorescence L2, out of the laser beam L1 having struck the fluorescent section 8. Most of the laser beam L1 is absorbed by the fluorescent material of the fluorescent section 8 to be converted into the fluorescence L2. However, an event that a portion of the laser beam L1 fails to be converted into the fluorescence L2 can occur due to some cause. Even in such an event, the wavelength selection filter 7 reflects, toward the fluorescent section 8, the laser beam L1 which has failed to be converted into the fluorescence L2. This makes it possible to prevent the laser beam L1 from being leaked out of the light-emitting unit 3. This allows the laser beam L1 to be completely confined within the casing 4, thus enabling safe handling of the laser beam L1.

The wavelength selection filter 7 having the wavelength selectivity as described above is provided with a multilayer structure having a combination of thin layers having mutually different refractive indices. The wavelength selection filter 7 will be described in detail later.

The fluorescent section 8 emits light upon irradiation with the laser beam L1 and contains a fluorescent material that generates fluorescence (emission light) L2 upon excitation by the laser beam L1. For example, the fluorescent section 8 can be prepared, for example, by dispersing a fluorescent material in a sealant or by solidifying a fluorescent material.

The fluorescent section 8 converts a laser beam L1 into fluorescence L2 and can therefore be referred to as a wavelength conversion member.

Examples of the fluorescent material for the fluorescent section 8 include oxynitride fluorescent materials (such as sialon fluorescent materials) and III-V compound semiconductor nanoparticle fluorescent materials (such as indium phosphate: InP). These fluorescent materials are preferably employed because they have high resistance to heat caused by a high-powered (and/or high light density) laser beam L1 emitted from the laser element 1. Note, however, that examples of the fluorescent material for the fluorescent section 8 are not limited to the above ones and can include another fluorescent material, such as nitride fluorescent material.

Examples of the sealing material for the fluorescent section 8 include glass materials (inorganic glass, organic/inorganic hybrid glass) and a resin material such as silicone resins. A glass with a low melting point can be employed as the glass material. The sealing material preferably has high transparency. The sealing material preferably has high resistance to heat in a case where a high-powered laser beam is employed.

The fluorescent section 8 is provided on the placement surface 4a of the casing 4 so as to be irradiated with the laser beam L1 at the laser beam irradiation surface 8a thereof and so as to be mainly emit fluorescence from the laser beam irradiation surface 8a. That is, the fluorescent section 8 functions as a reflection-type light-emitting section.

In the light-emitting device 100 configured as above, the laser beam L1 emitted from the laser element 1 passes through the optical fiber 2 and then enters the internal passage 40 of the casing 4. Subsequently, the laser beam L1 entering the internal passage 40 is adjusted in beam diameter by the lens 5, is reflected by the mirror 6, and then exits from the opening 40a. The laser beam L1 exiting from the opening 40a is reflected by the wavelength selection filter 7 toward the fluorescent section 8 so that the laser beam irradiation surface 8a of the fluorescent section 8 is irradiated with the laser beam L1. The fluorescence L2 generated by such irradiation with the laser beam L1 is extracted mainly from the laser beam irradiation surface 8a, is transmitted by the wavelength selection filter 7, and is then released to the outside of the light-emitting device 100.

Next, the wavelength selection filter 7 in accordance with the Embodiment 1 will be described in detail with reference to FIGS. 2 through 4.

Figure 2:
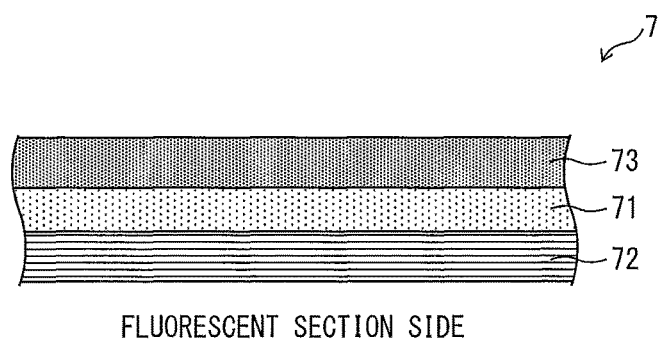
FIGS. 2 (a) and (b) are cross-sectional views each illustrating the configuration of a wavelength selection filter illustrated in FIG. 1.
Figure 2:
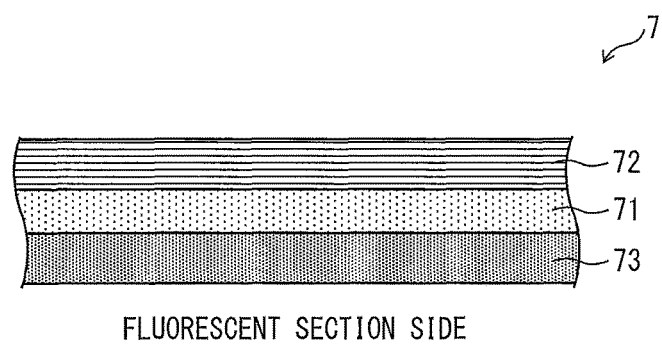

(a) and (b) of FIG. 2 are cross-sectional views each illustrating the configuration of the wavelength selection filter 7 illustrated in FIG. 1. As illustrated in (a) of FIG. 2 and (b) of FIG. 2, the wavelength selection filter 7 includes a substrate 71, a multilayer film 72, and a single-layer AR (Anti-Reflection) film 73.

As illustrated in (a) of FIG. 2, the wavelength selection filter 7 is, for example, arranged such that coating of the multilayer film 72 is applied on one surface of the substrate 71, which surface faces the fluorescent section 8, while coating of the single-layer AR film 73 is applied on the other surface of the substrate 71, which surface is opposite to the fluorescent section 8.

The substrate 71 is a substrate capable of transmitting fluorescence L2 and bearing the multilayer film 72 and the single-layer AR film 73. As the substrate, for example, BK7, synthetic quartz, superwhite glass (e.g., B270, D263Teco, BSL7), or the like can be suitably used.

The multilayer film 72 is a film prepared by multilayering of a plurality of thin films, such as a $SiO_2$ film and a $TiO_2$ film, for example. As described previously, the wavelength selection filter 7 has wavelength selectivity of reflecting a laser beam L1 and transmitting fluorescence L2. In order to realize the wavelength selectivity of the wavelength selection filter 7, the multilayer film 72 is obtained by, for instance, alternately stacking a material having a high refractive index and a material having a low refractive index in layers, wherein these materials include at least one material selected from AlN, $SiO_2$, SiN, $ZrO_2$, $TiO_2$, $Al_2O_3$, GaN, ZnS, and the like.

Note that, in order to obtain a desired wavelength selectivity of the wavelength selection filter 7, the number of layers in the multilayer film 72 is determined, and the combination of (i) types of the respective layers in the multilayer film 72 and (ii) thicknesses of the respective layers is optimized.

The single-layer AR film 73 is a single-layer film that prevents the substrate 71 from scattering and absorbing the fluorescence L2, thereby increasing the amount of fluorescence L2 transmitted by the substrate 71. A material for the single-layer AR film 73 is appropriately selected according to a wavelength of the fluorescence L2 to be transmitted by the substrate 71.

As illustrated in (b) of FIG. 2, the wavelength selection filter 7 may be arranged such that coating of the single-layer AR film 73 is applied on one surface of the substrate 71, which surface faces the fluorescent section 8, while coating of the multilayer film 72 is applied on the other surface of the substrate 71, which surface is opposite to the fluorescent section 8. However, in order to suitably obtain the wavelength selectivity of reflecting the laser beam L1 and transmitting the fluorescence L2, the arrangement as illustrated in (a) of FIG. 2, i.e., the arrangement such that coating of the multilayer film 72 is applied on one surface of the substrate 71, which surface faces the fluorescent section 8, is preferably employed.

Figure 3:
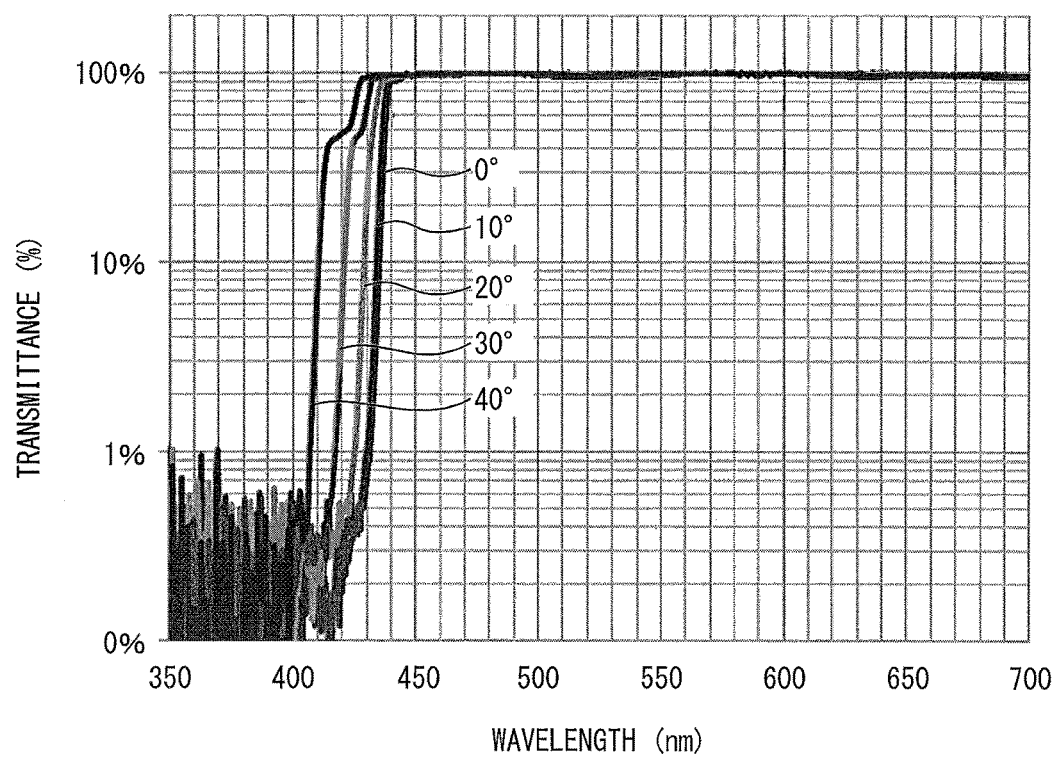
FIG. 3 is a graph for explaining wavelength selectivity of the wavelength selection filter.

FIG. 3 is a graph for explaining the wavelength selectivity of the wavelength selection filter 7. FIG. 3 illustrates a relation between a wavelength of light entering the wavelength selection filter 7 and transmittance of the wavelength selection filter 7 in a case where the angle of incidence of the light entering the wavelength selection filter 7 is 0 degree, 10 degrees, 20 degrees, 30 degrees, and 40 degrees. In FIG. 3, a horizontal axis indicates a wavelength (nm) of the light entering the wavelength selection filter 7, and a vertical axis indicates transmittance (%) of that light. Note that the angle of incidence refers to an angle which light entering the wavelength selection filter 7 forms with the normal to the wavelength selection filter 7.

As shown in FIG. 3, the wavelength selectivity of the wavelength selection filter 7 has a dependence on the wavelength and angle of incidence of the light entering the wavelength selection filter 7. For example, the wavelength selection filter 7 reflects 90% or more of incoming light having a wavelength of not more than 410 nm and entering at an incidence angle of 30 degrees or more. Meanwhile, the wavelength selection filter 7 transmits 90% or more of incoming light having a wavelength of not less than 440 nm and entering at an incidence angle of 50 degrees or less.

Hence, the laser beam L1 is preferably a laser beam having a wavelength in such a wavelength range that allows the wavelength selection filter 7 to easily reflect the laser beam. For example, a laser beam having a wavelength ranging from 390 nm to 410 nm can be suitably used as the laser beam L1. More specifically, in a case where a laser beam L1 having a wavelength of 405 nm is directed into the wavelength selection filter 7 at an incidence angle of 40 degrees, it is possible for the wavelength selection filter 7 to reflect 99% or more of the laser beam L1 entering the wavelength selection filter 7 and then direct the reflected laser beam L1 toward the fluorescent section 8.

Thus, optimizations of (a) the laminated structure of the wavelength selection filter 7, (b) the respective wavelengths of the laser beam L1 and fluorescence L2, and (c) the incidence angle of the laser beam L1 with respect to the wavelength selection filter 7 allow for reflection of light including the laser beam L1 and having short wavelengths and transmission of light including the fluorescence L2 and having long wavelengths.

Figure 4:
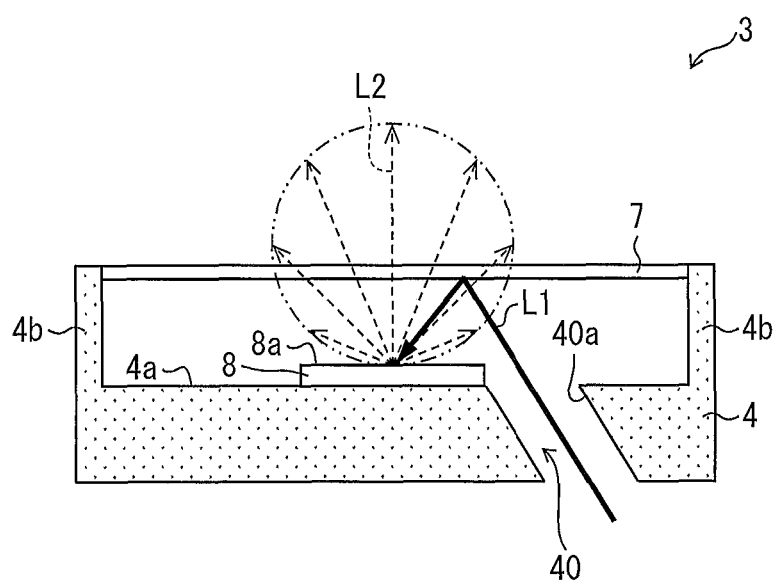
FIG. 4 is a cross-sectional view illustrating an operation of the wavelength selection filter.

FIG. 4 is a cross-sectional view illustrating an operation of the wavelength selection filter 7. As described previously, the wavelength selection filter 7 has the wavelength selectivity of reflecting the laser beam L1 and transmitting the fluorescence L2. Thus, as illustrated in FIG. 4, the wavelength selection filter 7 reflects the laser beam L1 exiting from the opening 40a. In this case, in order that the reflected laser beam L1 is reflected toward the fluorescent section 8, the angle of incidence of the laser beam L1 with respect to the wavelength selection filter 7, the positions where the fluorescent section 8 and the wavelength selection filter 7 are to be placed, and others are adjusted in advance.

Further, the wavelength selection filter 7 transmits the fluorescence L2 emitted from the laser beam irradiation surface 8a of the fluorescent section 8 upon irradiation with the laser beam L1, and then releases the fluorescence L2 to the outside. Here, (i) a portion of the laser beam L1 which portion is reflected or scattered by the laser beam irradiation surface 8a without being absorbed by the fluorescent section 8 or (ii) a stray-light component of the laser beam L1, such as a portion of the laser beam L1 which portion enters the fluorescent section 8 but is emitted from the fluorescent section 8 without being converted into fluorescence L2, is reflected by the wavelength selection filter 7, and most of the reflected portion is confined within the light-emitting unit 3. This suppresses leakage of the stray-light component of the laser beam L1 out of the light-emitting unit 3.

As described previously, the arrangement in Embodiment 1 is suitably carried out in a case where only the fluorescence L2 is to be selectively released out of the light-emitting unit 3 without leakage of the laser beam L1 out of the light-emitting unit 3. For example, in a case where white light is selected as the illumination light, a light beam having a wavelength ranging from 390 nm to 410 nm is preferably selected as the laser beam L1 because it has a low visibility and can efficiently excite a fluorescent material that emits light when irradiated with visible light.

As described above, the light-emitting device 100 includes the wavelength selection filter 7 having the wavelength selectivity of reflecting a laser beam L1 and transmitting fluorescence L2. Hence, the light-emitting device 100 eliminates the need to provide, between the fluorescent section 8 and the wavelength selection filter 7, an excitation light source for irradiating the fluorescent section 8 with excitation light.

With this arrangement, the light-emitting device 100 obviates a portion of fluorescence L2 generated by the fluorescent section 8 from being blocked by the excitation light source, thus enabling efficient use of the fluorescence L2.

In addition, the light-emitting device 100 eliminates the need to find a room for the excitation light source between the fluorescent section 8 and the wavelength selection filter 7. This allows the wavelength selection filter 7 to be placed in proximity to the fluorescent section 8. Thus, in a case where fluorescence L2 transmitted by the wavelength selection filter 7 is to be cast through a light distribution controlling member such as a projection lens, it is possible to provide the projection lens or the like in proximity to the fluorescent section 8. This allows fluorescence L2 released in Lambertian distribution by the fluorescent section 8 to enter the projection lens or the like without losses and be thus cast through the projection lens or the like.

Next, an application example of the light-emitting device 100 in accordance with Embodiment 1 will be described with reference to FIG. 5.

Figure 5:
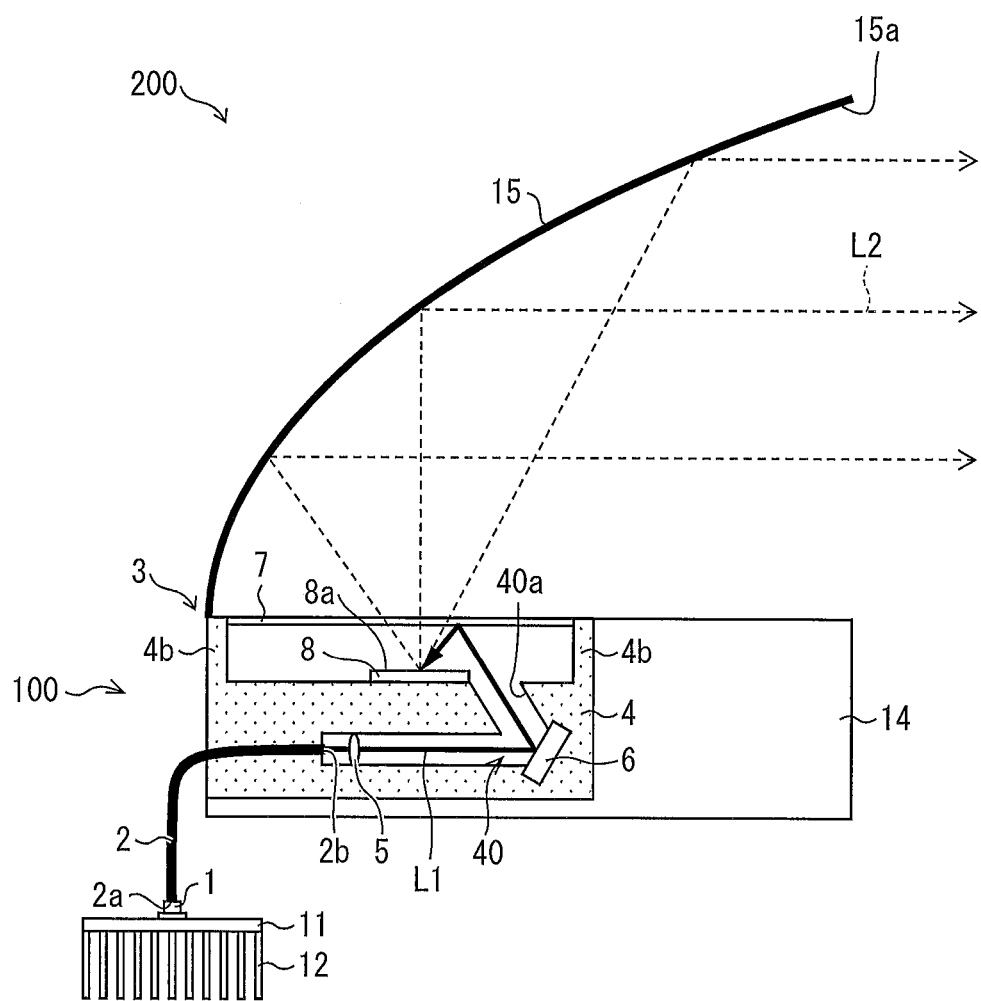
FIG. 5 is a cross-sectional view illustrating the configuration of an automotive headlamp including a light-emitting device.

FIG. 5 is a cross-sectional view illustrating the configuration of an automotive headlamp (vehicle headlight, illumination device) 200 including the light-emitting device 100. As illustrated in FIG. 5, the headlamp 200 includes the light-emitting device 100, a metal base 14, and a reflector 15.

The metal base 14 serves as a supporting member that supports the light-emitting unit 3 and the reflector 15. The metal base 14 is made from metal (for example, aluminum, stainless steel, copper, or iron) or the like. The metal base is thus highly thermally conductive and capable of efficiently dissipating, by conduction, heat generated by the light-emitting unit 3.

The metal base 14 has a concave part on one surface thereof supporting the reflector 15, wherein the light-emitting unit 3 is fixed in the concave part. In this configuration, the light-emitting unit 3 is fixed in the concave part in such a manner that the height of the surface of the metal base 14 which surface supports the reflector 15 is identical to the height of the wavelength selection filter 7 supported by the supporting part 4b of the casing 4.

The reflector 15 intends to cast fluorescence L2 released from the light-emitting device 100. The reflector 15 may be, for example, a member having coating of a metal thin film applied on its surface or may be a member made of metal.

The reflector 15 includes, as its curved reflective surface, at least a part of a partially curved surface obtained by (i) forming a curved reflective surface by rotating a parabola around a rotational axis which is a symmetric axis of the parabola, and by (ii) cutting the curved surface along a plane which is parallel to the rotational axis. The reflector 15 has a semicircular opening 15a in a direction in which the fluorescence L2 released from the light-emitting device 100 is to be cast.

The fluorescence L2 generated by the fluorescent section 8, which is provided at a position substantially corresponding to a focal point of the reflector 15, is cast in the form of a pencil of rays nearly parallel, by the reflector 15 from the opening 15a in a direction in which the vehicle travels. This makes it possible to efficiently cast the fluorescence L2 generated by the fluorescent section 8, within a narrow solid angle.

The light-emitting unit 3 can be easily separated from the metal base 14 or the reflector 15. Also, the light-emitting unit 3 has an advantage in that, in the event of a lighting failure, the light-emitting unit 3 can be easily replaced with another normal light-emitting unit 3.

Further, as described previously, the light-emitting unit 3 is configured such that the outer edge of the wavelength selection filter 7 is supported by the supporting port 4b of the casing 4 and that the wavelength selection filter 7 and the casing 4 are integrated with each other. With this configuration, the space between the wavelength selection filter 7 and the casing 4 is enclosed with the supporting part 4b having imperviousness to light (i.e. the space between the wavelength selection filter 7 and the casing 4 is externally invisible when the light-emitting unit 3 is viewed from its lateral side). This allows the laser beam L1 to be completely confined within the casing 4 without leakage out of the light-emitting unit 3. This makes it possible for the user to safely handle the light-emitting unit 3 without exposure to the laser beam L1.

The reflector 15 may be a full parabola mirror having an opening of a circular shape or may be a member including a part of such a full parabola mirror. Moreover, the reflector 15 can be, other than the parabola mirror, a member of an oval shape or a freely curved surface shape. Alternatively, the reflector 15 can be a member multifaceted (multireflector). Furthermore, the reflector 15 may partially include a part that is not of a curved surface shape. Alternatively, the reflector 15 may be a member that enlarges and projects an image formed on the fluorescent section 8, which is provided at a reference surface of the reflector 15.

Although not illustrated, the headlamp 200 may be further provided, at or near the opening 15a of the reflector 15, with a lens or the like (not illustrated) for controlling the range of an angle at which the reflector 15 cast light.

As stipulated in the legislation, the headlamp 200 must emit white illumination light with a predetermined range of chroma. For this reason, the fluorescent section 8 contains a fluorescent material that is selected to emit such white illumination light. For example, in a case where (i) the fluorescent section 8 contains blue, green, and red fluorescent materials and (ii) the fluorescent materials are irradiated with a laser beam L1 of 405 nm, the fluorescent section 8 emits white light.

Note that the light-emitting device 100 can be applied to a vehicle headlight for a vehicle other than an automobile. Further, the light-emitting device 100 can be applied to other illumination devices including, for example, a headlamp of a movable object (such as a human, a ship, an aircraft, a submarine, and a rocket) other than a vehicle, a search light, a projector, and a room light fixture (such as a downlight and a desk lamp).

Next, the effect of the light-emitting device 100 will be described with reference to FIGS. 6 and 7.

Figure 35:
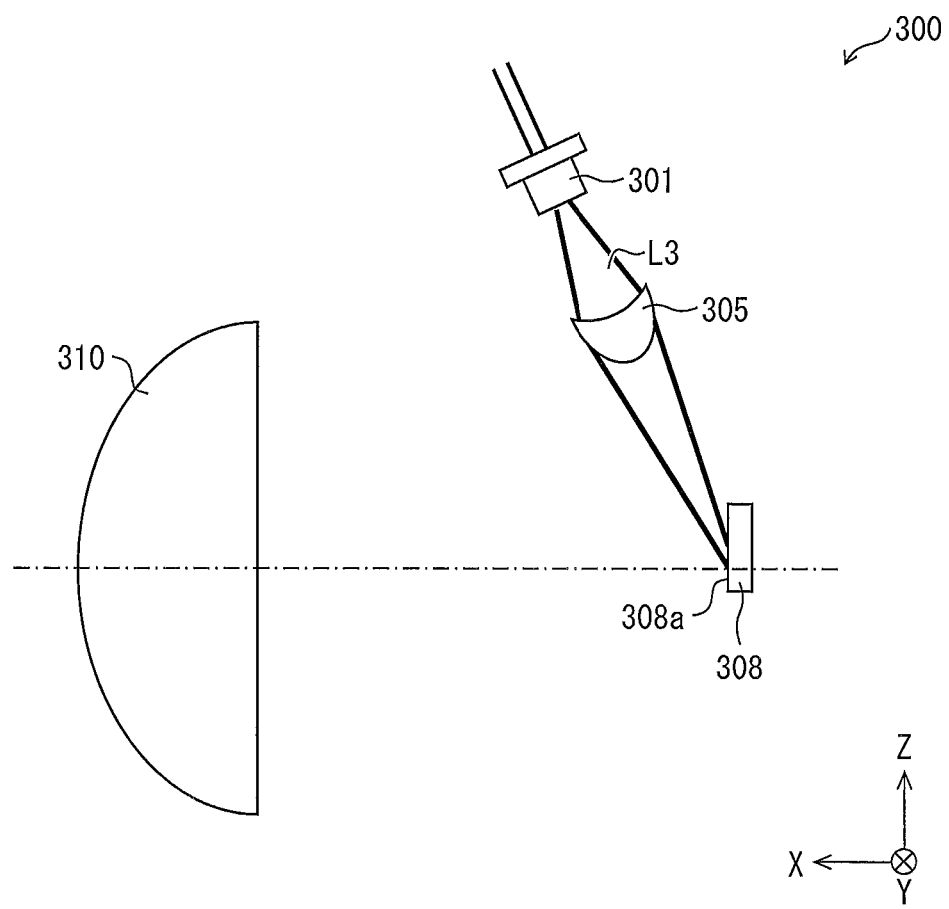
FIG. 35 is a cross-sectional view illustrating the configuration of the conventional illumination device.

As described above, the conventional illumination device 300, in which the excitation light source 301 and the collimator lens 305 are provided between the light-emitting section 308 and the convex lens 310, as illustrated in FIG. 35, problematically decreases the efficiency of light use.

Figure 6:
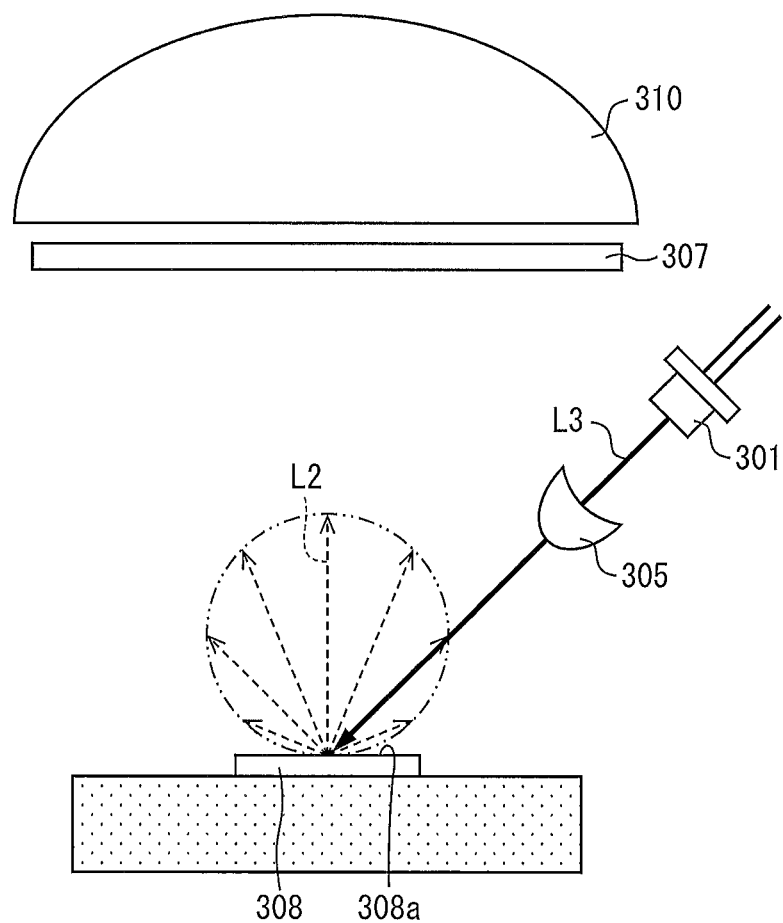
FIG. 6 is a cross-sectional view illustrating an unknown arrangement of the conventional illumination device illustrated in FIG. 35 which device employs a known wavelength selection filter.

FIG. 6 is a cross-sectional view illustrating an example arrangement of the conventional light-emitting device 300 which employs a known wavelength selection filter 307. As illustrated in FIG. 6, in a case where the known wavelength selection filter 307 for removing the excitation light L3 is to be employed in the conventional illumination device 300, the wavelength selection filter 307 is provided on an entry surface side of the convex lens 310. However, the arrangement of the light-emitting device 300 in which the known wavelength selection filter 307 is employed still requires placing (i) the excitation light source 301 for irradiating the excitation light irradiation surface 308a of the light-emitting section 308 with the excitation light L3 and (ii) the collimator lens 305 between the light-emitting section 308 and the wavelength selection filter 307. This fails to solve the above problem.

Figure 7:
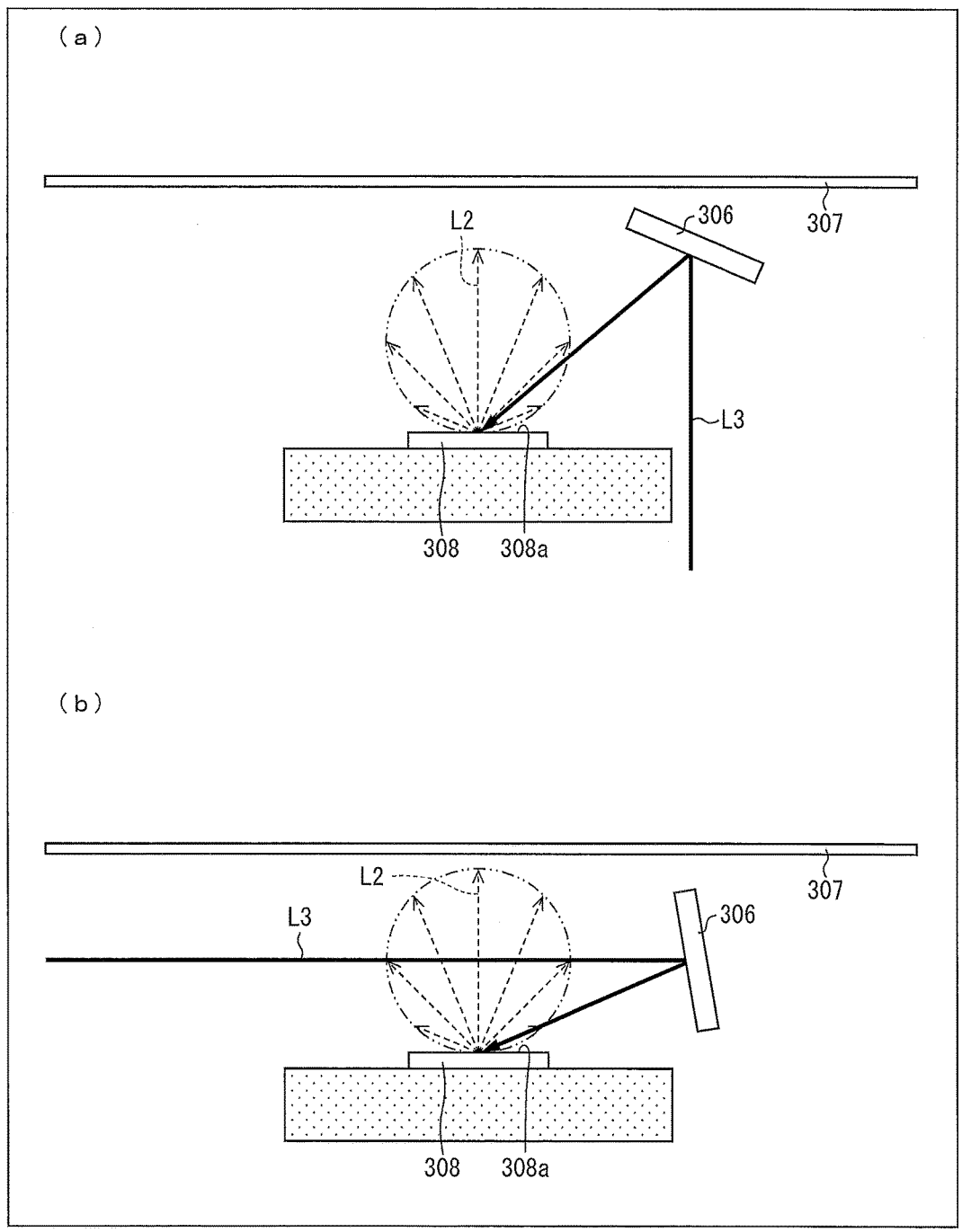
FIGS. 7 (a) and (b) are cross-sectional views each illustrating an unknown arrangement that is a modified arrangement of the light-emitting device illustrated in FIG. 6.

Further, arrangements, as illustrated in (a) of FIG. 7 and (b) of FIG. 7, in which the excitation light source 301 and the collimator lens 305 are replaced with a mirror 306 for reflecting the excitation light L3 toward the excitation light irradiation surface 308a of the light-emitting section 308 are possible alternatives. Even these arrangements require placing the mirror 306 between the light-emitting section 308 and the wavelength selection filter 307, and cause part of fluorescence generated by the light-emitting section 308 to be blocked by the mirror 306. These arrangements further require a room to place the mirror 306 in between the light-emitting section 308 and the wavelength selection filter 307. This makes it impossible to place the convex lens 310 (not illustrated) sufficiently close to the light-emitting section 308. Consequently, even the arrangement in which the excitation light source 301 is replaced with the mirror 306 fails to solve the above problem.

In view of the above problem, the light-emitting unit 3 provided in the light-emitting device 100 of the present embodiment includes (i) the fluorescent section 8 for emitting fluorescence L2 upon irradiation with a laser beam L1 and (ii) the wavelength selection filter 7 located so as to face the fluorescent section 8. The wavelength selection filter (i) reflects, toward the fluorescent section 8, the laser beam L1 emitted from the laser element 1 and (ii) transmits fluorescence L2 generated by the fluorescent section 8 upon irradiation with the laser beam L1 reflected. In other words, the wavelength selection filter 7 has a selective transmission property that causes the wavelength selection filter 7 to reflect a laser beam L1 emitted from the laser element 1 and that transmits fluorescence L2 generated by the fluorescent section 8.

With the above arrangement, the wavelength selection filter 7 reflecting the laser beam L1, emitted from the laser element 1, toward the fluorescent section 8 allows the fluorescent section 8 to generate the fluorescence L2 upon irradiation with the laser beam L1. The above arrangement thus eliminates the need to place, between the fluorescent section 8 and the wavelength selection filter 7, a component such as an excitation light source for irradiating the fluorescent section 8 with excitation light.

With the above arrangement, the light-emitting device 100 prevents a component such as an excitation light source from blocking a portion of fluorescence L2 generated by the fluorescent section 8, and consequently allows efficient use of the fluorescence L2.

In addition, the light-emitting device 100 eliminates the need for finding a room to place a component such as an excitation light source between the fluorescent section 8 and the wavelength selection filter 7. Thus, in a case where fluorescence L2 transmitted by the wavelength selection filter 7 is to be cast through a light distribution controlling member such as a projection lens, it is possible to place the projection lens or the like in proximity to the fluorescent section 8. This allows fluorescence L2 released in Lambertian distribution by the fluorescent section 8 to enter the projection lens or the like without losses and to be cast through the projection lens or the like.

The light-emitting device 100 of Embodiment 1 consequently has improved efficiency of use of the fluorescence L2.

Moreover, according to Embodiment 1, it is possible to provide, for example, a small light-emitting unit 3 capable of being readily replaceable, independently of the reflector 15 and the projection lens, as illustrated in FIG. 5. Such an arrangement allows the laser beam L1 to be completely confined within the light-emitting unit 3 and thus advantageously prevents the occurrence of leakage of the laser beam L1 to the outside. On the contrary, in the conventional arrangement, the laser light source and the light-emitting section are not provided independently from the reflector and the projection lens, and a laser beam travels a space within the reflector and a space in between the light-emitting section and the projection lens. Unfortunately, the conventional arrangement can cause exposure of the user to the laser beam when the user makes access to the reflector and the projection lens. Note that the above point in which the above arrangement of the light-emitting unit 3 can be arranged to be a unit capable of being readily replaceable, independently of the reflector 15 and the projection lens is applied to the arrangements provided in the modification examples below and in the other embodiments.

Next, the following will describe modification examples of the light-emitting device 100 with reference to FIGS. 8 through 11. The optical fiber 2 may be omitted so that a laser beam emitted from the laser element 1 is let directly entered to the inside of the light-emitting unit 3.

Figure 8:
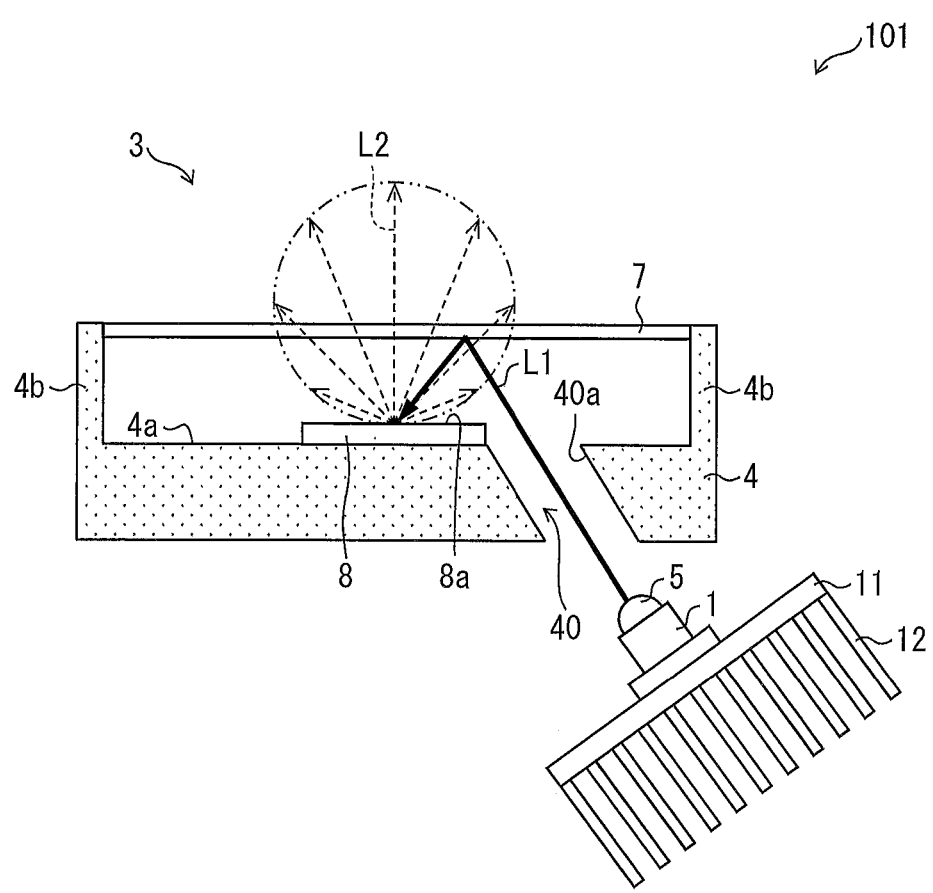
FIG. 8 is a cross-sectional view illustrating the configuration of a light-emitting device in which no optical fiber is provided.

FIG. 8 is a cross-sectional view illustrating the configuration of a light-emitting device 101 in which the optical fiber 2 is not provided. As illustrated in FIG. 8, the light-emitting device 101 is configured to let a laser beam L1 emitted from a laser element 1 enter the inside of the light-emitting unit 3, without using the optical fiber 2.

The light-emitting device 101 includes a casing 4 in which an internal passage 40 is provided as a through hole. The internal passage 40 penetrates the casing 4 obliquely in an out-of-plane direction, and has open ends provided respectively at a placement surface (upper surface) 4a of the casing 4 and at a lower surface of the casing 4, which lower surface is provided oppositely to the placement surface 4a.

Further, in the light-emitting device 101, the laser element 1 is so provided under the casing 4 that an optical axis coincides with the axis direction of the internal passage 40. This allows the laser beam L1 emitted from the laser element 1 to enter the internal passage 40 and then exit from the opening 40a toward the wavelength selection filter 7.

Note that, in the light-emitting device 101, a lens 5 for adjusting a beam diameter and the like of the laser beam L1 is attached to an emission end of the laser element 1.

In the light-emitting device 101, the laser beam L1 emitted from the laser element 1 is adjusted in beam diameter by the lens 5 and then enters the internal passage 40, which is provided as a through hole, of the casing 4. Subsequently, the laser beam L1 entering the internal passage 40 travels in a straight line through the internal passage 40 and then exits from the opening 40a. The laser beam L1 exiting from the opening 40a is reflected by the wavelength selection filter 7 toward the fluorescent section 8 so that a fluorescent section 8 is irradiated with the laser beam L1 reflected. Fluorescence L2 generated by irradiation with the laser beam L1 is extracted mainly from a laser beam irradiation surface 8a, is transmitted by the wavelength selection filter 7, and is then released to the outside of the light-emitting device 101.

The light-emitting device 101 has a simplified structure which omit the optical fiber 2 and the mirror 6, with the result of a reduced production cost of the light-emitting device 101

In addition, the number of laser element 1 is not limited to one (1). Alternatively, a plurality of laser elements 1 may be employed.

Figure 9:
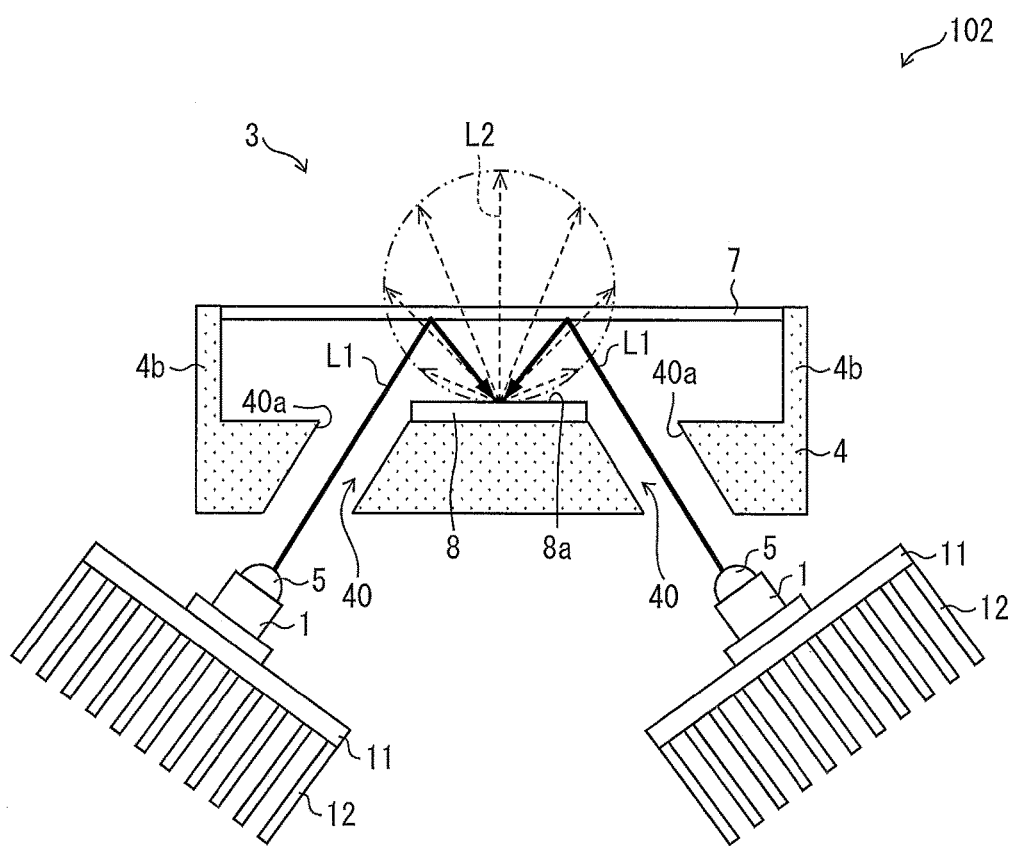
FIG. 9 is a cross-sectional view illustrating the configuration of a light-emitting device including a plurality of laser elements.

FIG. 9 is a cross-sectional view illustrating the configuration of a light-emitting device 102 including a plurality of laser elements 1. As illustrated in FIG. 9, the light-emitting device 102 includes two laser elements 1.

In the light-emitting device 102, laser beams L1 emitted from the respective laser elements 1 separately enter two internal passages 40, which are provided in the casing 4. Subsequently, the laser beams L1 entering the respective internal passages 40 travels in straight lines through these internal passage 40 and then exit from the respective openings 40. The laser beams L1 exiting from the respective openings 40a are reflected by the wavelength selection filter 7 toward the fluorescent section 8 so that the fluorescent section 8 is irradiated with the laser beams L1 reflected.

The light-emitting device 102 is capable of providing high-power laser beams L1. This arrangement makes it possible to realize a light-emitting device 102 with higher luminance when the laser beam irradiation surface 8a of the fluorescent section 8 is irradiated with a plurality of laser beams L1 at one and the same spot of the laser beam irradiation surface 8a. This arrangement further makes it possible to realize a light-emitting device 102 with higher luminous flux when the laser beam irradiation surface 8a of the fluorescent section 8 is irradiated with a plurality of laser beams L1 at varying spots of the laser beam irradiation surface 8a.

For example, assume that the light-emitting section is irradiated with a plurality of excitation light beams with use of the conventional illumination devices. The arrangement provided in Patent Literature 1 requires that the reflector for controlling light distribution of fluorescence has a plurality of openings for passage of excitation light beams or that the reflector has an opening of an increased diameter. This problematically decreases efficiency of light cast by the reflector.

Meanwhile, the arrangement provided in Patent Literature 2 requires that plural combinations of the excitation light sources 301 and the collimator lenses 305 are provided between the light-emitting section 308 and the convex lens 310. This, however, causes fluorescence from the light-emitting section 308 to be blocked by a plurality of excitation light sources 301 with a limited degree of freedom in placement, with the result of a further decreased efficiency of light use.

On the contrary, the light-emitting device 102 prevents fluorescence L2 from the fluorescent section 8 from being blocked by the laser element 1. This makes it possible to easily improve luminance and luminous flux with use of a plurality of laser beams L1, without decreasing an efficiency of light use.

The reflector 15 may be replaced by a projection lens 10 to cast fluorescence L2 transmitted by the wavelength selection filter 7.

Figure 10:
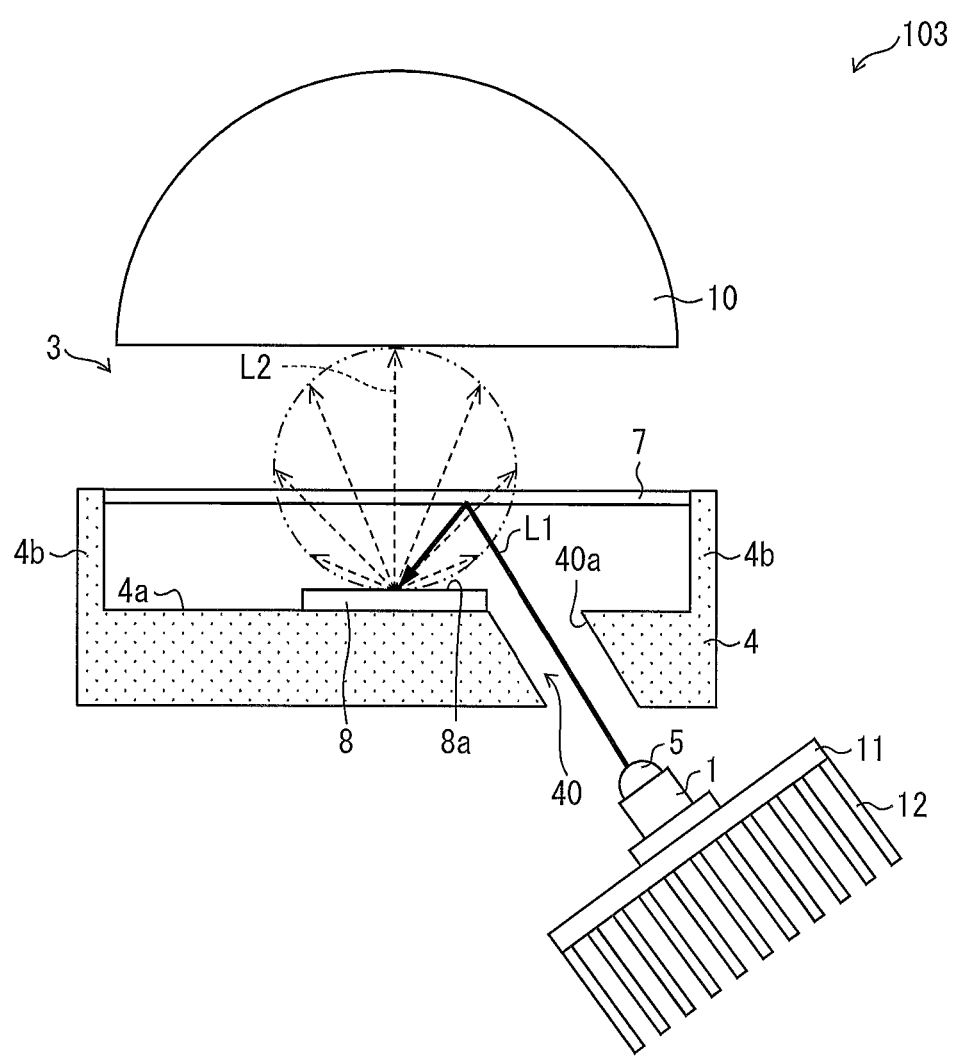
FIG. 10 is a cross-sectional view illustrating the configuration of a light-emitting device including a projection lens.

FIG. 10 is a cross-sectional view illustrating the configuration of a light-emitting device 103 including the projection lens 10. As illustrated in FIG. 10, the light-emitting device 103 includes the projection lens 10 to cast fluorescence L2 transmitted by the wavelength selection filter 7.

The projection lens 10 refracts outgoing fluorescence L2 to cast light at an angle within a predetermined angle range. The projection lens 10 is placed on a fluorescence release side of the wavelength selection filter 7.

With the light-emitting device 103 having a simpler structure, it is possible to cast fluorescence L2 transmitted by the wavelength selection filter 7, at an angle within a predetermined angle range, through the projection lens 10.

Note that the wavelength selection filter 7 and the projection lens 10 are not necessarily spaced away from each other. Alternatively, the light-emitting device 103 may be arranged such that the wavelength selection filter 7 and the projection lens 10 abut on each other. The light-emitting device 103 may also be arranged such that a multilayer film 72 is further provided at an entry surface of the projection lens 10 so that the wavelength selection filter 7 and the projection lens 10 are integrated with each other.

In the present modification example, the arrangement in which the projection lens 10 is employed is described as an example. However, a lens intended for projection is not necessarily provided. Instead of the projection lens 10, (i) a condenser lens, (ii) a collimator lens, (iii) a lens group that is a combination of a plurality of lenses, or the like may be suitably used in combination with the light-emitting unit in accordance with the present invention.

The shape of the wavelength selection filter 7, which shape is not limited to a flat plate shape, may be any other shape.

Figure 11:
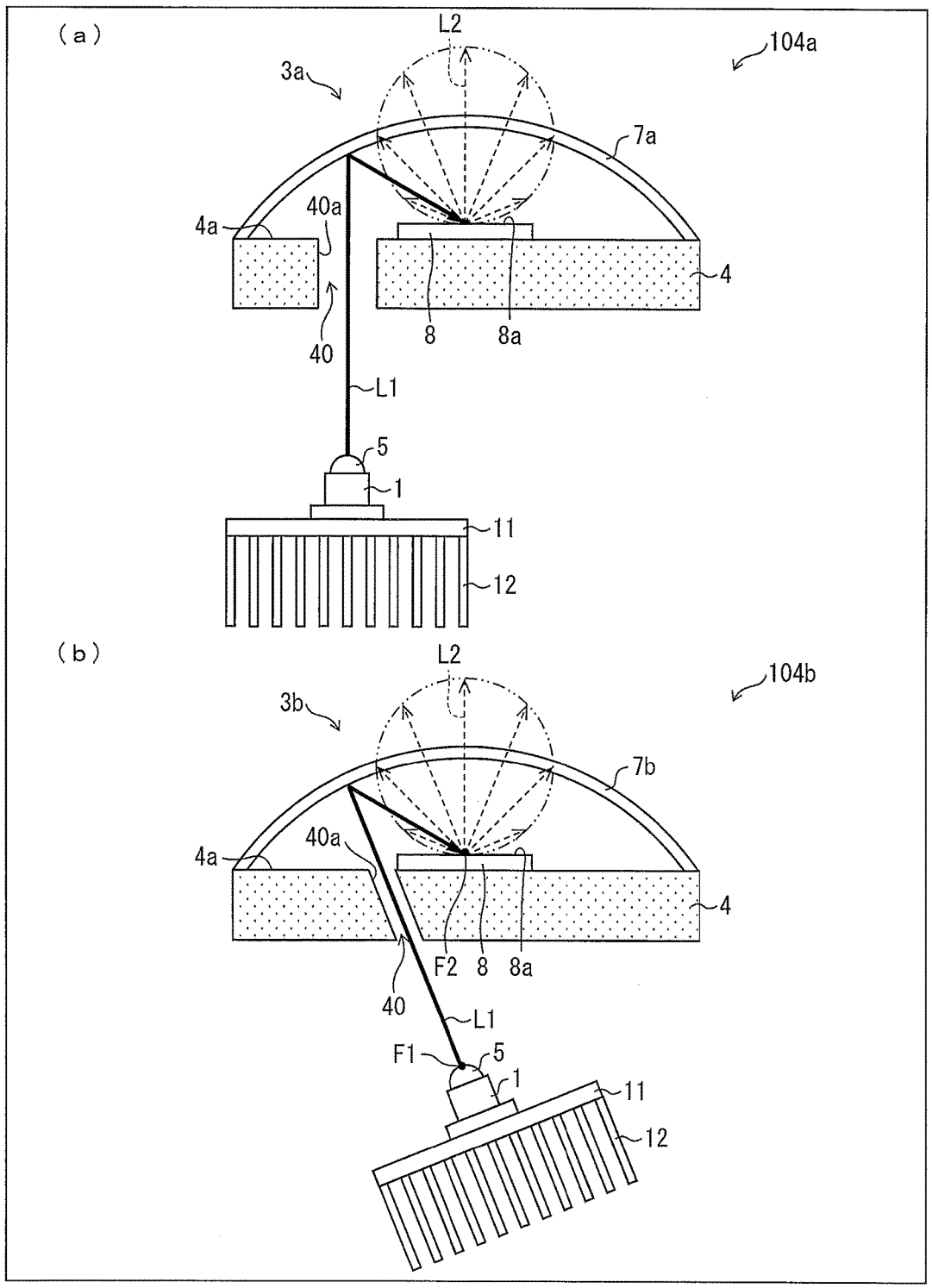
FIGS. 11 (a) and (b) are cross-sectional views each illustrating the configuration of a light-emitting device including a wavelength selection filter having a curved surface shape.

(a) and (b) of FIG. 11 are cross-sectional views illustrating the respective configurations of light-emitting devices 104a and 104b, each of which includes a wavelength selection filter having a curved surface shape. (a) of FIG. 11 illustrates the light-emitting devices 104a that includes, as the wavelength selection filter having a curved surface shape, a wavelength selection filter 7a having a shape of a paraboloid of revolution. (b) of FIG. 11 illustrates the light-emitting devices 104b that includes, as the wavelength selection filter having a curved surface shape, a wavelength selection filter 7b having a shape of an ellipsoid of revolution.

The fluorescence L2 is released in Lambertian distribution from the fluorescent section 8. Thus, with use of the wavelength selection filter having a curved surface shape, such as the wavelength selection filter 7a having a shape of a paraboloid of revolution or the wavelength selection filter 7b having a shape of an ellipsoid of revolution, it is possible to cause the fluorescence L2 to efficiently enter the wavelength selection filter and be then released to the outside.

Consequently, the light-emitting devices 104a and 104b each have further improved efficiency of use of the fluorescence L2.

Note that in a case where the wavelength selection filter 7a, illustrated in (a) of FIG. 11, having a shape of a paraboloid of revolution is used, the arrangement of Modification Example 4 can be suitably carried out by providing the fluorescent section 8 at a position corresponding to a focal point of the wavelength selection filter 7a and causing the laser beam L1 to enter the fluorescent section 8 from a direction that is parallel to a direction along a rotation axis of the wavelength selection filter 7a. Alternatively, in a case where the wavelength selection filter 7b, illustrated in (b) of FIG. 11, having a shape of an ellipsoid of revolution is used, the arrangement of Modification Example 4 can be suitably carried out by providing the fluorescent section 8 at a position corresponding to a second focal point F2 of the wavelength selection filter 7b and causing the laser beam L1 to enter the fluorescent section 8 so as to pass through a position corresponding to a first focal point F1.

Figure 12:
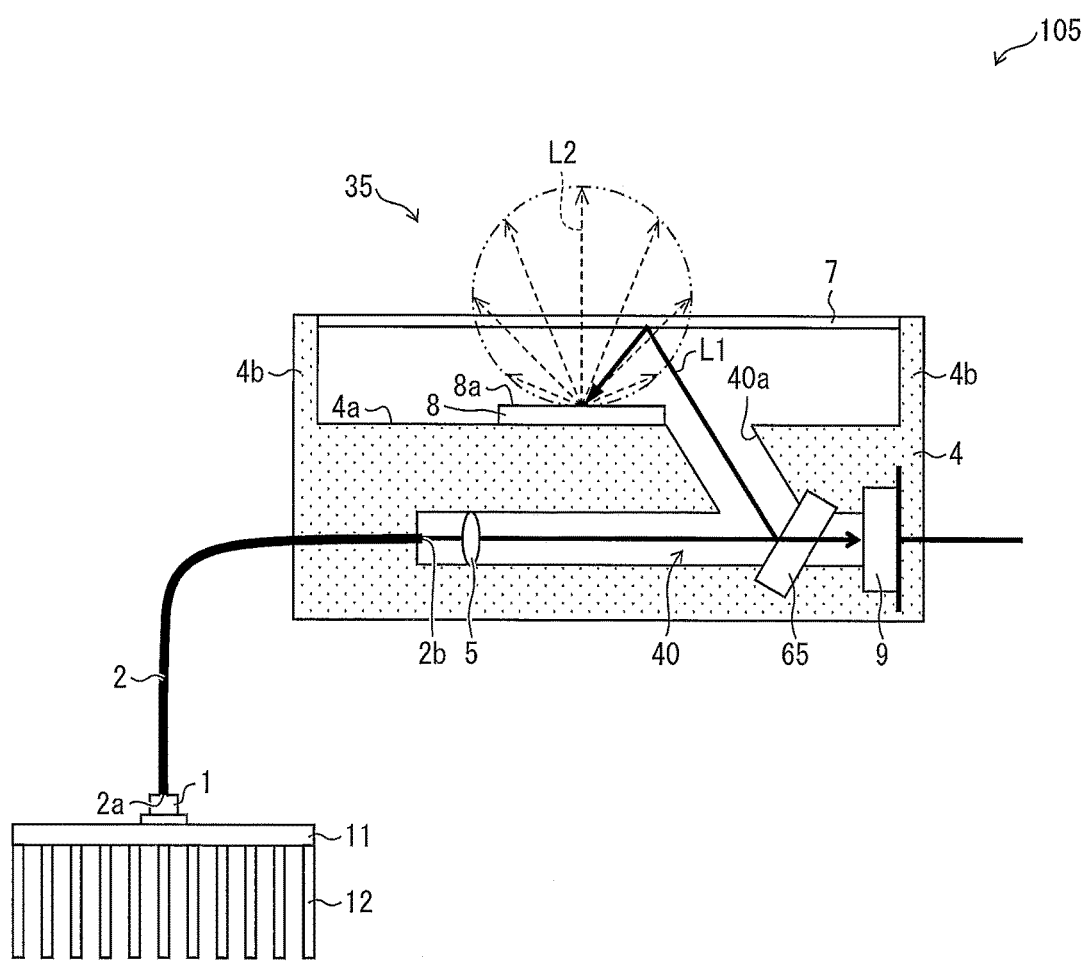
FIG. 12 is a cross-sectional view illustrating the configuration of a light-emitting device in accordance with Embodiment 2.
Figure 13:
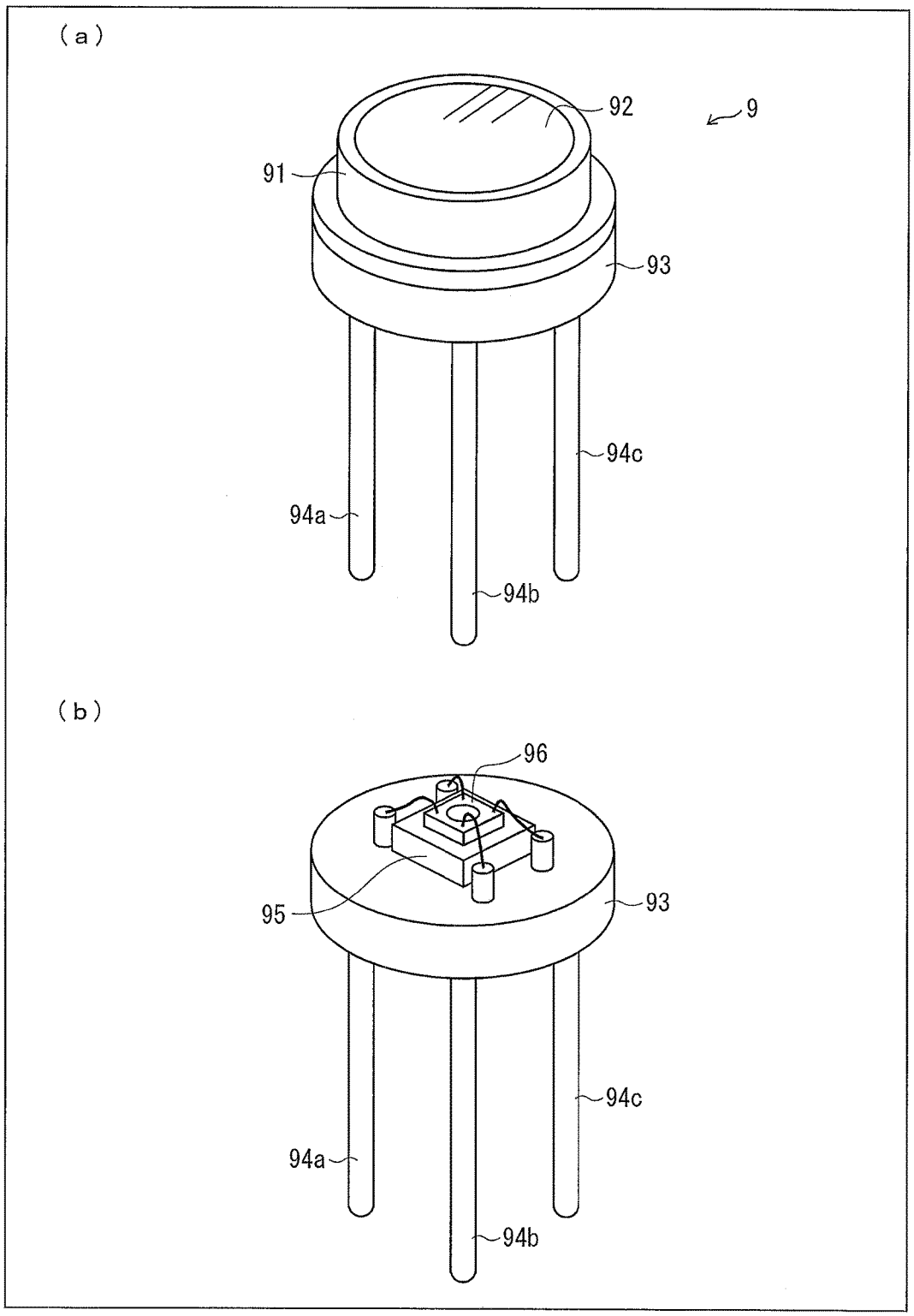
FIG. 13 shows perspective views each illustrating the configuration of a light intensity detecting section shown in FIG. 12, wherein (a) of FIG. 13 illustrates an appearance of the light intensity detecting section, and (b) of FIG. 13 illustrates the light intensity detecting section with a cap, shown in (a) of FIG. 13, removed therefrom.

The following will describe another embodiment of the present invention with reference to FIGS. 12 and 13. In Embodiment 2, a light-emitting device including a light intensity detecting section for detecting the intensity of a laser beam will be described.

For convenience of explanation, members of Embodiment 2 that are identical in function to their respective corresponding members described in Embodiment 1 are each assigned a common reference numeral, and are not described here.

First, a configuration of a light-emitting device 105 in accordance with Embodiment 2 will be described. The light-emitting device 105 emits, as illumination light, fluorescence (emission light) L2 that is generated by illuminating the fluorescent section 8, which contains particles of a fluorescent material, with a laser beam L1.

FIG. 12 is a cross-sectional view illustrating the configuration of the light-emitting device 105 in accordance with Embodiment 2. As illustrated in FIG. 12, the light-emitting device 105 includes a laser element 1, an optical fiber 2, and a light-emitting unit 35. The light-emitting device 105 is configured such that the laser element 1 and the light-emitting unit 35 are connected to each other via the optical fiber 2.

The light-emitting device 105 differs from the light-emitting device 100 of Embodiment 1 mainly in that it includes a dielectric multilayer film mirror 65 instead of the mirror 6 and that it further includes a light intensity detecting section 9 for detecting the intensity of the laser beam L1.

The light-emitting unit 35 intends to generate fluorescence L2 by irradiation of the fluorescent section 8, which contains a fluorescent material, with a laser beam L1 emitted from the laser element 1 and then release the fluorescence thus generated. The light-emitting unit 35 includes: a casing (placement section) 4; a lens 5; a dielectric multilayer film mirror (reflection mirror) 65; a wavelength selection filter (optical plate) 7; a fluorescent section (light-emitting section) 8; and a light intensity detecting section 9.

The dielectric multilayer film mirror 65 intends to reflect a laser beam L1 toward the wavelength selection filter 7. Specifically, the dielectric multilayer film mirror 65 is provided at the bending part of the internal passage 40, and reflects, at the bending part, a laser beam L1 entering the starting end of the internal passage 40, toward the opening 40a. This makes it possible to cause the laser beam L1 to (i) exit from the opening 40a and (ii) be directed toward the wavelength selection filter 7.

The dielectric multilayer film mirror 65 transmits a portion of the laser beam L1. The dielectric multilayer film mirror 65 can be produced by alternately stacking, on a substrate, (i) a dielectric material having a high refractive index and (ii) a dielectric material having a low refractive index. The dielectric multilayer film mirror 65 can be produced by, for instance, alternately stacking (i) a layer of $TiO_2$ as the dielectric material having a high refractive index and (ii) a layer of $SiO_2$ as the dielectric material having a low refractive index to form a stack of about a dozen to several tens of layers.

The substrate can be, for example, a glass substrate. The substrate is, however, not limited to a glass substrate, and may be any substrate having transparency to light.

The dielectric multilayer film mirror 65 reflects, for example, 99% of a laser beam L1 that falls on it and transmits the remaining 1%.

The light intensity detecting section 9 intends to detect the intensity of a laser beam L1 transmitted by the dielectric multilayer film mirror 65. The light intensity detecting section 9 is located within the casing 4 and receives a laser beam L1 transmitted by the dielectric multilayer film mirror 65. The light intensity detecting section 9 can be a photodiode (PD), for example.

FIG. 13 shows perspective views each illustrating a configuration of the light intensity detecting section 9 shown in FIG. 12. (a) of FIG. 13 illustrates an appearance of the light intensity detecting section 9. (b) of FIG. 13 illustrates the light intensity detecting section 9 with a cap 91 (see (a) of FIG. 13) removed therefrom.

As illustrated in (a) and (b) of FIG. 13, the light intensity detecting section 9 includes a cap 91, a stem 93, and a PD chip 96. The PD chip 96 is mounted on a submount 95 provided on the stem 93.

The cap 91 intends to seal the PD chip 96 mounted on the submount 95. The cap 91 includes a transparent window 92, through which the PD chip 96 can receive a laser beam L1.

The stem 93 has a front surface provided with the submount 95, on which the PD chip 96 is mounted. The stem 93 has a back surface provided with three leads 94a to 94c, to which the PD chip 96 is electrically connected via respective wires.

The submount 95 is made of a material having a high thermal conductivity (for example, SiC, copper, diamond, or aluminum). The submount 95 is provided to increase the region for conduction of heat generated by the PD chip 96 and transfer such heat to the stem 93 and the cap 91 efficiently, thereby preventing a temperature rise in the PD chip 96 and premature breakage of the PD chip 96. The submount 95 is thus not essential and may be omitted, in which case the PD chip 96 may be mounted on the stem 93 directly or on a commonly used printed circuit board provided on the stem 93.

The light intensity detecting section 9 is configured such that the cap 91 and the submount 95 have a height and a thickness respectively which are so adjusted that the transparent window 92 of the cap 91 is in close contact with the PD chip 96. This configuration allows the PD chip 96 to receive fluorescence L2 efficiently.

The light intensity detecting section 9 converts fluorescence L2, received by the PD chip 96, into an electric signal corresponding to the intensity of the fluorescence L2, and outputs the electric signal. This means that monitoring the result of detection by the light intensity detecting section 9 allows detection of a change in intensity of the laser beam L1.

As described above, the light-emitting device 105 of Embodiment 2 includes a light-emitting unit 35 which includes (i) a dielectric multilayer film mirror 65 that transmits a portion of a laser beam L1 and (ii) a light intensity detecting section 9 for detecting the intensity of the laser beam L1 transmitted by the dielectric multilayer film mirror 65.

The light-emitting device 105 includes a light-emitting unit 35 that includes, in addition to the components of the light-emitting unit 3 of Embodiment 1, a light intensity detecting section 9 for detecting the intensity of a portion of the laser beam L1 which portion has been transmitted by the dielectric multilayer film mirror 65. Thus, monitoring the result of detection by the light intensity detecting section 9 allows detection of a change in intensity of the laser beam L1.

The above arrangement allows the light-emitting device 105 to perform feedback control on the laser element 1 on the basis of the result of detection by the light intensity detecting section 9 so that the laser beam L1 has a constant intensity. The above arrangement further makes it possible to find early, on the basis of the result of detection by the light intensity detecting section 9, the occurrence of a defect such as deterioration of the laser element 1, breakage of the optical fiber 2, and displacements of the optical fiber 2 and the lens 5.

The arrangement of Embodiment 2 consequently allows the light-emitting device 105 to have a stable light emitting function, and also makes it possible to find a defect early for improved safety of the light-emitting device 105.

Figure 14:
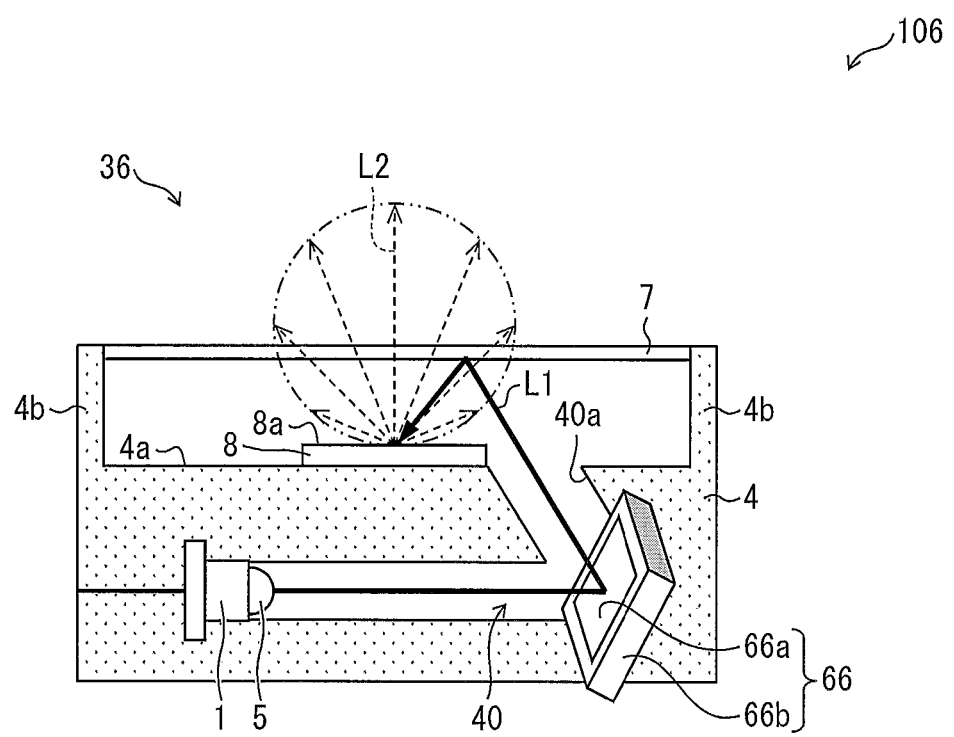
FIG. 14 is a cross-sectional view illustrating the configuration of the light-emitting device in accordance with Embodiment 3.
Figure 15:
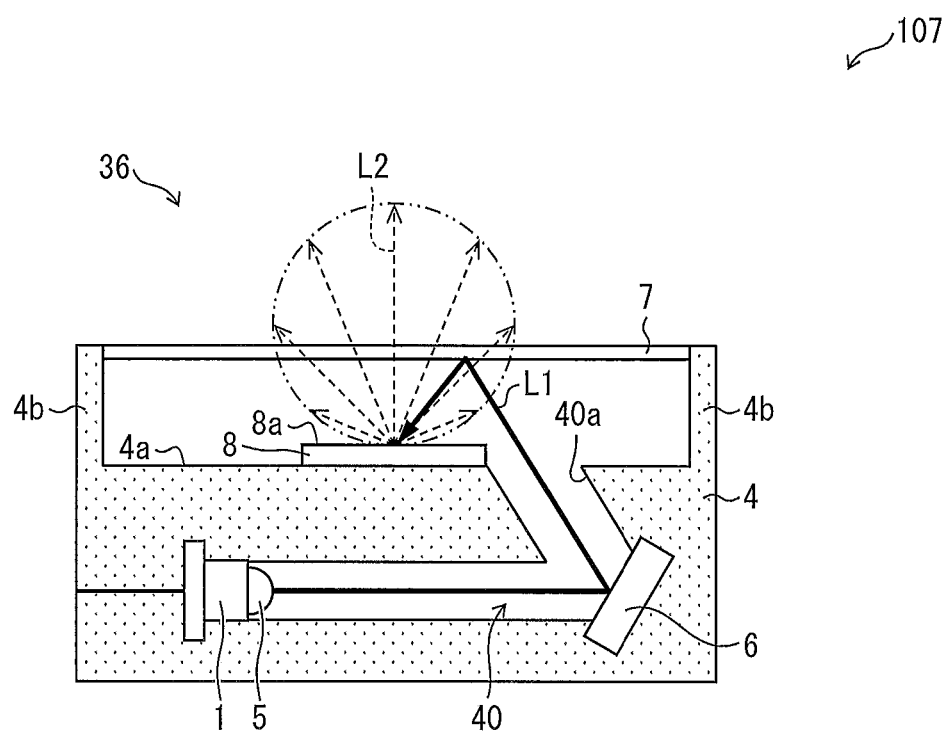
FIG. 15 is a cross-sectional view illustrating a modification example of the light-emitting device illustrated in FIG. 14.
Figure 16:
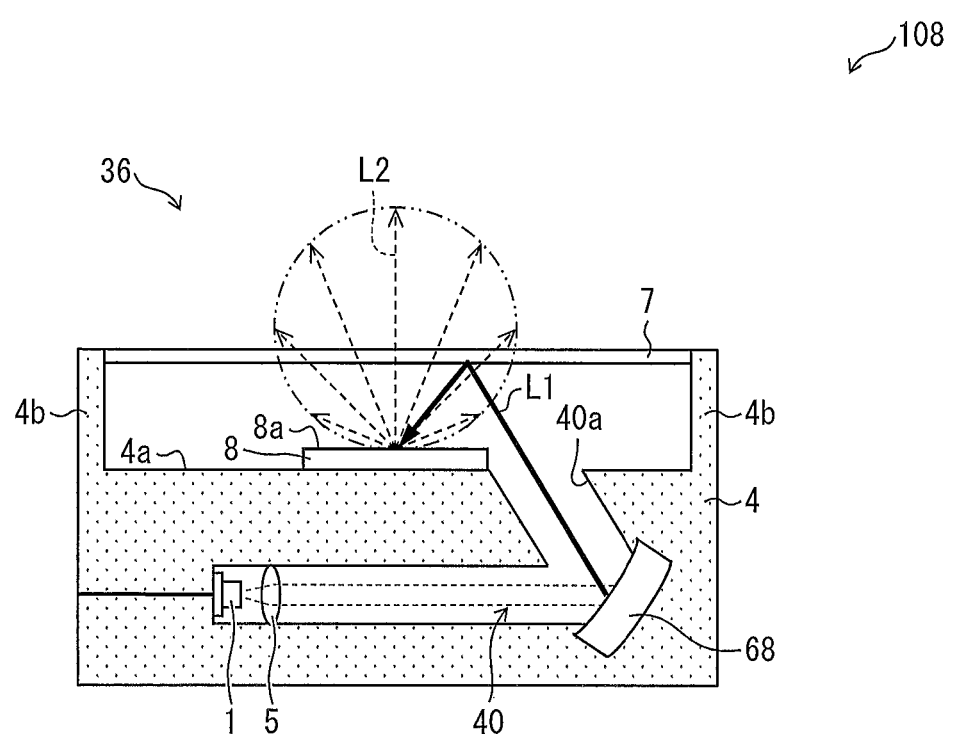
FIG. 16 is a cross-sectional view illustrating another modification example of the light-emitting device illustrated in FIG. 14.

The following will describe still another embodiment of the present invention with reference to FIGS. 14 through 16. In Embodiment 3, a light-emitting device including a laser element located within a casing will be described.

For convenience of explanation, members of Embodiment 3 that are identical in function to their respective corresponding members described in Embodiments 1 and 2 are each assigned a common reference numeral, and are not described here.

First, a configuration of a light-emitting device 106 in accordance with Embodiment 3 will be described. The light-emitting device 106 emits, as illumination light, fluorescence (emission light) L2 that is generated by illuminating the fluorescent section 8, which contains particles of a fluorescent material, with a laser beam L1.

FIG. 14 is a cross-sectional view illustrating the configuration of the light-emitting device 106 in accordance with Embodiment 3. As illustrated in FIG. 14, the light-emitting device 106 includes a laser element 1 and a light-emitting unit 36. The light-emitting device 106 is configured such that the laser element 1 is located within a casing 4.

The light-emitting device 106 differs from the light-emitting device 100 of Embodiment 1 mainly in that the laser element 1 is located within a casing 4 and that the light-emitting device 106 includes a MEMS mirror 66 instead of the mirror 6.

The light-emitting unit 36 intends to generate fluorescence L2 by irradiation of the fluorescent section 8, which contains a fluorescent material, with a laser beam L1 emitted from the laser element 1 and then release the fluorescence thus generated. The light-emitting unit 36 includes: a casing (placement section) 4; a lens 5; a MEMS mirror (reflection mirror) 66; a wavelength selection filter (optical plate) 7; and a fluorescent section (light-emitting section) 8.

The light-emitting unit 36 is configured such that the laser element 1 is provided at the starting end of the internal passage 40 of the casing 4. This configuration eliminates the need to include an optical fiber 2, and thus allows the light-emitting device 106 to be smaller.

The MEMS (micro electro mechanical system) mirror 66 intends to reflect a laser beam L1 toward the wavelength selection filter 7. Specifically, the MEMS mirror 66 is provided at the bending part of the internal passage 40, and reflects, at the bending part, a laser beam L1 emitted from the laser element 1 located at the starting end of the internal passage 40, toward the opening 40a. This makes it possible to cause the laser beam L1 to (i) exit from the opening 40a and (ii) be directed toward the wavelength selection filter 7.

The MEMS mirror 66 is a drivable reflection mirror including (i) a mirror section (reflection mirror) 66a having a reflective surface and (ii) a drive section (angle changing section) 66b for driving the mirror section 66a. The MEMS mirror 66 is capable of changing the angle of the mirror section 66a by operating the drive section 66b. This means that controlling the operation of the drive section 66b can change the angle of incidence of the laser beam L1 with respect to the wavelength selection filter 7. This allows a laser beam L1 to strike any desired position on the laser beam irradiation surface 8a of the fluorescent section 8.

The MEMS mirror 66 allows the laser beam L1 to be emitted to any desired position on the laser beam irradiation surface 8a of the fluorescent section 8. The use of the MEMS mirror 66 thus makes it possible to shift a luminescent center for the fluorescent section 8. The above arrangement consequently makes it possible to easily change the position from which the light-emitting device 106 releases fluorescence L2.

As described above, the light-emitting device 106 of Embodiment 3 includes a light-emitting unit 36 including a MEMS mirror 66 that is capable of changing the angle of incidence of a laser beam L1 with respect to the wavelength selection filter 7. The light-emitting unit 36 can thus control the operation of the MEMS mirror 66 to cause the laser beam L1 to be emitted to any desired position on the laser beam irradiation surface 8a of the fluorescent section 8. This arrangement makes it possible to shift a luminescent center for the fluorescent section 8, and consequently makes it possible to change the position from which the light-emitting device 106 releases fluorescence L2 through the wavelength selection filter 7.

Thus, the light-emitting device 106 can, in a case where, for instance, fluorescence L2 transmitted by the wavelength selection filter 7 is to be cast through the projection lens 10 or the like, shift the position of irradiation of the laser beam L1 on the laser beam irradiation surface 8a to easily change the pattern in which fluorescence L2 is cast through the projection lens 10 or the like.

In a case where, for instance, a conventional illumination device having the arrangement of Patent Literature 1 is used to irradiate a laser beam with a desired position on the laser beam irradiation surface of a light-emitting section, it is necessary to increase the diameter of an opening that is provided in a reflector for controlling light distribution and that lets excitation light pass therethrough. This problematically decreases efficiency of light cast by the reflector.

The arrangement of Patent Literature 2 requires a drivable optical element to be provided between the excitation light source 301 and the light-emitting section 308, and requires an increased space between the light-emitting section 308 and the convex lens 310. The arrangement of Patent Literature 2 thus problematically fails to cause light released in Lambertian distribution by the light-emitting section 308 to enter the convex lens 310 for use without losses, with the result of decreased efficiency of light cast. In addition, the drivable optical element, which is large, blocks a portion of light emitted by the light-emitting section 308, thus problematically further decreasing the efficiency of light use.

The light-emitting device 106, in contrast, includes only a wavelength selection filter 7 between the fluorescent section 8 and a light distribution controlling member such as the projection lens 10. This arrangement allows the projection lens 10 to be placed in proximity to the fluorescent section 8, and prevents a movable optical element or the like from blocking light from the fluorescent section 8. The light-emitting device 106 consequently makes it possible to, without decreasing the efficiency of light use, easily change the pattern in which fluorescence L2 is cast through the projection lens 10 or the like.

The drivable reflection mirror may suitably be, for example, a galvanometer mirror or a polygon mirror instead of an MEMS mirror.

Embodiment 3 drives the reflection mirror for reflecting a laser beam L1 toward the wavelength selection filter 7. The present invention is, however, not limited to such an arrangement, and may alternatively be arranged to drive the lens 5 for adjusting, for example, the beam diameter of the laser beam L1.

Further, the above drivable optical elements for changing the angle of incidence of the laser beam L1 with respect to the wavelength selection filter 7 are not necessarily located within the casing 4, and may alternatively be located outside the casing 4 depending on, for example, the position at which the laser element 1 is located.

The following will describe modification examples of the light-emitting device 106 with reference to FIGS. 15 and 16. The MEMS mirror 66 may be replaced with a mirror 6 or a concave mirror 68.

FIG. 15 is a cross-sectional view illustrating a configuration of a light-emitting device 107 including a mirror 6 instead of the MEMS mirror 66. FIG. 16 is a cross-sectional view illustrating a configuration of a light-emitting device 108 including a concave mirror 68 instead of the MEMS mirror 66.

As illustrated in FIGS. 15 and 16, the MEMS mirror 66 may be replaced with a mirror 6 or a concave mirror 68. The use of the mirror 6 reduces the cost of producing the light-emitting unit 36. The concave mirror 68 has the function of reducing the beam diameter of the laser beam L1. Thus, in a case where the concave mirror 68 is to be used, an optimal combination of a lens 5 and a concave mirror 68 is so selected appropriately that a laser beam L1 with a desired beam diameter is emitted to the fluorescent section 8. The concave mirror 68 is preferably an off-axis parabolic mirror for smaller aberration.

The light-emitting devices 107 and 108 each have a simplified configuration, with the result of a reduced production cost.

Figure 17:
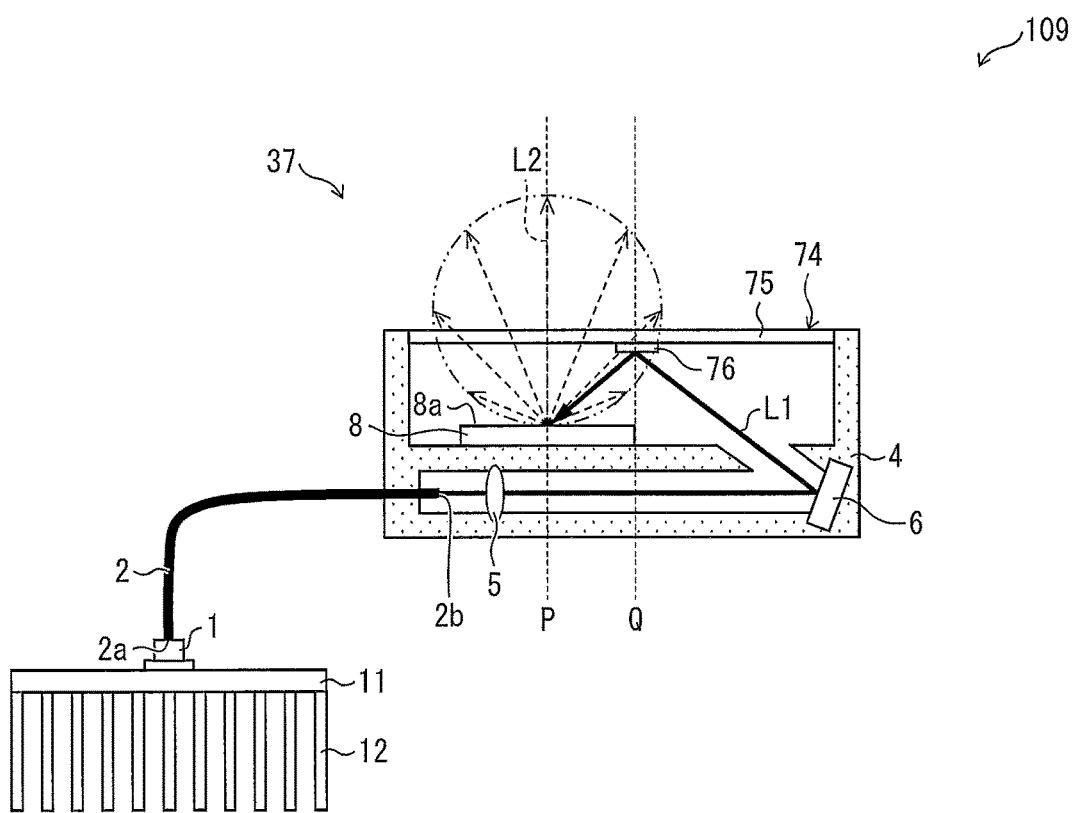
FIG. 17 is a cross-sectional view illustrating the configuration of the light-emitting device in accordance with Embodiment 4.
Figure 18:
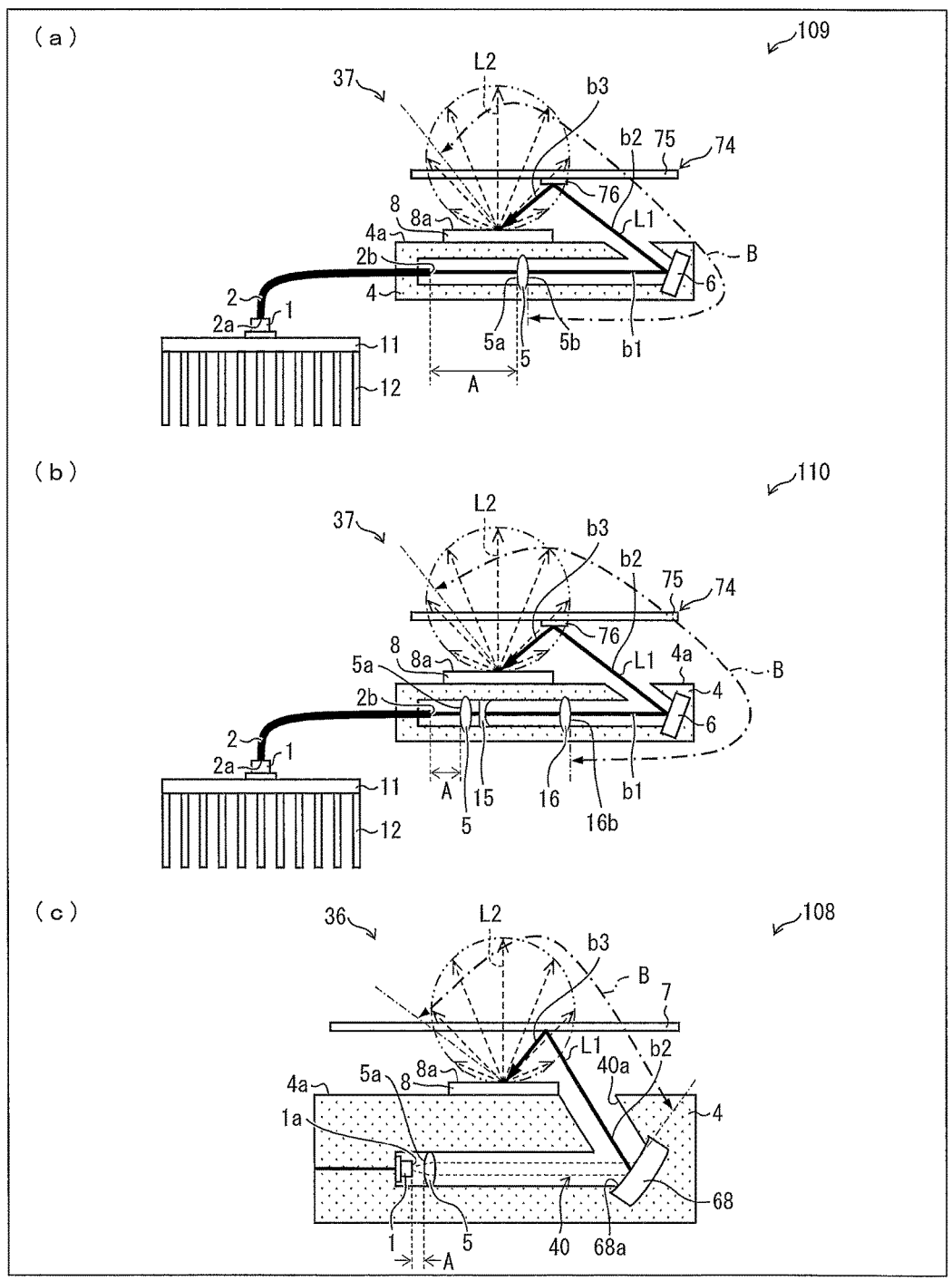
FIG. 18 (a) to (c) are each a view schematically illustrating an example placement of optical elements each having a nonplanar optical surface.

The following will describe still another embodiment of the present invention with reference to FIGS. 17 and 18. In Embodiment 4, a light-emitting device including a light reflecting/transmitting plate as an optical plate will be described.

For convenience of explanation, members of Embodiment 4 that are identical in function to their respective corresponding members described in Embodiments 1 to 3 are each assigned a common reference numeral, and are not described here.

First, a configuration of a light-emitting device 109 in accordance with Embodiment 4 will be described. The light-emitting device 109 emits, as illumination light, a mixture of (i) a laser beam (emission light) L1 and (ii) fluorescence (emission light) L2 that is generated by illuminating the fluorescent section 8, which contains particles of a fluorescent material, with the laser beam L1.

FIG. 17 is a cross-sectional view illustrating the configuration of the light-emitting device 109 in accordance with Embodiment 4. As illustrated in FIG. 17, the light-emitting device 109 includes a laser element 1, an optical fiber 2, and a light-emitting unit 37. The light-emitting device 109 is configured such that the laser element 1 and the light-emitting unit 37 are connected to each other via the optical fiber 2.

The light-emitting device 109 differs from the light-emitting devices 100 to 108 of the above embodiments mainly in that it includes a light reflecting/transmitting plate (optical plate) 74 instead of the wavelength selection filter 7.

The light-emitting device 109, unlike the light-emitting devices 100 to 108 described above, does not remove the spectrum of a laser beam L1 with the use of the wavelength selection filter 7 but releases the laser beam L1 to the outside for use as a portion of illumination light. The laser beam L1 has a wavelength of, for example, 365 nm to 490 nm, preferably 390 nm to 410 nm (bluish-purple) or 440 nm to 480 nm (blue). Illuminating the fluorescent section 8 with a laser beam L1 having such a wavelength can mix the bluish-purple or blue laser beam L1 with fluorescence L2 to generate white illumination light. In particular, since the light-emitting device 109 does not remove the spectrum of a laser beam L1 but uses the laser beam L1 as a portion of illumination light, the laser beam L1 is preferably visible light. In such a case, the laser beam L1 more preferably has a wavelength in the range of 440 nm to 480 nm for better efficiency of excitation of the fluorescent material.

The light-emitting unit 37 intends to generate fluorescence L2 by irradiation of the fluorescent section 8, which contains a fluorescent material, with a laser beam L1 emitted from the laser element 1 and then release the generated fluorescence together with the laser beam L1. The light-emitting unit 37 includes: a casing (placement section) 4; a lens 5; a mirror (reflection mirror) 6; a light reflecting/transmitting plate 74; and a fluorescent section (light-emitting section) 8.

The light-emitting unit 37 includes, as a reflection mirror, a mirror 6 including, for example, an aluminum reflection mirror. The dielectric multilayer film mirror 65 described above requires precisely controlling the thickness of the multilayer film coating 72, and requires a high production cost. The light-emitting unit 37, which includes the mirror 6 instead of the dielectric multilayer film mirror 65, can be produced at a reduced cost.

The light reflecting/transmitting plate 74 is a plate-shaped light transmission member having transparency to light and is located so as to face the laser beam irradiation surface 8a of the fluorescent section 8. The light reflecting/transmitting plate 74 is provided in substantially parallel to the laser beam irradiation surface 8a of the fluorescent section 8 so as to face the laser beam irradiation surface 8a of the fluorescent section 8.

The light reflecting/transmitting plate 74 is an optical plate including a glass plate (light transmission member) 75 and a reflection film (reflection region) 76. The reflection film 76 is provided on a portion of a surface of the glass plate 75 which surface faces the fluorescent section 8.

The glass plate 75 is a plate-shaped light transmission member serving as a base material of the light reflecting/transmitting plate 74. The glass plate 75 transmits (i) fluorescence L2 generated by the fluorescent section 8 and (ii) a portion of the laser beam L1 emitted to the fluorescent section 8 which portion has failed to be converted into fluorescence L2.

The base material of the light reflecting/transmitting plate 74 is not limited to the glass plate 75, and may be a light-transmitting material such as polycarbonate and acryl.

The reflection film 76 intends to reflect a laser beam L1 toward the fluorescent section 8. The reflection film 76 of Embodiment 4 is formed by depositing a metallic material such as aluminum onto a portion of the surface of the glass plate 75 which surface faces the fluorescent section 8.

In the case where the reflection film 76 is used to reflect a laser beam L1 toward the fluorescent section 8, efficient use of fluorescence L2 requires reducing the amount of fluorescence L2 that is blocked by the reflection film 76.

To that end, it is preferable to (1) form a reflection film at a position that is the farthest possible from the fluorescent section 8 in the in-plane direction of the glass plate 75 or (2) form a reflection film 76 that is the smallest possible in area.

As to the point (1) above, it is preferable to form a reflection film 76 at such a position that there is no coincidence between (i) a normal line P passing through the central position of the fluorescent section 8 and (ii) a normal line Q for the reflection film 76, or it is more preferable to form a reflection film 76 at such a position that the normal line Q for the reflection film 76 does not pass through the laser beam irradiation surface 8a of the fluorescent section 8.

The central position of the fluorescent section 8 refers to the barycenter of a surface outlined by sequential dots at each of which the fluorescent section 8 (light source) has a luminance that is 50% of its maximum value. The normal line P passing through the central position of the fluorescent section 8 refers to a line extending from the barycenter perpendicularly to the laser beam irradiation surface 8a. The normal line Q for the reflection film 76 refers to a line extending, from a position on the reflection film 76 to which position a laser beam L1 is emitted, perpendicularly to the reflective surface of the reflection film 76 (that is, half the angle formed by (i) a laser beam L1 traveling toward the reflection film 76 and (ii) a laser beam L1 as reflected by the reflection film 76).

The above arrangement allows a reflection film 76 to be formed at a position far from the fluorescent section 8 in the in-plane direction of the glass plate 75, and can thus reduce the amount of fluorescence L2 that is blocked by the reflection film 76.

(a) to (c) of FIG. 18 are each a view schematically illustrating an example placement of optical elements each having a nonplanar optical surface. (a) of FIG. 18 illustrates an optical path that extends from (i) the emission end (excitation light emission end) 2b of the optical fiber 2 for emitting a laser beam L1 to (ii) the laser beam irradiation surface 8a of the fluorescent section 8. With (i) an optical path length A (see (a) of FIG. 18) indicative of the length of a portion of the above optical path (first optical path length) which portion extends from the emission end 2b to the entry surface (first optical element surface) 5a of the lens 5 and with (ii) an optical path length B indicative of the length of a portion of the above optical path (second optical path length; b1+b2+b3) which portion extends from the exit surface (second optical element surface) 5b of the lens 5 to the laser beam irradiation surface 8a, the lens 5 is preferably so placed for the point (2) above that the optical path length A is smaller than the optical path length B.

Relatively decreasing the optical path length A makes it possible to (i) suitably guide the laser beam L1, emitted from the emission end 2b of the optical fiber 2, to the entry surface 5a of the lens 5 and to (ii) control the beam diameter of the laser beam L1. Further, relatively increasing the optical path length B makes it possible to (i) easily control the beam diameter of the laser beam L1, emitted from the exit surface 5b of the lens 5 to the laser beam irradiation surface 8a, and consequently to (ii) emit a laser beam L1 with an optimal beam diameter to the laser beam irradiation surface 8a.

Placing the lens 5 as described above so that the optical path length A is smaller than the optical path length B makes it easy to control the beam diameter of a laser beam L1 with the use of an optical element having a nonplanar optical surface. The above placement of the lens 5 allows the laser beam L1 incident on the laser beam irradiation surface 8a to have a numerical aperture NA that is not greater than that of the laser beam L1 at the emission end 2b of the optical fiber 2. Since the above placement can reduce the numerical aperture NA, the reflection film 76 can have a smaller area for a given distance from the laser beam irradiation surface 8a to the reflection film 76. The above placement further increases design freedom; for instance, it reduces the risk of positional interference between the laser beam L1 and the optical elements.

There may be placed, along the optical path that extends from (i) the emission end 2b of the optical fiber 2 for emitting a laser beam L1 to (ii) the laser beam irradiation surface 8a of the fluorescent section 8, a plurality of lenses 5, 15, and 16 each having a nonplanar optical surface as in a light-emitting device 110 illustrated in (b) of FIG. 18. With (i) an optical path length A (see (b) of FIG. 18) indicative of the length of a portion of the above optical path which portion extends from the emission end 2b of the optical fiber 2 to a nonplanar entry surface 5a of the lens 5, which is an optical element located most upstream along the above optical path, and with (ii) an optical path length B indicative of the length of a portion of the above optical path (b1+b2+b3) which portion extends from a nonplanar exit surface (second optical element surface) 16b of the lens 16, which is an optical element located most downstream along the above optical path, the lenses 5 and 16 may be, in the above case, so placed that the optical path length A is smaller than the optical path length B. In the above example, the optical elements provided along the above optical path (which extends from the emission end 2b of the optical fiber 2 to the laser beam irradiation surface 8a of the fluorescent section 8) are preferably set to collectively have positive power (for collecting light). Setting the optical elements to collectively have negative power (for diverging light) is not preferable.

The discussion in the previous paragraph applies also to the light-emitting device 108 including the wavelength selection filter 7 illustrated in (c) of FIG. 18. With (i) an optical path length A (see (c) of FIG. 18) indicative of the length of a portion of the above optical path which portion extends from the laser beam emission end (excitation light emission end) 1a of the laser element 1 to the nonplanar entry surface 5a of the lens 5, which is an optical element located most upstream along the above optical path, and with (ii) an optical path length B indicative of the length of a portion of the above optical path (b2+b3) which portion extends from a nonplanar reflective surface (second optical element surface) 68a of the concave mirror 68, which is an optical element located most downstream along the above optical path, to the laser beam irradiation surface 8a, the light-emitting device 108 may be configured such that the lens 5 and the concave mirror 68 are so placed that the optical path length A is smaller than the optical path length B. The use of the concave mirror 68 for collecting a laser beam L1, in particular, allows the upstream end of the optical path length B (reflective surface 68a) to be positioned in proximity to the laser beam irradiation surface 8a as compared to the case of using a lens to collect a laser beam L1. The above arrangement, as compared to the case of using a lens to collect light, advantageously increases the degree of freedom of where to place an optical component; for instance, it further reduces the risk of positional interference between the laser beam L1 and the optical elements. The concave mirror 68 is desirably an off-axis parabolic mirror for smaller aberration in projecting, onto the laser beam irradiation surface 8a, an image formed by a laser beam L1 from the laser beam emission end 1a.

As described above, the light-emitting device 109 of Embodiment 4 includes a light-emitting unit 37 including (i) a fluorescent section 8 for emitting fluorescence L2 upon irradiation with a laser beam L1 and (ii) a light reflecting/transmitting plate 74 located so as to face the fluorescent section 8. The light reflecting/transmitting plate 74 has a reflection film 76 for reflecting a laser beam L1 from the laser element 1 toward the fluorescent section 8. The light reflecting/transmitting plate 74 transmits fluorescence L2 that the fluorescent section 8 emits upon irradiation with the laser beam L1 reflected by the reflection film 76.

The light-emitting device 109 includes a light-emitting unit 37 that includes a light reflecting/transmitting plate 74 located so as to face the fluorescent section 8, the light reflecting/transmitting plate 74 having a reflection film 76 for reflecting a laser beam L1 toward the fluorescent section 8. Using the reflection film 76 of the light reflecting/transmitting plate 74 to reflect a laser beam L1 from the laser element 1 toward the fluorescent section 8 allows the laser beam L1 to be emitted to the fluorescent section 8 for generation of fluorescence L2. This arrangement eliminates the need to provide, between the fluorescent section 8 and the light reflecting/transmitting plate 74, a separate excitation light source or mirror for illuminating the fluorescent section 8 with the laser beam L1.

The light-emitting device 109, with the above arrangement, eliminates the need to find a room for an excitation light source or the like between the fluorescent section 8 and the light reflecting/transmitting plate 74, thus allowing the light reflecting/transmitting plate 74 to be placed in proximity to the fluorescent section 8. Thus, in a case where fluorescence L2 transmitted by the light reflecting/transmitting plate 74 is to be cast through a light distribution controlling member such as a projection lens, it is possible to provide the projection lens or the like in proximity to the fluorescent section 8. This allows fluorescence L2 released in Lambertian distribution by the fluorescent section 8 to enter the projection lens or the like without losses and be thus cast through the projection lens or the like.

The light-emitting device 109 of Embodiment 4 consequently has improved efficiency of light use.

Further, the light-emitting device 109 of Embodiment 4 has high luminance as it is capable of releasing a laser beam L1 to the outside together with fluorescence L2 for use as a portion of illumination light.

The following will describe still another embodiment of the present invention with reference to FIGS. 19 through 22. In Embodiment 5, a light-emitting device further including an absorption-type filter as an optical plate will be described.

For convenience of explanation, members of Embodiment 5 that are identical in function to their respective corresponding members described in Embodiments 1 to 4 are each assigned a common reference numeral, and are not described here.

First, a configuration of a light-emitting device 111 in accordance with Embodiment 5 will be described. The light-emitting device 111 emits, as illumination light, fluorescence (emission light) L2 that is generated by illuminating the fluorescent section 8, which contains particles of a fluorescent material, with a laser beam L1.

Figure 19:
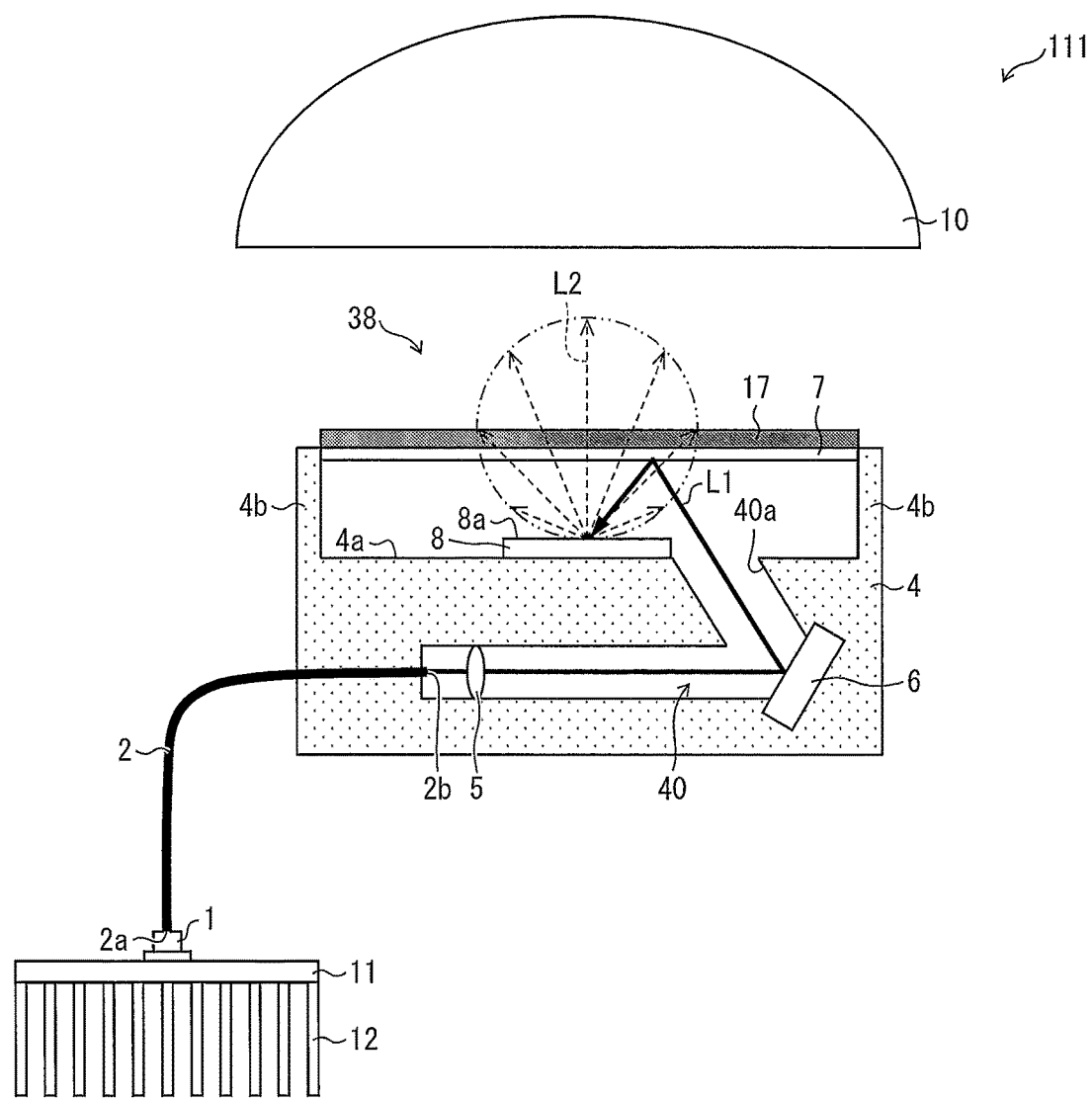
FIG. 19 is a cross-sectional view illustrating the configuration of a light-emitting device in accordance with Embodiment 5.

FIG. 19 is a cross-sectional view illustrating the configuration of the light-emitting device 111 in accordance with Embodiment 5. As illustrated in FIG. 19, the light-emitting device 111 includes a laser element 1, an optical fiber 2, and a light-emitting unit 38. The light-emitting device 111 is configured such that the laser element 1 and the light-emitting unit 38 are connected to each other via the optical fiber 2.

The light-emitting device 111 differs from the light-emitting device 100 of Embodiment 1 (see FIG. 1) mainly in that it includes an absorption-type filter 17 in addition to the wavelength selection filter 7.

The light-emitting unit 38 intends to generate fluorescence by irradiation of the fluorescent section 8, which contains a fluorescent material, with a laser beam L1 emitted from the laser element 1 and then release the fluorescence thus generated. The light-emitting unit 38 includes: a casing 4; a lens 5; a mirror 6; a wavelength selection filter (optical plate) 7; an absorption-type filter (optical plate) 17; and a fluorescent section (light-emitting section) 8.

The absorption-type filter 17 intends to absorb light in the wavelength range of the laser beam L1 and transmits light with longer wavelengths (that is, fluorescence L2 generated by the fluorescent section 8). The absorption-type filter 17 is placed on the side of a surface of the wavelength selection filter 7 which surface is opposite to a surface that reflects a laser beam L1 (that is, a surface through which fluorescence L2 enters the wavelength selection filter 7).

The wavelength selection filter 7 has the above-described operation and effect: Appropriately selecting the wavelength for a laser beam L1 and its angle of incidence with respect to the wavelength selection filter 7 allows the wavelength selection filter 7 to reflect almost all of the laser beam L1 and let fluorescence L2 pass through it efficiently (see FIG. 3).

The laser beam L1 entering the fluorescent section 8 is, however, not necessarily converted into fluorescence L2 at the fluorescent section 8 in its entirety: The laser beam L1 entering the fluorescent section 8 produces (i) a partial component that is diffuse-reflected at a surface of the fluorescent section 8 or (ii) a partial component that enters the fluorescent section 8 and that is then emitted from the fluorescent section 8 without being converted into fluorescence L2. Such stray-light components of the laser beam L1 are, with a release source being a portion of the fluorescent section 8 at which portion the fluorescent section 8 is irradiated with the laser beam L1, released from the fluorescent section 8 in a radiation pattern similar to the pattern of Lambertian distribution. The stray-light components of the laser beam L1, in this case, strike the wavelength selection filter 7 at various angles: A shay-light component of the laser beam L1 which stray-light component is incident on the wavelength selection filter 7 at a sharp angle is reflected by the wavelength selection filter 7 and is consequently not released to the outside, whereas a stray-light component of the laser beam L1 which stray-light component is incident on the wavelength selection filter 7 at a great angle is not reflected by the wavelength selection filter 7 and transmits the wavelength selection filter 7 to be released to the outside.

The light-emitting device 111, to alleviate the above problem, further includes an absorption-type filter 17 to absorb, among the above stray-light components of the laser beam L1, a component transmitted by the wavelength selection filter 7.

Figure 20:
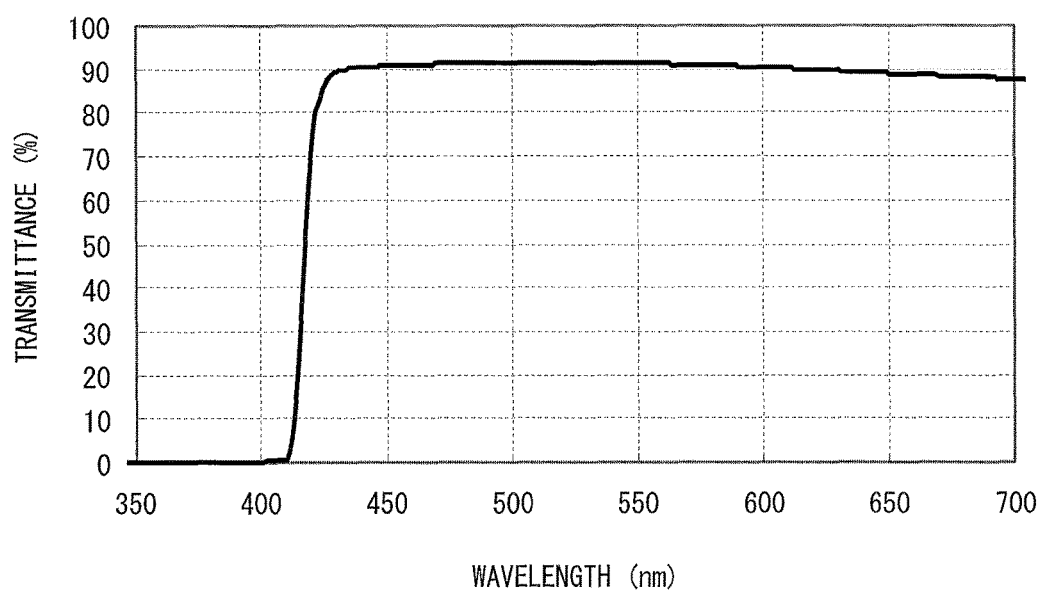
FIG. 20 is a graph illustrating wavelength selectivity of an absorption-type filter.

FIG. 20 is a graph illustrating the wavelength selectivity of the absorption-type filter 17. FIG. 20 indicates (i) along the horizontal axis, the wavelength of light entering the absorption-type filter 17 and (ii) along the vertical axis, the transmittance of such light.

FIG. 20 illustrates, as the wavelength selectivity of the absorption-type filter 17, an example wavelength selectivity having a cutoff wavelength of 418 nm, whereby the absorption-type filter 17 absorbs light with a wavelength shorter than 418 nm and transmits light with a wavelength longer than 418 nm. The wavelength selectivity of the absorption-type filter 17, unlike that of the wavelength selection filter 7, does not depend on the angle of incidence of the laser beam L1. The absorption-type filter 17 is thus capable of absorbing a stray-light component of the laser beam L1 regardless of the angle of incidence of that stray-light component of the laser beam L1.

The light-emitting device 111, as described above, uses the combination of (i) the wavelength selection filter 7, which is a reflection-type filter that transmits fluorescence L2 and that reflects a laser beam L1, and (ii) the absorption-type filter 17, which transmits fluorescence L2 and absorbs a laser beam L1. This arrangement makes it possible to block a laser beam L1 including even a stray-light component thereof. In other words, while the wavelength selection filter 7 serves to selectively reflect a laser beam L1, the absorption-type filter 17 absorbs a stray-light component of the laser beam L1 which stray-light component has failed to be reflected by the wavelength selection filter 7 and has been transmitted by the wavelength selection filter 7.

The absorption-type filter 17 described above includes, for example, (i) a transparent member made of glass or the like and (ii) a light-absorbing material dispersed in the transparent member. Examples of the absorption-type filter 17 include an absorption-type filter disclosed in Japanese patent No. 5142139.

Figure 21:
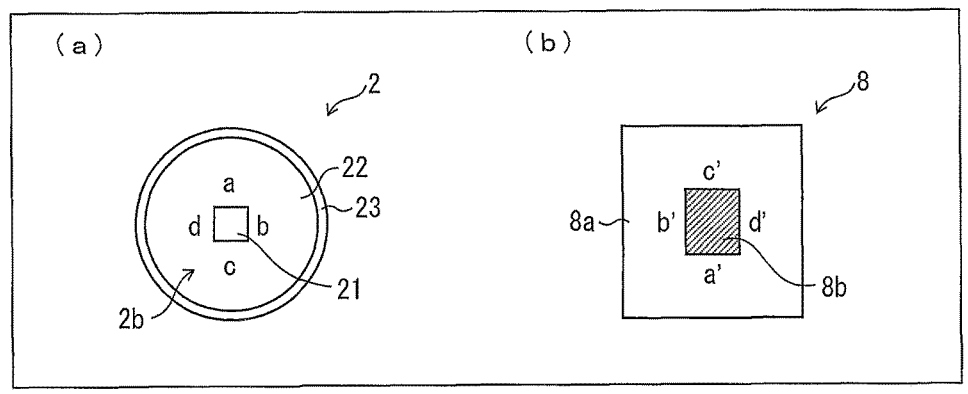
FIG. 21 (a) is a plan view illustrating an emission end of an optical fiber shown in FIG. 19, and FIG. 21 (b) is a plan view illustrating a fluorescent section shown in FIG. 19.

(a) of FIG. 21 is a plan view illustrating the emission end 2b of the optical fiber 2 of Embodiment 5. (b) of FIG. 21 is a plan view illustrating the fluorescent section 8. As illustrated in (a) of FIG. 21, Embodiment 5 uses, as the optical fiber 2, a multimode fiber including a core 21 having a quadrangular shape at the emission end 2b. The optical fiber 2 has a structure in which (i) the central core 21 is covered with a clad 22 which has a refractive index lower than that of the core 21 and (ii) the clad 22 is in turn covered with a coating layer 23. The core 21 is square or rectangular in cross section with four sides each having a length of around several hundreds of micrometers, for example, 100 μm to 800 μm. The laser beam L1 emitted from the laser element 1 is directed to the entry end 2a of the optical fiber 2 including the quadrangular core 21.

Causing a laser beam L1 of the laser element 1, the laser beam L1 having a light intensity in Gaussian distribution, to enter the optical fiber 2 (which is a multimode fiber including a quadrangular core 21) can produce, at the emission end 2b of the optical fiber 2, a rectangular near-field pattern having a substantially uniform light distribution.

Embodiment 5 uses, as the lens 5, an imaging lens that enlarges the shape of the quadrangular core 21 which shape is formed at the emission end 2b of the optical fiber 2 and that forms an image in the enlarged shape on the laser beam irradiation surface 8a of the fluorescent section 8. With this arrangement, using the lens 5 to form, on the laser beam irradiation surface 8a of the fluorescent section 8, an image of a near-field pattern formed at the emission end 2b of the optical fiber 2 allows the laser beam L1 to be emitted to a rectangular laser beam irradiation region 8b on the laser beam irradiation surface 8a of the fluorescent section 8 as illustrated in (b) of FIG. 21. The above arrangement consequently allows the fluorescent section 8 to emit uniform light in a rectangular shape.

The quadrangular core 21 illustrated in (a) of FIG. 21 has sides a to d that correspond respectively to sides a' to d' of the image formed, that is, the laser beam irradiation region 8b illustrated in (b) of FIG. 21, on the laser beam irradiation surface 8a of the fluorescent section 8.

Embodiment 5 uses, as the projection lens 10, a lens that casts light so as to form an image, to a far position, in a shape that is identical to the shape of the light emitted from the fluorescent section 8. This arrangement makes it possible to cast light, to a far position, in a shape that is identical to the shape of the light from the fluorescent section 8, which emits uniform light in a rectangular shape as described above.

Thus, casting light in a rectangular pattern having horizontal straight lines makes it possible to suitably project a part of a cutoff line of a low beam (dipped beam) for an automobile headlamp, the low beam having a shape of a horizontal straight line and requiring high brightness contrast. The arrangement of Embodiment 5 is, in other words, applicable particularly suitably to a low beam for an automobile headlamp.

As described above, the light-emitting device 111 of Embodiment 5 includes a light-emitting unit 38 including not only a wavelength selection filter 7 for reflecting a laser beam L1 and transmitting fluorescence L2, but also an absorption-type filter 17 for selectively absorbing a laser beam L1, the absorption-type filter 17 being provided on one surface of the wavelength selection filter 7 which surface is opposite to the other surface thereof that reflects a laser beam L1.

The combinational use of the wavelength selection filter 7 (which is a reflection-type filter for transmitting fluorescence L2 and reflecting a laser beam L1) and the absorption-type filter 17 (which transmits fluorescence L2 and absorbs a laser beam L1) makes it possible to block a laser beam L1 including even a stray-light component thereof.

The light-emitting device 111 of Embodiment 5 is consequently capable of suitably preventing a stray-light component of a laser beam L1, which stray-light component is a component that was not converted into fluorescence L2, from leaking to the outside.

Figure 22:
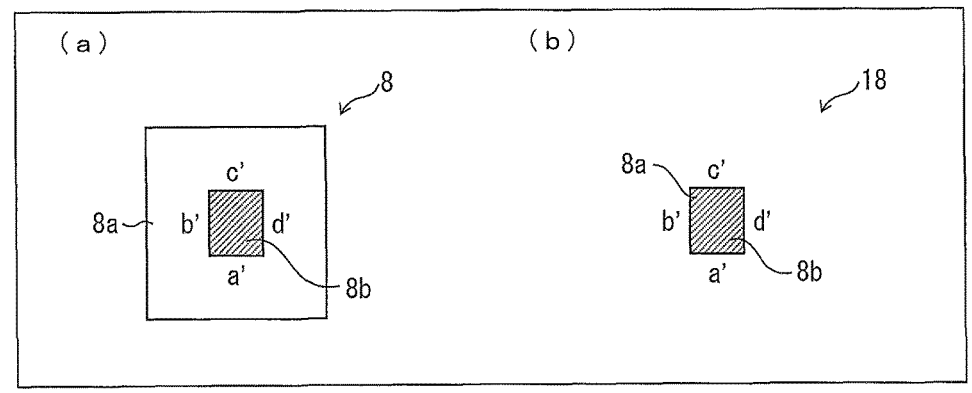
FIGS. 22 (a) and (b) are each a plan view illustrating a modification example of the fluorescent section illustrated in FIG. 21 (b).

The following will describe a modification example of the fluorescent section 8 with reference to FIGS. 22. (a) and (b) of FIG. 22 are each a plan view illustrating a modification example of the fluorescent section 8. The description above deals with the arrangement of, as illustrated in (a) of FIG. 22, (i) using a fluorescent section 8 having a laser beam irradiation surface 8a larger than the rectangular laser beam irradiation region 8b and (ii) emitting a laser beam L1 to a portion of the laser beam irradiation surface 8a of the fluorescent section 8 to cause the fluorescent section 8 to emit uniform light in a rectangular shape.

The laser beam irradiation region 8b may alternatively be identical to the laser beam irradiation surface 8a in area and shape as illustrated in (b) of FIG. 22. This arrangement allows the fluorescent section 8 to have extremely high brightness contrast at an end thereof, and can thus increase the brightness contrast at a straight-line portion of a rectangular pattern of light cast by the light-emitting device 111.

The present modification example is consequently suitably applicable to the case of casting light in a pattern having high brightness contrast.

An effect similar to the above is achievable with the arrangement of using a fluorescent section 8 having a laser beam irradiation surface 8a that is smaller in area and shape than the laser beam irradiation region 8b.

Figure 23:
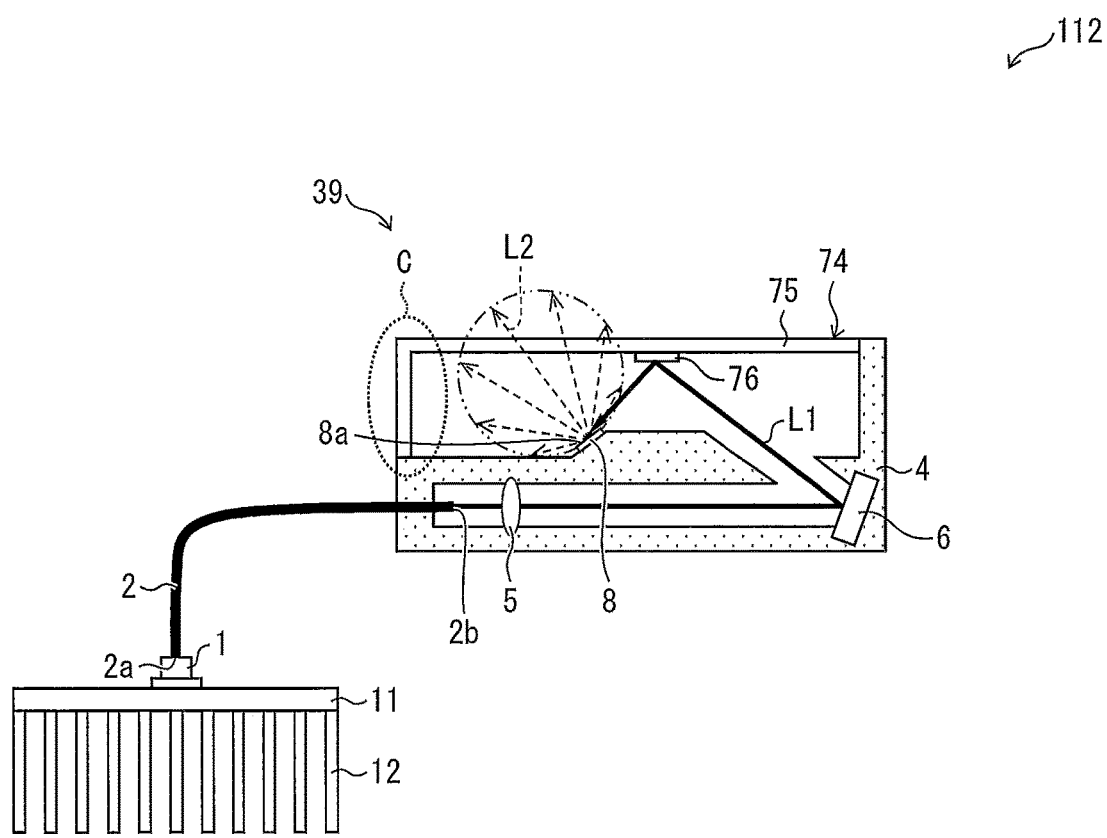
FIG. 23 is a cross-sectional view illustrating the configuration of a light-emitting device in accordance with Embodiment 6.
Figure 24:
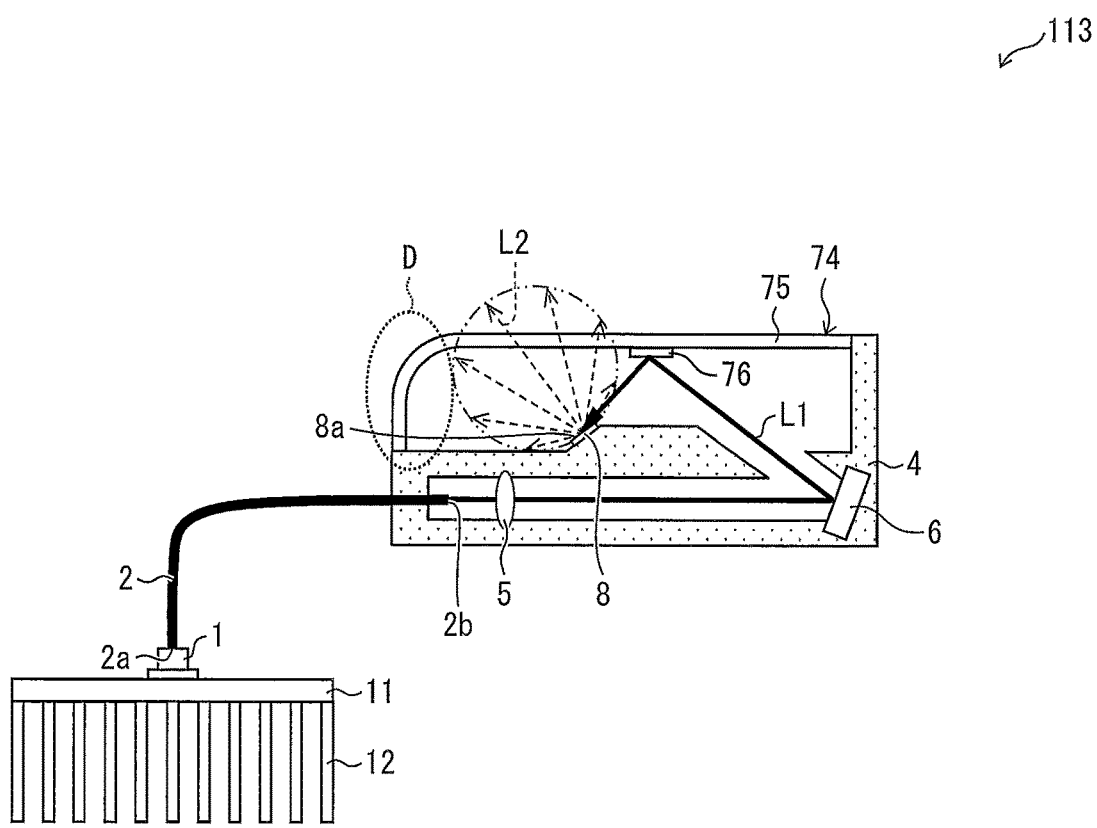
FIG. 24 is a cross-sectional view illustrating a modification example of a sidewall section shown in FIG. 23.

The following will describe still another embodiment of the present invention with reference to FIGS. 23 and 24. In Embodiment 6, a light-emitting device including a fluorescent section provided at a slant in a light-emitting unit will be described.

For convenience of explanation, members of Embodiment 6 that are identical in function to their respective corresponding members described in Embodiments 1 to 5 are each assigned a common reference numeral, and are not described here.

First, a configuration of a light-emitting device 112 in accordance with Embodiment 6 will be described. The light-emitting device 112 emits, as illumination light, fluorescence (emission light) L2 that is generated by illuminating the fluorescent section 8, which contains particles of a fluorescent material, with a laser beam L1.

FIG. 23 is a cross-sectional view illustrating the configuration of the light-emitting device 112 in accordance with Embodiment 6. As illustrated in FIG. 23, the light-emitting device 112 includes a laser element 1, an optical fiber 2, and a light-emitting unit 39. The light-emitting device 112 is configured such that the laser element 1 and the light-emitting unit 39 are connected to each other via the optical fiber 2.

The light-emitting device 112 differs from the light-emitting device 109 of Embodiment 4 (see FIG. 17) mainly in that the fluorescent section 8 is so provided that its laser beam irradiation surface 8a is slanted with respect to the reflection film 76.

The light-emitting unit 39 intends to generate fluorescence L2 by irradiation of the fluorescent section 8, which contains a fluorescent material, with a laser beam L1 emitted from the laser element 1 and then release, for example, the fluorescence thus generated. The light-emitting unit 39 includes: a casing 4; a lens 5; a mirror 6; a light reflecting/transmitting plate 74; and a fluorescent section 8.

The light-emitting unit 39 of Embodiment 6 is configured such that the fluorescent section 8 is provided at a slant so that a laser beam irradiation surface 8a faces in a different direction from where the reflection film 76 is placed (in other words, so that the reflection film 76 and the laser beam irradiation surface 8a are not parallel to each other). This configuration can reduce the amount of fluorescence L2 emitted by the fluorescent section 8 and striking the reflection film 76, and can consequently reduce the amount of fluorescence L2 that would otherwise be blocked by the reflection film 76.

The description above of Embodiment 4 deals with the arrangement of forming a reflection film 76 at a position far from the fluorescent section 8 in the in-plane direction of the glass plate 75 to reduce the amount of fluorescence L2 that would otherwise be blocked by the reflection film 76. In contrast, Embodiment 6, in order to reduce the amount of fluorescence L2 that would otherwise be blocked by the reflection film 76, places the fluorescent section 8 at a slant so that the laser beam irradiation surface 8a faces in a different direction from where the reflection film 76 is placed. Specifically, Embodiment 6 is configured such that the laser beam irradiation surface 8a of the fluorescent section 8 has a normal line (in the direction of which fluorescence L2 is emitted most strongly) that is slanted toward such a direction as to be far from the reflection film 76. This configuration reduces the amount of fluorescence L2 emitted by the fluorescent section 8 and striking the reflection film 76, and can consequently greatly reduce the amount of fluorescence L2 that would otherwise be blocked by the reflection film 76.

Embodiment 6 preferably further includes a sidewall section C at an end of the glass plate 75 which end is located in the direction of the normal line for the laser beam irradiation surface 8a, the sidewall section C being formed by bending the glass plate 75 at an angle of substantially 90 degrees. Forming the sidewall section C can increase the efficiency with which the light-emitting device 112 extracts fluorescence L2.

FIG. 24 is a cross-sectional view illustrating a modification example of the sidewall section C shown in FIG. 23. The sidewall section of the glass plate 75 is not particularly limited in shape. The glass plate 75 may be bent to form, for example, a sidewall section D having a smoothly curved surface as in the light-emitting device 113 illustrated in FIG. 24. The sidewall section C may cause light to, for example, unnecessarily scatter at a corner that is bent at an angle of substantially 90 degrees. The sidewall section D is preferable because it can prevent such scattering or the like of light.

Embodiment 6 can use a laser beam L1 in the wavelength range of 365 nm to 490 nm as in Embodiment 4. Embodiment 6 particularly preferably uses a blue laser beam L1 in the wavelength range of 440 nm to 480 nm. Embodiment 6 is suitably applicable to the arrangement of mixing the laser beam L1 with fluorescence L2 from the fluorescent section 8 to generate white light.

As described above, the light-emitting device 112 of Embodiment 6 includes a light-emitting unit 39 including a fluorescent section 8 placed so as to have a laser beam irradiation surface 8a slanted with respect to the reflection film 76 so that fluorescence L2 emitted by the fluorescent section 8 does not strike the reflection film 76.

The light-emitting device 112 of Embodiment 6 is consequently capable of reducing the amount of fluorescence L2 that would otherwise be blocked by the reflection film 76, and has improved efficiency of extracting fluorescence L2.

Figure 25:
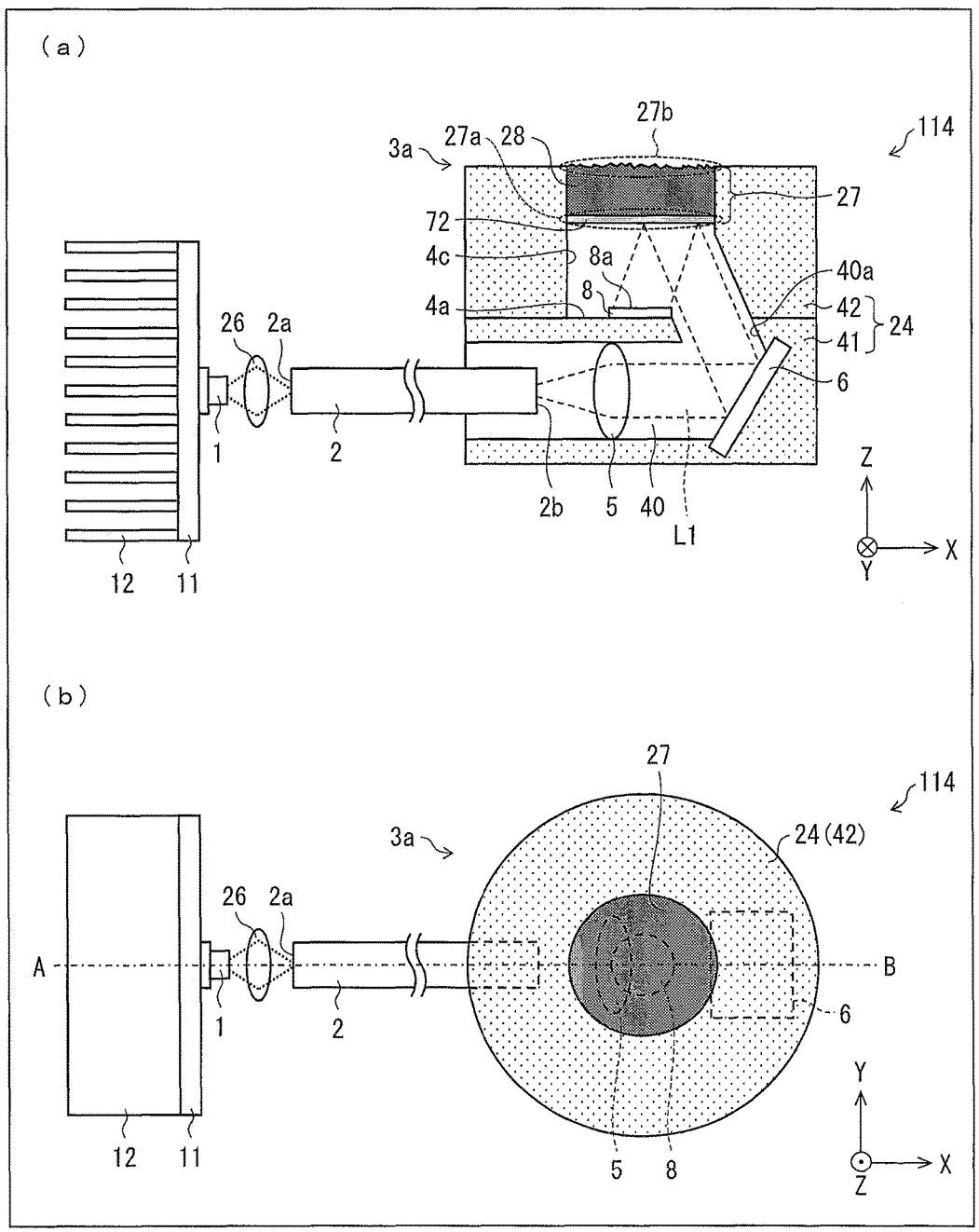
FIG. 25 (a) is a cross-sectional view illustrating the configuration of a light-emitting device in accordance with Embodiment 7, and FIG. 25 (b) is a top view illustrating the light-emitting device illustrated in FIG. 25 (a).
Figure 26:
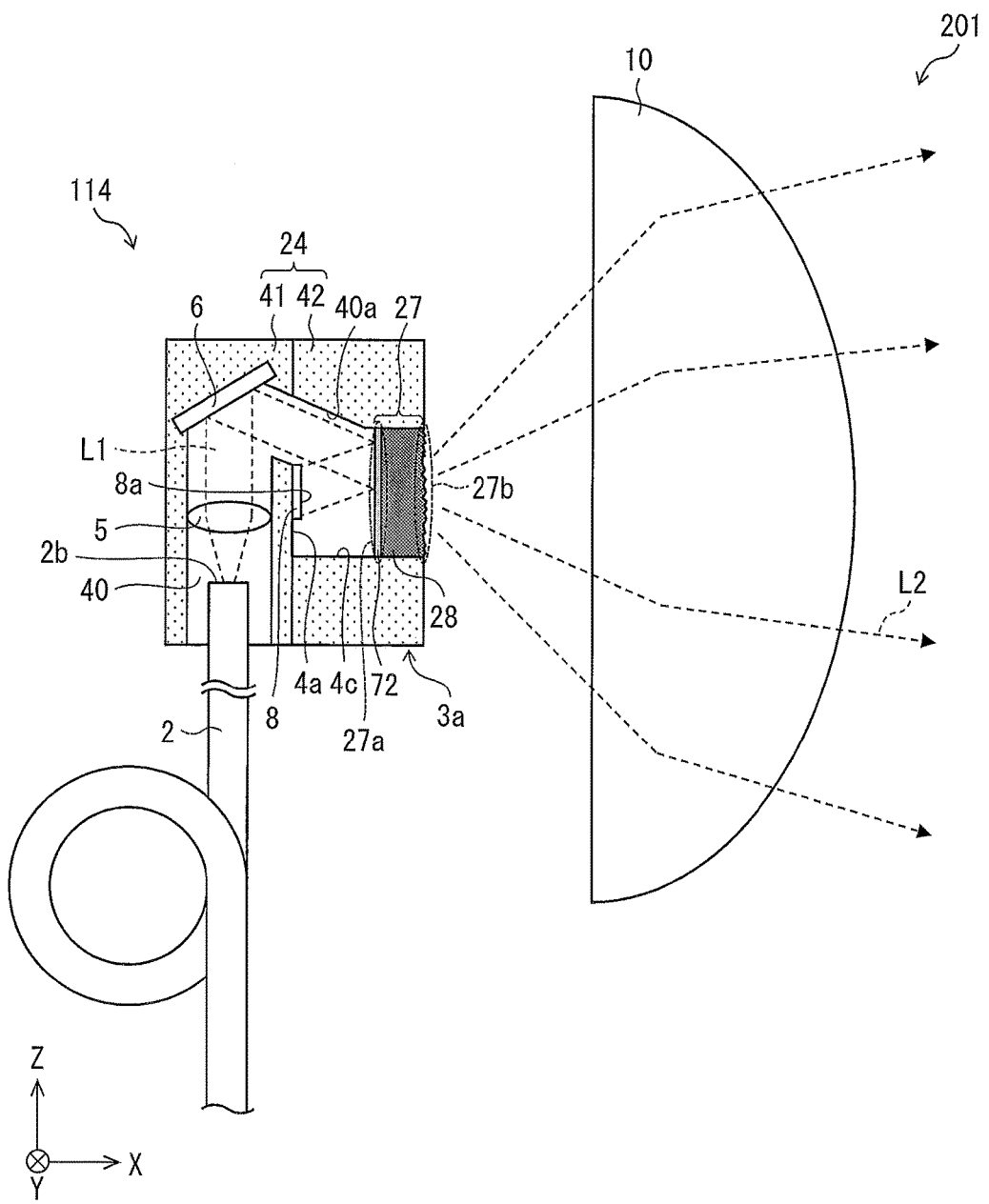
FIG. 26 is a cross-sectional view illustrating an application example of the light-emitting device illustrated in FIG. 25.
Figure 27:
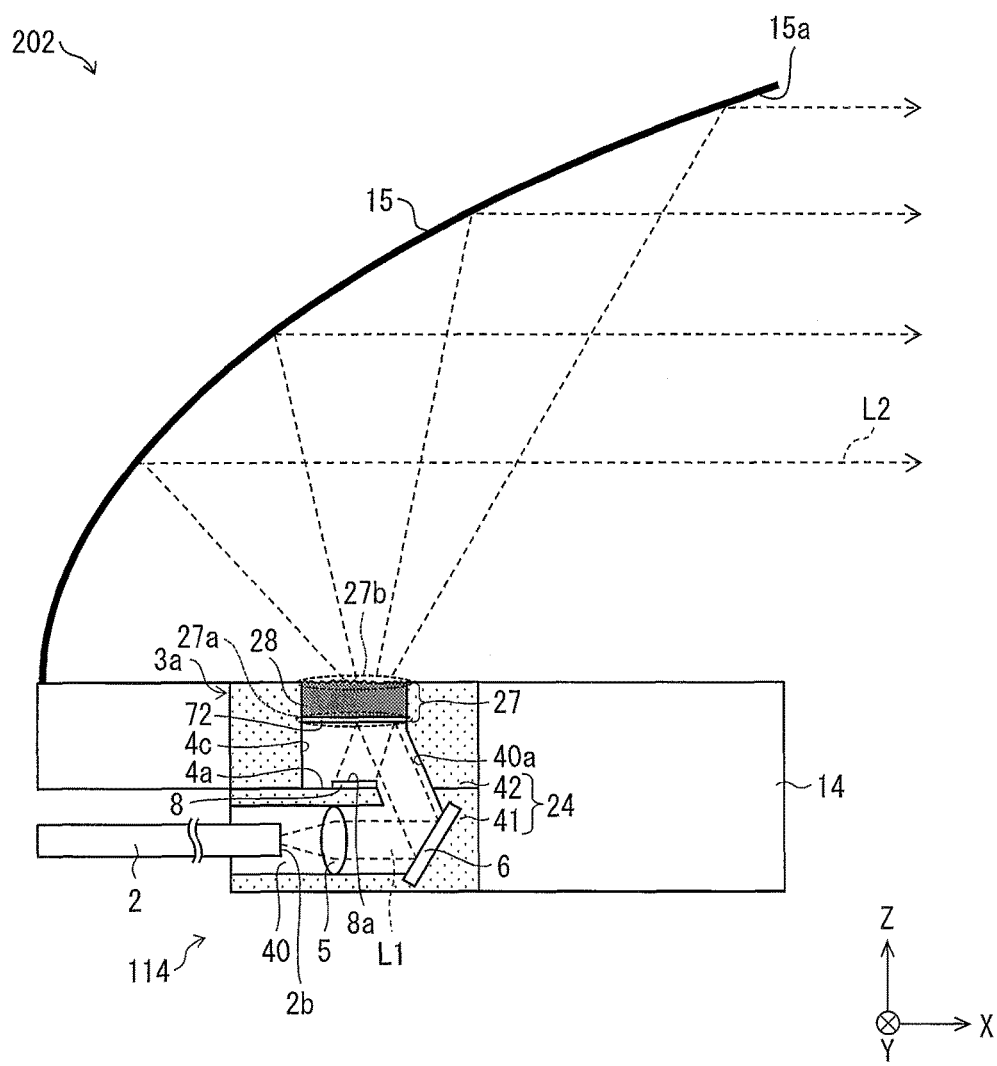
FIG. 27 is a cross-sectional view illustrating another application example of the light-emitting device illustrated in FIG. 25.

The following will describe still another embodiment of the present invention with reference to FIGS. 25 through 27. In Embodiment 7, a light-emitting device including, as an optical plate, a reflecting/diffusing plate having a light diffusing function will be described.

For convenience of explanation, members of Embodiment 7 that are identical in function to their respective corresponding members described in Embodiments 1 to 6 are each assigned a common reference numeral, and are not described here.

First, a configuration of a light-emitting device 114 in accordance with Embodiment 7 will be described with reference to FIG. 25. The light-emitting device 114 emits, as illumination light, fluorescence (emission light) L2 that is generated by illuminating the fluorescent section 8, which contains particles of a fluorescent material, with a laser beam L1.

(a) of FIG. 25 is a cross-sectional view illustrating the configuration of the light-emitting device 114. (b) of FIG. 25 is a top view illustrating the light-emitting device 114 of (a) of FIG. 25.

(a) of FIG. 25 is a cross-sectional view illustrating the light-emitting device 114 of (b) of FIG. 25 taken along line A-B in (b) of FIG. 25. (a) of FIG. 25 illustrates the configuration of a central portion of the light-emitting device 114 in a cross section taken in the Z axis direction.

As illustrated in (a) of FIG. 25, the light-emitting device 114 includes a laser element (laser light source) 1, an optical fiber 2, and a light-emitting unit 3a. The light-emitting device 114 is configured such that the laser element 1 and the light-emitting unit 3a are connected to each other via the optical fiber 2.

The light-emitting device 114 includes a light collecting lens 26 provided between the laser element 1 and the optical fiber 2 so as to collect a laser beam L1 emitted from the laser element 1 and to cause the laser beam L1 to enter the optical fiber 2 through the entry end 2a. The light collecting lens 26 is, for example, a FLKN1 405 available from ALPS ELECTRIC CO., LTD. The light collecting lens 26 is not particularly limited in shape or material as long as it has the above function. The light collecting lens 26 is, however, preferably made of a material that has high transmittance for the wavelengths of the laser beam L1 emitted from the laser element 1 and that has good heat resistance.

The light-emitting unit 3a intends to generate fluorescence by irradiation of the fluorescent section 8, which contains particles of a fluorescent material, with a laser beam L1 emitted from the laser element 1 and then release the fluorescence thus generated. The light-emitting unit 3a includes: a casing (placement section) 24; a lens 5; a mirror (reflection mirror) 6; a reflecting/diffusing plate (optical plate) 27; and a fluorescent section (light-emitting section) 8.

The casing 24 is a columnar member for containing the fluorescent section 8. The casing 24 of Embodiment 7 includes (i) a lower casing part (placement section) 41 having a placement surface 4a on which the fluorescent section 8 is placed and (ii) an upper casing part 42 for holding the reflecting/diffusing plate 27 in such a position that the reflecting/diffusing plate 27 faces the laser beam irradiation surface 8a of the fluorescent section 8.

The casing 24 has a placement surface 4a abutting the fluorescent section 8, the placement surface 4a preferably functioning as a reflective surface. In a case where the placement surface 4a abutting the fluorescent section 8 functions as a reflective surface, the placement surface 4a can, after the fluorescent section 8, which is to receive a laser beam L1, has converted a laser beam L1 (which has entered into the fluorescent section 8 through the laser beam irradiation surface 8a) into fluorescence L2, reflect that fluorescence L2 toward the reflecting/diffusing plate 27. The placement surface 4a can alternatively reflect a laser beam L1 (which has entered into the fluorescent section 8 through the laser beam irradiation surface 8a) to direct the laser beam L1 to an inner portion of the fluorescent section 8 again for conversion into fluorescence L2.

The casing 24 has an inner wall 4c (that is, the internal circumferential surface of the upper casing part 42) surrounding the fluorescent section 8 and the reflecting/diffusing plate 27, the inner wall 4c preferably having a reflective surface. In a case where the inner wall 4c has a reflective surface, the inner wall 4c can reflect fluorescence L2, generated by the fluorescent section 8, toward the reflecting/diffusing plate 27. The reflective surface of the inner wall 4c is, for example, a mirror-polished aluminum surface or a smooth surface with aluminum deposited thereon.

The reflecting/diffusing plate 27 intends to reflect, toward the fluorescent section 8, a laser beam L1 emitted from the laser element 1 and to transmit and diffuse fluorescence L2 generated by the fluorescent section 8 upon irradiation with the laser beam L1 reflected. The reflecting/diffusing plate 27 is located so as to face the laser beam irradiation surface 8a of the fluorescent section 8 and is held at its periphery by the internal circumferential surface of the cylindrical upper casing part 42.

The reflecting/diffusing plate 27 includes (i) a diffusing plate 28 and (ii) the above-described multilayer film coating 72 (see FIG. 2) with which a surface of the diffusing plate 28 is coated. The reflecting/diffusing plate 27 has the function of (i) reflecting a laser beam L1 and (ii) transmitting and diffusing fluorescence L2.

The reflecting/diffusing plate 27 has a light entry surface 27a facing the fluorescent section 8, the light entry surface 27a being coated with the multilayer film coating 72. The reflecting/diffusing plate 27 has a light exit surface 27b opposite to the light entry surface 27a, the light exit surface 27b having minute irregularities formed thereon by being processed to be a ground glass-like surface.

The diffusing plate 28 intends to transmit and diffuse fluorescence L2 generated by the fluorescent section 8. The diffusing plate 28 is, for example, a frosted diffusing plate that is made of glass or the like and that has a surface (that is, the light exit surface 27b) opposite to the fluorescent section 8, the surface being processed to be a ground glass-like surface. The material and arrangement of the diffusing plate 28 are selected as appropriate according to need.

The reflecting/diffusing plate 27 may be arranged such that a multilayer film coating 72 is formed directly on a diffusing plate 28 as in Embodiment 7, or alternatively such that (i) a multilayer film coating 72 is formed on a surface of a base material having transparency to light and (ii) the base material, on which the multilayer film coating 72 is formed, is attached to a diffusing plate 28. In the latter case, suitable examples of the base material include BK7, synthetic quartz, and a superwhite glass (for example, B270, D263Teco, or BSL7). The reflecting/diffusing plate 27 may alternatively include the above-described wavelength selection filter 7 and a diffusing plate 28 attached to each other.

The reflecting/diffusing plate 27 has the wavelength selectivity illustrated in FIG. 3. The reflecting/diffusing plate 27 can reflect, not transmit, a laser beam L1 having traveled through an opening 40a of the casing 24 and incident on the reflecting/diffusing plate 27 at a predetermined angle.

The reflecting/diffusing plate 27 diffusing fluorescence L2, generated by the fluorescent section 8, and releasing it to the outside allows the fluorescence L2 to be evened out when emitted from the light exit surface 27b. This arrangement can prevent color unevenness in illumination light.

The light exit surface 27b can, for example, have a circular shape with a size of 1 mm φ. The light exit surface 27b is seen as a light source when the light-emitting device 114 is seen from the outside. Specifically, while it is the fluorescent section 8 in the light-emitting unit 3a that actually emits light, the light exit surface 27b is seen as emitting light when the light-emitting device 114 is seen from the outside. Thus, selecting the size and shape of the light exit surface 27b makes it possible to freely set the size and shape of a light source that is seen as such when the light-emitting device 114 is seen from the outside.

The reflecting/diffusing plate 27 includes, as integrated with each other, (i) a diffusing plate 28 having a light diffusing function and (ii) a multilayer film coating 72 having a wavelength selecting function. This arrangement allows the light-emitting unit 3a to have fewer parts. Further, the light-emitting unit 3a having fewer parts allows, for example, (i) the light-emitting device 114 to be assembled through fewer steps and (ii) alignment to be performed at fewer positions.

Next, application examples of the light-emitting device 114 in accordance with Embodiment 7 will be described with reference to FIGS. 26 and 27.

FIG. 26 is a cross-sectional view illustrating the configuration of a headlamp 201 including the light-emitting device 114. As illustrated in FIG. 26, the headlamp (vehicle headlight, illumination device) 201 includes the light-emitting device 114 and a projection (light casting) lens (light casting section) 10 for casting fluorescence L2 transmitted by the reflecting/diffusing plate 27.

The headlamp 201 is arranged such that the reflecting/diffusing plate 27 diffuses fluorescence L2, generated by the fluorescent section 8, to even out the fluorescence L2 to be released to the outside of the headlamp 201. This arrangement can prevent color unevenness. The headlamp 201 consequently has improved efficiency of light use, and can prevent color unevenness in illumination light.

The projection lens 10 may be a lens that enlarges light distributed at the light exit surface 27b, as a reference surface, of the reflecting/diffusing plate 27 and projects the light thus enlarged. The projection lens 10, with this arrangement, enlarges light distributed at the light exit surface 27b of the reflecting/diffusing plate 27 and projects the enlarged light. This allows the headlamp 201 to (i) enlarge a light source image corresponding to, for example, the shape and size of the light exit surface 27b and (ii) cast light corresponding to the enlarged image.

With the above arrangement, the headlamp 201 includes, between the light exit surface 27b of the reflecting/diffusing plate 27 (which light exit surface 27b functions as an apparent light source) and the projection lens 10, no component that blocks white fluorescence L2 released from the light exit surface 27b. This allows fluorescence L2 released in Lambertian distribution from the light exit surface 27b to enter the projection lens 10 or the like without losses and to be cast through the projection lens 10 or the like.

The headlamp 201 is described herein as including, for example, a projection lens 10 for casting light as a light distribution controlling member. The headlamp 201, however, does not necessarily include a lens intended for light casting. The headlamp 201 may, for instance, suitably combine the light-emitting device 114 with, instead of the projection lens 10, (i) a lens for another function, (ii) a lens group that is a combination of a plurality of lenses, or (iii) a combination of a lens and a reflector.

The headlamp 201 is preferably arranged to include a lens, a reflector and the like designed to be able to enlarge and project an image of light formed on the light exit surface 27b, as the apparent light source, of the reflecting/diffusing plate 27. This arrangement makes it possible to suitably cast a light source image corresponding to light distributed at the light exit surface 27b.

FIG. 27 is a cross-sectional view illustrating another application example of the light-emitting device 114. As illustrated in FIG. 27, this application example, that is, a headlamp (vehicle headlight, illumination device) 202, includes the light-emitting device 114, a metal base 14, and a reflector (light casting section) 15.

The headlamp 202, which includes a reflecting/diffusing plate 27 to diffuse fluorescence L2 generated by the fluorescent section 8, allows the reflector 15 to even out fluorescence L2 to be cast to the outside of the headlamp 202. This arrangement can prevent color unevenness.

As described above, there has been a problem of decreased efficiency of light use with the conventional arrangement of placing an excitation light source 301 and a collimator lens 305 between a light-emitting section 308 and a convex lens 310 as illustrated in FIG. 35.

The light-emitting device 114, in view of the above problem, includes (i) a fluorescent section 8 for emitting fluorescence L2 upon irradiation with a laser beam L1 and (ii) a reflecting/diffusing plate 27 located so as to face the fluorescent section 8. The reflecting/diffusing plate 27 (i) reflects, toward the fluorescent section 8, the laser beam L1 emitted from the laser element 1 and (ii) transmits and diffuses fluorescence L2 generated by the fluorescent section 8 upon irradiation with the laser beam L1 reflected. In other words, the reflecting/diffusing plate 27 has a selective transmission property that causes the reflecting/diffusing plate 27 to reflect a laser beam L1 emitted from the laser element 1 and that causes fluorescence L2 generated by the fluorescent section 8 to be transmitted by the reflecting/diffusing plate 27.

With the above arrangement, the reflecting/diffusing plate 27 reflecting the laser beam L1, emitted from the laser element 1, toward the fluorescent section 8 allows the fluorescent section 8 to be irradiated with the laser beam L1 for light emission. The above arrangement thus eliminates the need to place, between the fluorescent section 8 and the reflecting/diffusing plate 27, a component such as an excitation light source for irradiating the fluorescent section 8 with excitation light.

The above arrangement prevents a component such as an excitation light source from blocking a portion of fluorescence L2 generated by the fluorescent section 8, and consequently allows efficient use of fluorescence L2.

Further, the arrangement of exciting a light-emitting section 408, which contains particles of a fluorescent material, to produce illumination light is problematic in that the light-emitting section 408, when excited, emits light in a distribution having color unevenness. Such color unevenness in a distribution of light emitted by the light-emitting section 408 is presumably due, for example, to the following: In a case where the light-emitting section 408 contains particles of a plurality of kinds of fluorescent materials that emit light of different colors, particles of a fluorescent material that emits light of a particular color may be aggregated, with the result that particles of a fluorescent material in the light-emitting section 408 have an uneven distribution. In particular, in a case where the light-emitting section 408 is small in size, particles of a fluorescent material have a size that cannot be ignored relative to the size of the light-emitting section 408 as a whole. This causes the distribution of particles of a fluorescent material to be observed directly as a color distribution of the light-emitting section 408.

The light-emitting device 114, in view of the above problem, includes a reflecting/diffusing plate 27 to diffuse fluorescence L2, generated by the fluorescent section 8, to even out the fluorescence L2 to be released to the outside of the light-emitting device 114. This arrangement can prevent color unevenness. The above arrangement can, in particular, suitably prevent color unevenness in the fluorescent section 8 from occurring in a case involving the use of a fluorescent section 8 containing a mixture of particles of a plurality of fluorescent materials that emit light of different colors.

The light-emitting device 114 of Embodiment 7 consequently has improved efficiency of light use and prevents color unevenness.

Since the light exit surface 27b has the function of diffusing fluorescence L2, the light exit surface 27b is, as mentioned above, seen as an apparent light source when the light-emitting device 114 is seen from the outside. This allows other optical elements to be optically designed on the assumption that while it is the fluorescent section 8 in the light-emitting unit 3a that actually emits light, the light exit surface 27b is seen as emitting light when the light-emitting device 114 is seen from the outside.

Thus, selecting the size and shape of the light exit surface 27b makes it possible to freely set the size and shape of a light source that is seen as such when the light-emitting device 114 is seen from the outside.

The following will describe another embodiment of the present invention with reference to FIGS. 28 through 31. In Embodiment 8, a light-emitting device will be described which includes a reflecting/diffusing plate having a light exit surface in a shape corresponding to a cutoff line of a low beam for an automobile.

For convenience of explanation, members of Embodiment 8 that are identical in function to their respective corresponding members described in Embodiments 1 to 7 are each assigned a common reference numeral, and are not described here.

First, a configuration of a light-emitting device 115 in accordance with Embodiment 8 will be described with reference to FIG. 28. The light-emitting device 115 emits, as illumination light, fluorescence (emission light) L2 that is generated by illuminating the fluorescent section 8, which contains particles of a fluorescent material, with a laser beam L1.

Figure 28:
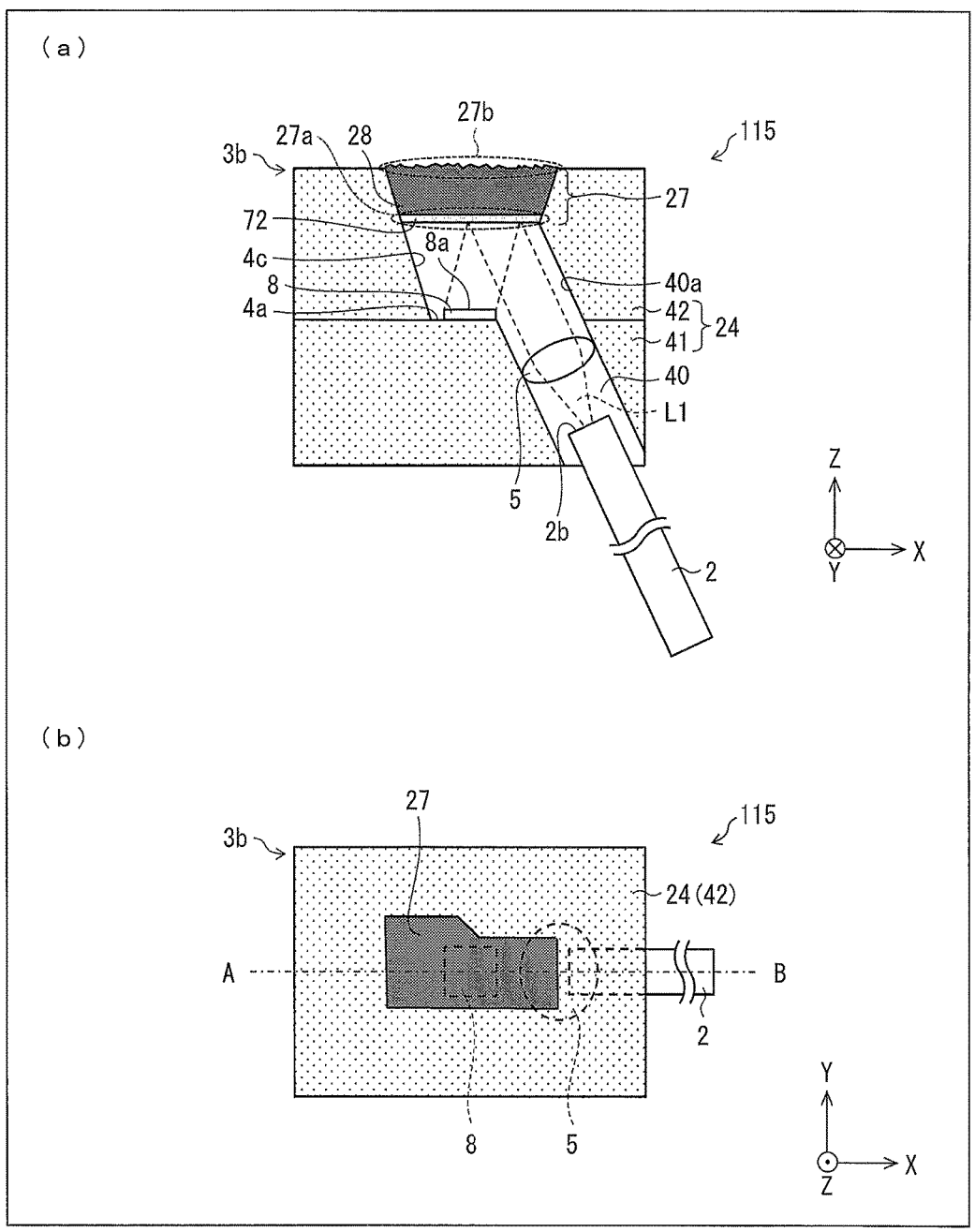
FIG. 28 (a) is a cross-sectional view illustrating the configuration of a light-emitting device in accordance with Embodiment 8, and FIG. 28 (b) is a top view illustrating the light-emitting device illustrated in FIG. 28 (a).

(a) of FIG. 28 is a cross-sectional view illustrating the configuration of the light-emitting device 115. (b) of FIG. 28 is a top view illustrating the light-emitting device 115 of (a) of FIG. 28. (a) of FIG. 28 is a cross-sectional view illustrating the light-emitting device 115 of (b) of FIG. 28 taken along line A-B in (b) of FIG. 28. (a) of FIG. 28 illustrates the configuration of a central portion of the light-emitting device 115 in a cross section taken in the Z axis direction.

As illustrated in (a) of FIG. 28, the light-emitting device 115 includes a laser element 1 (not shown), an optical fiber 2, and a light-emitting unit 3b. The light-emitting device 115 is configured such that the laser element 1 and the light-emitting unit 3b are connected to each other via the optical fiber 2.

The optical fiber 2 is a light guiding section to guide, to the light-emitting unit 3b, a laser beam L1 emitted from the laser element 1. The optical fiber 2 of Embodiment 8 is a multimode fiber that includes a core having a square cross section measuring 300 µm per side.

The light-emitting unit 3b intends to generate fluorescence by irradiation of the fluorescent section 8, which contains particles of a fluorescent material, with a laser beam L1 emitted from the laser element 1 and then release the fluorescence thus generated. The light-emitting unit 3b includes: a casing (placement section) 24; a lens 5; a reflecting/diffusing plate (optical plate) 27; and a fluorescent section (light-emitting section) 8.

The casing 24 is a rectangular member for containing the fluorescent section 8. The casing 24 includes (i) a lower casing part (placement section) 41 having a placement surface 4a on which the fluorescent section 8 is placed and (ii) an upper casing part 42 for holding the reflecting/diffusing plate 27 in such a position that the reflecting/diffusing plate 27 faces the laser beam irradiation surface 8a of the fluorescent section 8.

The casing 24 of Embodiment 8 is arranged to have an inner wall 4c (that is, the inner surface of the upper casing part 42) surrounding the fluorescent section 8 and the reflecting/diffusing plate 27, the inner wall 4c being sloped to define a space inside that is wider on the side of the reflecting/diffusing plate 27 than on the side of the fluorescent section 8. The sloped inner wall 4c preferably has a reflective surface. This arrangement allows fluorescence L2 generated by the fluorescent section 8 to be reflected by the reflective surface to be directed to the reflecting/diffusing plate 27.

The lower casing part 41 includes an internal passage 40 having an open end provided in a region of the placement surface 4a in which region the fluorescent section 8 is absent. In Embodiment 8, the internal passage 40 has a starting end which is open at a bottom surface of the lower casing part 41. The internal passage 40 extends obliquely in a straight line from that starting end through to the placement surface 4a. The optical fiber 2 is inserted from below the casing 24 to have an optical axis that coincides with the axis direction of the internal passage 40. This configuration allows a laser beam L1 emitted from the emission end 2b of the optical fiber 2 to (i) enter the internal passage 40 from the side of its starting end and then (ii) exit from the opening 40a toward the reflecting/diffusing plate 27.

As described above, the light-emitting unit 3b does not include a mirror 6 for reflecting a laser beam L1 toward the reflecting/diffusing plate 27. The light-emitting unit 3b thus has a simplified structure, with the result of a reduced production cost.

The reflecting/diffusing plate 27 intends to reflect, toward the fluorescent section 8, a laser beam L1 emitted from the laser element 1 and to transmit and diffuse fluorescence L2 generated by the fluorescent section 8 upon irradiation with the laser beam L1 reflected. In Embodiment 8, the reflecting/diffusing plate 27 is in the shape of a rectangle with four sides each having a length of approximately 1 to 2 mm, and is located so as to face the laser beam irradiation surface 8a of the fluorescent section 8. The reflecting/diffusing plate 27 is held at its edge by the sloped inner wall 4c of the upper casing part 42.

In other words, Embodiment 8 is arranged such that the reflecting/diffusing plate 27 (diffusing plate 28) is in the shape of an inverted trapezoid in the cross section taken along A-B and that the inner wall 4c of the casing 24, which inner wall 4c holds the reflecting/diffusing plate 27, defines a space inside that is wider toward the emission opening. The inner wall 4c of the casing 24, which inner wall 4c has the above shape, (i) reflects fluorescence L2 (white light) becoming wider inside the diffusing plate 28 in the lateral direction of (a) of FIG. 28 and thus (ii) causes the fluorescence L2 to travel toward the emission opening. This arrangement advantageously improves the efficiency of extracting white light.

In Embodiment 8, the reflecting/diffusing plate 27 has a light exit surface 27b in a shape corresponding to a cutoff line of a low beam for an automobile. As described above, the light exit surface 27b of the reflecting/diffusing plate 27 is seen as a light source when the light-emitting device 115 is seen from the outside. Thus, the size and shape of the light exit surface 27b of the reflecting/diffusing plate 27 correspond to the size and shape of an apparent light source of the light-emitting device 115. Stated differently, regardless of the size and shape of the fluorescent section 8, selecting the size and shape of the reflecting/diffusing plate 27 makes it possible to freely produce a light source (that is, an apparent light source) having a desired size and shape.

Next, application examples of the light-emitting device 115 in accordance with Embodiment 8 will be described with reference to FIGS. 29 and 30.

Figure 29:
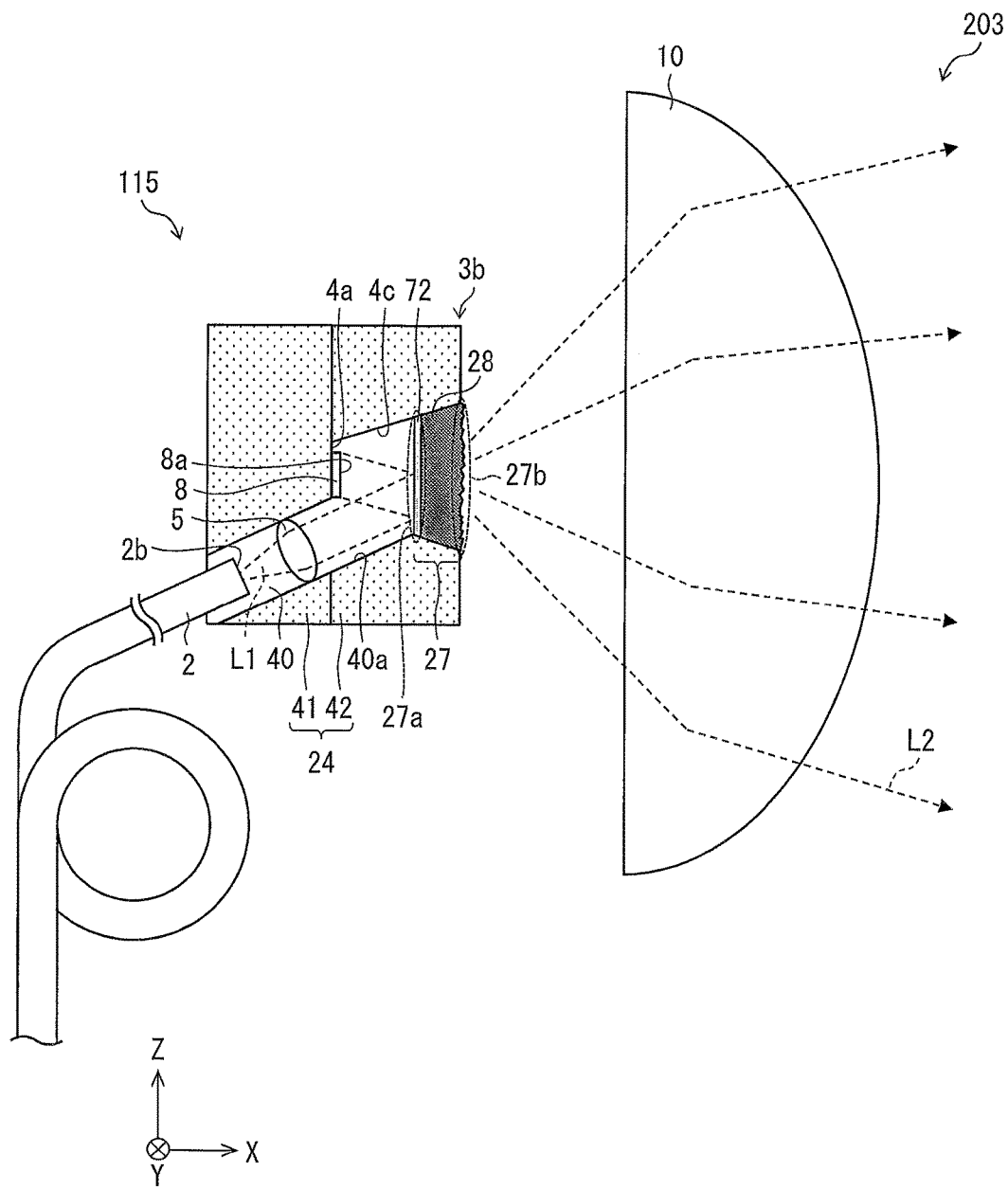
FIG. 29 is a cross-sectional view illustrating an application example of the light-emitting device illustrated in FIG. 28.

FIG. 29 is a cross-sectional view illustrating an application example of the light-emitting device 115. As illustrated in FIG. 29, this application example, that is, a headlamp (vehicle headlight, illumination device) 203 includes the light-emitting device 115 and a projection lens for casting fluorescence L2 transmitted by the reflecting/diffusing plate 27.

The light-emitting device 115, as described above, includes a reflecting/diffusing plate 27 having a light exit surface 27b in a shape corresponding to a cutoff line of a low beam for an automobile. Thus, the light-emitting device 115 can use, with the light exit surface 27b as a reference surface, the projection lens 10 to enlarge and project an image formed by fluorescence L2 emitted from the light exit surface 27b (that is, use the projection lens 10 to enlarge and project an image formed on the light exit surface 27b as an apparent light source) to produce a light distribution pattern corresponding to a cutoff line of a low beam for an automobile. An automobile typically uses a light blocking plate to form a cutoff line of a low beam. The headlamp 203, in contrast, eliminates the need to include such a light blocking plate, and thus makes it possible to effectively use the luminous flux of a light source.

Figure 30:
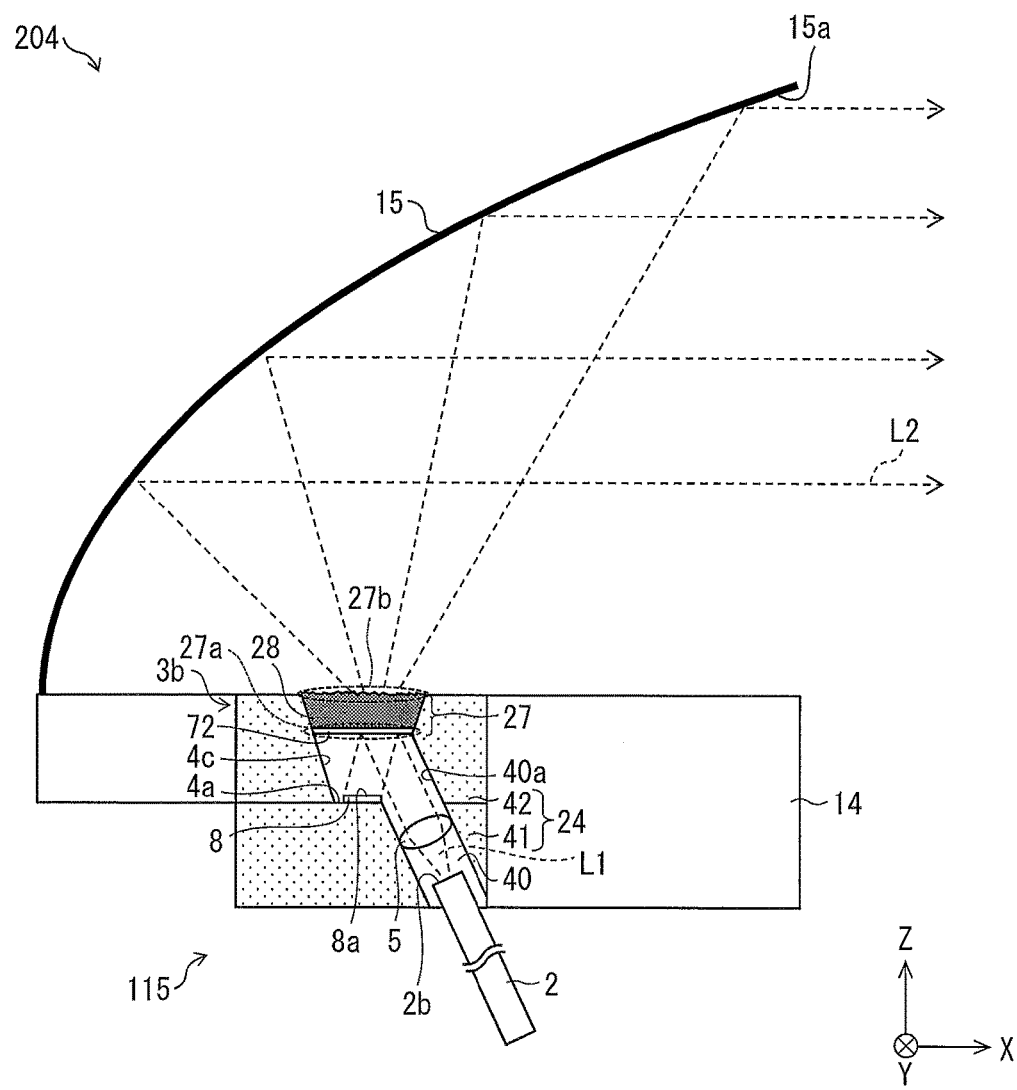
FIG. 30 is a cross-sectional view illustrating another application example of the light-emitting device illustrated in FIG. 28.

FIG. 30 is a cross-sectional view illustrating another application example of the light-emitting device 115. As illustrated in FIG. 30, this application example, that is, a headlamp (vehicle headlight, illumination device) 204, includes the light-emitting device 115, a metal base 14, and a reflector 15.

The headlamp 204 uses the reflector 15 to enlarge and project an image formed by fluorescence L2 emitted from the light exit surface 27b having a shape corresponding to a cutoff line of a low beam for an automobile, and can thus produce a light distribution pattern corresponding to a cutoff line of a low beam for an automobile. This arrangement eliminates the need to include a light blocking plate for forming a cutoff line, and thus makes it possible to effectively use the luminous flux of a light source.

As described above, the light-emitting device 115 includes a reflecting/diffusing plate 27 having a light exit surface 27b in a shape corresponding to a cutoff line of a low beam for an automobile. Thus, the light-emitting device 115 can, without the use of a light blocking plate for forming a cutoff line, enlarge and project an image formed by fluorescence L2 emitted from the light exit surface 27b, and can produce a light distribution pattern corresponding to a cutoff line of a low beam for an automobile.

The light-emitting device 115 of Embodiment 8 consequently allows the headlamps 203 and 204 to have further improved efficiency of light use.

In addition, Embodiment 8, which does not need to include a light blocking plate for forming a cutoff line, allows the headlamps 203 and 204 to have fewer parts, thereby allowing (i) the headlamps 203 and 204 to be assembled through fewer steps and (ii) alignment to be performed at fewer positions.

Since the light exit surface 27b has the function of diffusing fluorescence L2, the light exit surface 27b is, as mentioned above, seen as a light source when the light-emitting device 115 is seen from the outside. This allows other optical elements to be optically designed on the assumption that while it is the fluorescent section 8 in the light-emitting unit 3b that actually emits light, the light exit surface 27b is seen as emitting light when the light-emitting device 115 is seen from the outside.

Thus, selecting the size and shape of the light exit surface 27b makes it possible to freely set the size and shape of a light source that is seen as such when the light-emitting device 115 is seen from the outside.

Figure 31:
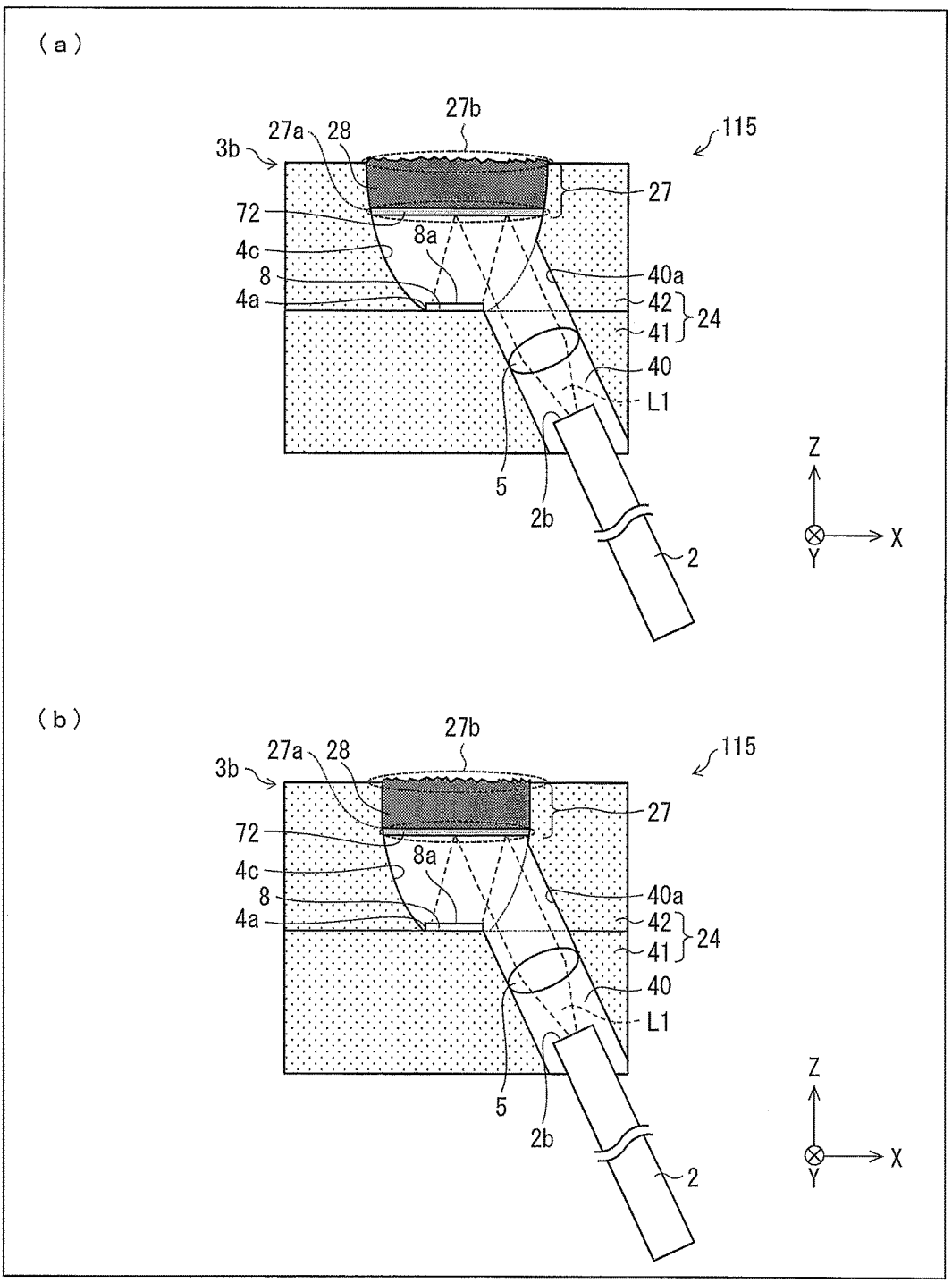
FIGS. 31 (a) and (b) are cross-sectional views each illustrating a modification example of the inside structure of a casing included in the light-emitting device illustrated in FIG. 28.

The following will describe modification examples of the light-emitting device 115 of Embodiment 8 with reference to FIG. 31. (a) and (b) of FIG. 31 are cross-sectional views each illustrating a modification example of the inside structure of the casing 4 included in the light-emitting device 115.

(a) of FIG. 28 illustrates a configuration in which the inner wall 4c of the casing 24 has a cross section that is sloped linearly (in a straight line) to define a space inside that is wider on the side of the reflecting/diffusing plate 27 than on the side of the fluorescent section 8. The casing 24 may alternatively be shaped as illustrated in (a) of FIG. 31 to have an inner wall 4c that is sloped in a curve. In particular, in a case where the inner wall 4c has a compound paraboloidal surface that connects (i) an end of the fluorescent section 8 which end is in contact with the inner wall 4c with (ii) an end of the reflecting/diffusing plate 27 which end is in contact with the inner wall 4c, the inner wall 4c reflects fluorescence L2, generated by the fluorescent section 8, so that the light beam enters the reflecting/diffusing plate 27 at an high angle of incidence. This arrangement reduces the amount of light that fails to pass through the reflecting/diffusing plate 27 to end up being a loss, and advantageously further improves the efficiency of light use.

The casing 24 may alternatively be shaped as illustrated in (b) of FIG. 31 to have an inner wall 4c that is (i) sloped in a curve or straight line only at a portion in no contact with an end of the reflecting/diffusing plate 27 (that is, a portion where the reflecting/diffusing plate 27 is absent) and that is (ii) not sloped at a portion in contact with an end of the reflecting/diffusing plate 27 (that is, a portion where the reflecting/diffusing plate 27 is present). This arrangement allows the reflecting/diffusing plate 27 to fit in the casing 24 with high accuracy. The inner wall 4c is not limited to the above in arrangement, and may be shaped in any of various manners.

Figure 32:
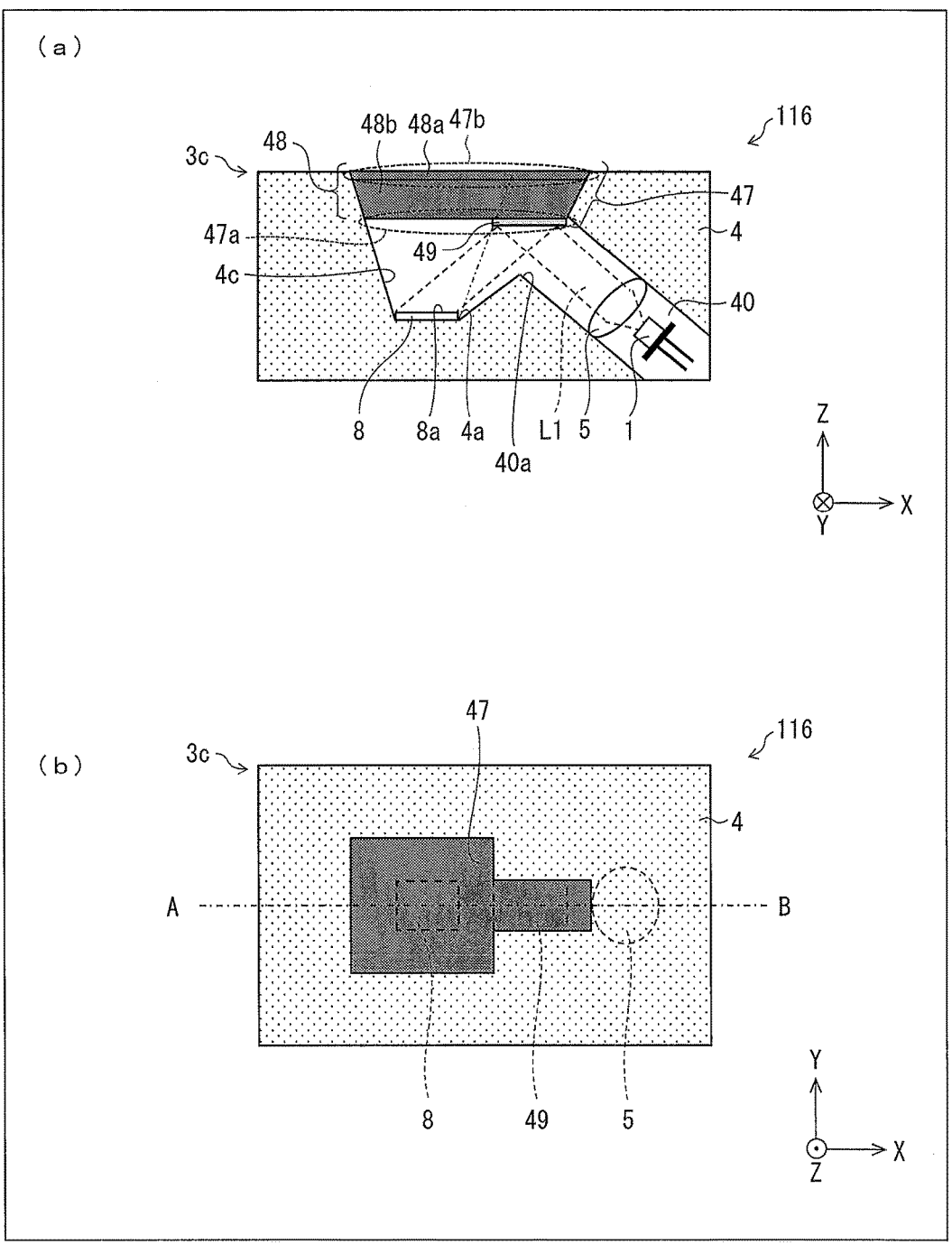
FIG. 32 (a) is a cross-sectional view illustrating the configuration of a light-emitting device in accordance with Embodiment 9, and FIG. 32 (b) is a top view illustrating the configuration of the light-emitting device illustrated in FIG. 32 (a).

The following will describe another embodiment of the present invention with reference to FIG. 32. In Embodiment 9, a light-emitting device will be described which includes, as an optical plate, a reflecting/diffusing plate including a diffusing plate and a vapor deposition mirror.

For convenience of explanation, members of Embodiment 9 that are identical in function to their respective corresponding members described in Embodiments 1 to 8 are each assigned a common reference numeral, and are not described here.

First, a configuration of a light-emitting device 116 in accordance with Embodiment 9 will be described with reference to FIG. 32. The light-emitting device 116 emits, as illumination light, fluorescence L2 that is generated by illuminating the fluorescent section 8, which contains particles of a fluorescent material, with a laser beam L1.

(a) of FIG. 32 is a cross-sectional view illustrating the configuration of the light-emitting device 116. (b) of FIG. 32 is a top view illustrating the light-emitting device 116 of (a) of FIG. 32. (a) of FIG. 32 is a cross-sectional view illustrating the light-emitting device 116 of (b) of FIG. 32 taken along line A-B in (b) of FIG. 32. (a) of FIG. 32 illustrates the configuration of a central portion of the light-emitting device 116 in a cross section taken in the Z axis direction.

As illustrated in (a) of FIG. 32, the light-emitting device 116 includes a laser element 1 and a light-emitting unit 3c. The light-emitting device 116 does not include an optical fiber 2, and is configured such that a laser beam L1 emitted from the laser element 1 directly enters the light-emitting unit 3c. (a) of FIG. 32 omits a member for fixing the laser element 1 and a member for dissipating heat, and illustrates the position of the laser element 1 only.

The light-emitting unit 3c intends to generate fluorescence by irradiation of the fluorescent section 8, which contains particles of a fluorescent material, with a laser beam L1 emitted from the laser element 1 and then release the fluorescence thus generated. The light-emitting unit 3c includes: a casing 4; a lens 5; a reflecting/diffusing plate (optical plate) 47; and a fluorescent section (light-emitting section) 8.

The casing 4 contains the fluorescent section 8 and has a placement surface 4a, provided therein, for placing the fluorescent section 8. The internal passage 40 has a starting end which is open at a corner of the casing 4 which corner is of a bottom surface and side surface of the casing 4. The internal passage 40 extends obliquely in a straight line from the starting end through to the placement surface 4a. The laser element 1 is inserted in the casing 4 at the corner to have an optical axis that coincides with the axis direction of the internal passage 40. This configuration allows a laser beam L1 emitted from the laser element 1 to (i) enter the internal passage 40 from the side of its starting end and then (ii) exit from the opening 40a toward the reflecting/diffusing plate 47.

As described above, the light-emitting unit 3c does not include (i) an optical fiber 2 for guiding, to the light-emitting unit 3c, a laser beam L1 emitted from the laser element 1 or (ii) a mirror 6 for reflecting the laser beam L1 toward the reflecting/diffusing plate 47. The light-emitting unit 3c thus has a simplified structure, with the result of a further reduced production cost.

The reflecting/diffusing plate 47 intends to reflect, toward the fluorescent section 8, a laser beam L1 emitted from the laser element 1 and to transmit and diffuse light generated by the fluorescent section 8 upon irradiation with the laser beam L1 reflected.

In Embodiment 9, the reflecting/diffusing plate 47 includes a diffusing plate 48 and a vapor deposition mirror 49.

The diffusing plate 48 intends to transmit and diffuse fluorescence L2 generated by the fluorescent section 8. In Embodiment 9, the diffusing plate 48 includes a diffusion film 48*a* and a glass substrate 48*b*.

The diffusion film 48*a* intends to diffuse fluorescence L2 generated by the fluorescent section 8. The diffusion film 48*a* is provided on a surface of the glass substrate 48*b* which surface is opposite to a surface facing the fluorescent section 8, and diffuses fluorescence L2 transmitted by the glass substrate 48*b*. Suitable examples of the diffusion film 48*a* include an opaque white film. The diffusion film 48*a* is, however, not particularly limited as long as it is capable of diffusing fluorescence L2.

The glass substrate 48*b* is a plate-shaped light transmission member and serving as a base material of the diffusing plate 48. The glass substrate 48*b* transmits fluorescence L2 generated by the fluorescent section 8. Suitable examples of the glass substrate 48*b* include an opal glass substrate. The glass substrate 48*b* is, however, not particularly limited as long as it has high transmittance for fluorescence L2.

The reflecting/diffusing plate 47 (diffusing plate 48) is placed relative to the casing 4 in such a position that the diffusion film 48*a* has its outermost surface at the height of a upper surface of the casing 4. The diffusion film 48*a* radiates white light in Lambertian distribution from a surface thereof. The diffusion film 48*a* having its outermost surface at the height of the upper surface of the casing 4 produces such advantages as improving frontal luminance and facilitating control of light radiated at a sharp angle of radiation.

The vapor deposition mirror 49 intends to reflect a laser beam L1, emitted from the laser element 1, to irradiate the fluorescent section 8 with the laser beam L1. The vapor deposition mirror 49 is provided at a portion of a surface of the diffusing plate 48 which surface faces the fluorescent section 8. Fluorescence L2 generated by the fluorescent section 8 passes through a region of the diffusing plate 48 in which region the vapor deposition mirror 49 is absent. Thus, the region in which the vapor deposition mirror 49 is absent has a shape corresponding to the shape (in Embodiment 9, a square) of an apparent light source of the light-emitting device 116.

The vapor deposition mirror 49 is, for example, a thin aluminum film that reflects light having a wavelength of 405 nm. The vapor deposition mirror 49 may be formed by (i) depositing aluminum on the diffusing plate 48 by vapor deposition or by (ii) attaching to the diffusing plate 48 a member such as a member having a shape of a thin plate and having a surface provided with aluminum.

Embodiment 9, which uses aluminum, may alternatively use a different material as long as the material is capable of reflecting light having a wavelength of 405 nm.

The reflecting/diffusing plate 47, which has the above arrangement, is located so as to face the laser beam irradiation surface 8*a* of the fluorescent section 8 and is held at its edge by the inner surface of the casing 4. The reflecting/diffusing plate 47 is positioned so that the region in which the vapor deposition mirror 49 is absent is placed at such a position as to face the laser beam irradiation surface 8*a* of the fluorescent section 8.

The fluorescent section 8 emits fluorescence L2 upon irradiation with a laser beam L1. In Embodiment 9, the fluorescent section 8 contains particles of two kinds of fluorescent materials, one emitting yellow light and the other emitting blue light, at such an appropriate ratio as to produce white light upon irradiation with a laser beam L1 having a wavelength of 405 nm.

As described above, the light-emitting device 116 includes a reflecting/diffusing plate 47 including a diffusing plate 48 and a vapor deposition mirror 49 formed on a surface of the diffusing plate 48.

The above configuration allows the vapor deposition mirror 49 of the reflecting/diffusing plate 47 to reflect a laser beam L1, emitted from the laser element 1, toward the fluorescent section 8, which consequently makes it possible to irradiate the fluorescent section 8 with a laser beam L1 for light emission.

In addition, the light-emitting device 116 uses the diffusion film 48*a* of the reflecting/diffusing plate 47 to diffuse fluorescence L2 generated by the fluorescent section 8. The light-emitting device 116 can thus even out fluorescence L2 to be released to the outside of the light-emitting device 116. This arrangement can prevent color unevenness.

The light-emitting device 116 of Embodiment 9 consequently has improved efficiency of light use and prevents color unevenness.

Since the light exit surface 47*b* has the function of diffusing fluorescence L2, the light exit surface 47*b* is, as mentioned above, seen as an apparent light source when the light-emitting device 116 is seen from the outside. This allows other optical elements to be optically designed on the assumption that while it is the fluorescent section 8 in the light-emitting unit 3*c* that actually emits light, the portion (square portion) of the light exit surface 47*b* at which portion light is not blocked by the vapor deposition mirror 49 is seen as emitting light when the light-emitting device 116 is seen from the outside.

Thus, selecting the size and shape of the light exit surface 47*b* makes it possible to freely set the size and shape of a light source that is seen as such when the light-emitting device 116 is seen from the outside.

The light-emitting device 116 is particularly preferably used in a configuration with an optical system installed which uses the outermost portion (light exit surface 47*b*) of the diffusion film 48*a* as an apparent light source to, for example, cast light to the outside of the optical system as in the configurations illustrated in FIGS. 26, 27, 29, and 30.

Figure 33:
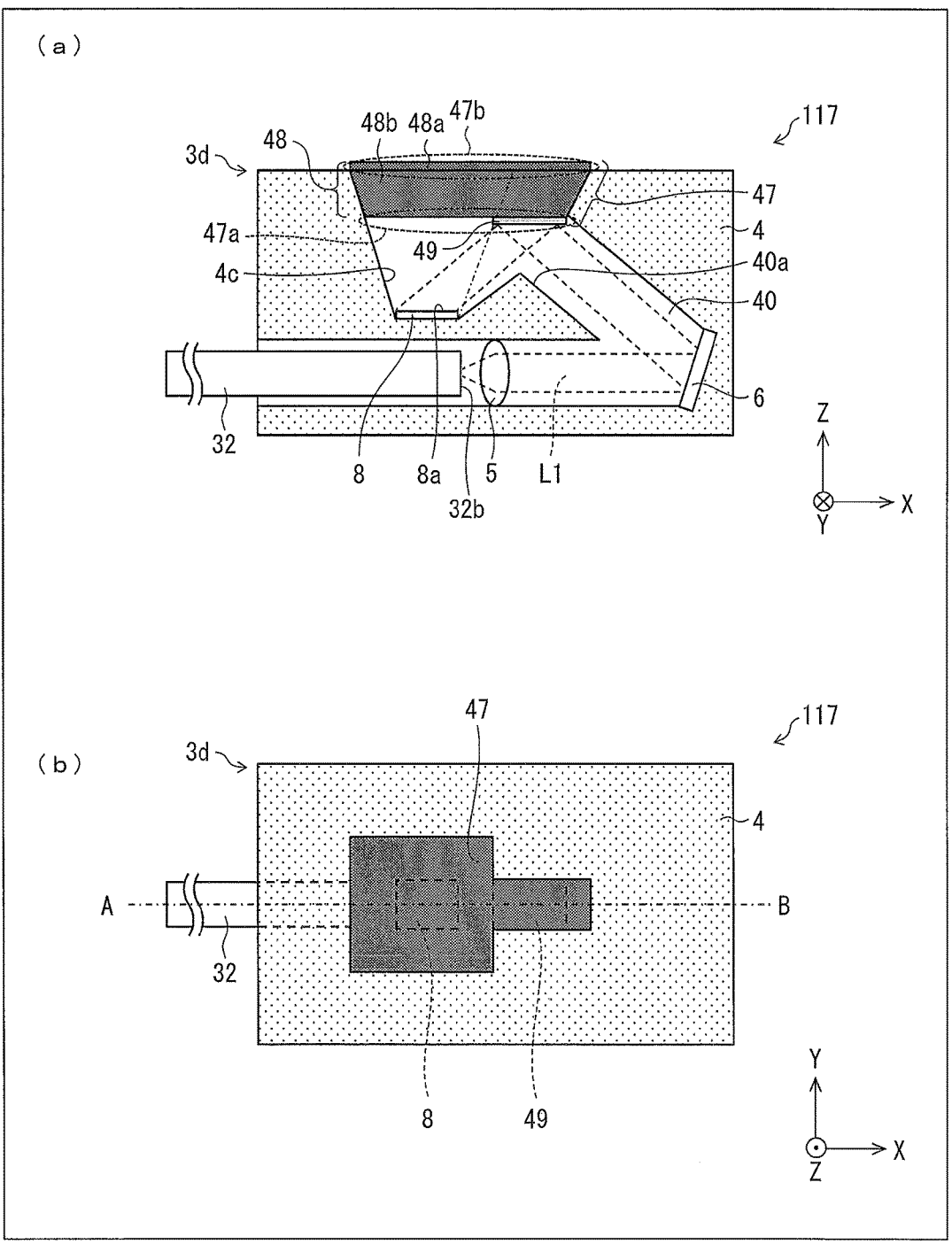
FIG. 33 (a) is a cross-sectional view illustrating the configuration of a light-emitting device in accordance with Embodiment 10, and FIG. 33 (b) is a top view illustrating the configuration of the light-emitting device illustrated in FIG. 33 (a).

The following will describe another embodiment of the present invention with reference to FIG. 33. In Embodiment 10, a light-emitting device will be described which includes, as a light guiding section, a rod lens.

For convenience of explanation, members of Embodiment 10 that are identical in function to their respective corresponding members described in Embodiments 1 to 9 are each assigned a common reference numeral, and are not described here.

First, a configuration of a light-emitting device 117 in accordance with Embodiment 10 will be described. The light-emitting device 117 emits, as illumination light, a mixture of (i) a laser beam (emission light) L1 and (ii) fluorescence (emission light) L2 that is generated by illuminating the fluorescent section 8, which contains particles of a fluorescent material, with the laser beam L1.

(a) of FIG. 33 is a cross-sectional view illustrating the configuration of the light-emitting device 117. (b) of FIG. 33 is a top view illustrating the light-emitting device 117 of (a) of FIG. 33. (a) of FIG. 33 is a cross-sectional view illustrating the light-emitting device 117 of (b) of FIG. 33 taken along line A-B in (b) of FIG. 33. (a) of FIG. 33 illustrates the configuration of a central portion of the light-emitting device 117 in a cross section taken in the Z axis direction.

As illustrated in (a) of FIG. 33, the light-emitting device 117 includes a laser element 1 (not illustrated) and a light-emitting unit 3d. The light-emitting device 117 is configured such that the laser element 1 and the light-emitting unit 3d are connected to each other via the rod lens (light guiding section) 32.

The laser element 1 is a light emitting element functioning as an excitation light source to emit a laser beam L1. In Embodiment 10, the laser element 1 emits, with 5 W power, a blue laser beam having a wavelength of 450 nm. The laser beam L1 emitted from the laser element 1 is guided to the inside of the light-emitting unit 3d by passing through the rod lens 32.

The rod lens 32 is a light guiding section to guide, to the light-emitting unit 3d, the laser beam L1 emitted from the laser element 1. In Embodiment 10, the rod lens 32 has a square cross section and is made from, for example, a glass transparent material measuring 1 mm per side. Note, however, that the shape of the rod lens 32 and the material for the rod lens 32 are not limited to the above ones.

In the casing 4, the internal passage 40 has a starting end which is open at a side surface of the casing 4, and the rod lens 32 is inserted into the internal passage 40 from the side surface of the casing 4, which is rectangular in shape, so that an emission end 32b of the rod lens 32 is fixed. In the rod lens 32, the laser beam L1 travels while being repeatedly reflected inside the rod lens 32. As such, the laser beam L1 is guided by passing through the rod lens 32, with the result that a resultant laser beam L1 to be emitted from the emission end 32b of the rod lens 32 has a continuous, smooth, top hat type intensity distribution.

The light-emitting unit 3d intends to generate fluorescence L2 by irradiation of the fluorescent section 8, which contains particles of a fluorescent material, with a laser beam L1 emitted from the emission end 32b of the rod lens 32 and then release, as illumination light, a mixture of the laser beam L1 and the fluorescence L2 thus generated. The light-emitting unit 3d includes: the casing 4; a lens 5; a mirror 6; a reflecting/diffusing plate 47; and the fluorescent section 8.

In Embodiment 10, a reflecting/diffusing plate 47 (diffusing plate 48) is placed in such a position that the outermost surface of the diffusion film 48a is higher than the upper surface of the casing 4. Placing the reflecting/diffusing plate 47 as above enables widening a radiation angle distribution of white light emitted from the surface of the diffusion film 48a. In addition, varying the diffusion film 48a in its thickness and/or surface profile enables control of the radiation angle distribution.

The widest radiation angle distribution is obtained when the height of the surface of the diffusion film 48a is equal to the height of the surface of the casing 4. In this case, the diffusion film 48a radiates white light in Lambertian distribution.

The fluorescent section 8 emits fluorescence L2 upon irradiation with the laser beam L1. In Embodiment 10, the fluorescent section 8 contains one kind of fluorescent material that emits in yellow color only, so that the fluorescent section 8 provides white light upon irradiation with the laser beam L1 having a wavelength of 450 nm.

As described above, the light-emitting device 117 includes, as a light guiding section, the rod lens 32 to guide, to the light-emitting unit 3d, the laser beam L1 emitted from the laser element 1. In the rod lens 32, the laser beam L1 travels while being repeatedly reflected inside the rod lens 32, and the laser beam L1 is then emitted, from the emission end 32b of the rod lens 32, in a form having a continuous, smooth, top hat type intensity distribution.

As such, according to the arrangement in Embodiment 10, it is possible to reduce deterioration of the fluorescent section 8 and decreased efficiency in light emission of the fluorescent section 8, while achieving a high-power laser beam L1. In addition, local excitation of only a part of the fluorescent section 8 does not occur. This makes it possible to suitably realize a light-emitting device 117 that is capable of reducing the occurrence of uneven luminance of the fluorescence L2 to be emitted from the fluorescent section 8.

Further, the light-emitting device 117 of Embodiment has high luminance as it is capable of emitting, as illumination light, a mixture of a laser beam L1 and fluorescence L2 generated by irradiating the fluorescent section 8, which contains particles of a fluorescent material, with the laser beam L1.

Since the light exit surface 47b has the function of diffusing a laser beam L1 and fluorescence L2, the light exit surface 47b is, as mentioned above, seen as an apparent light source when the light-emitting device 117 is seen from the outside. This allows other optical elements to be optically designed on the assumption that while it is the fluorescent section 8 in the light-emitting unit 3d that actually emits light, the portion (square portion) of the light exit surface 47b at which portion light is not blocked by the vapor deposition mirror 49 is seen as emitting light when the light-emitting device 117 is seen from the outside.

Thus, selecting the size and shape of the light exit surface 47b makes it possible to freely set the size and shape of an apparent light source that is seen as such when the light-emitting device 117 is seen from the outside.

The light-emitting device 117 is particularly preferably used in a configuration with an optical system installed which uses the outermost portion (light exit surface 47b) of the diffusion film 48a as an apparent light source to, for example, cast light to the outside of the optical system as in the configurations illustrated in FIGS. 26, 27, 29, and 30.

Figure 34:
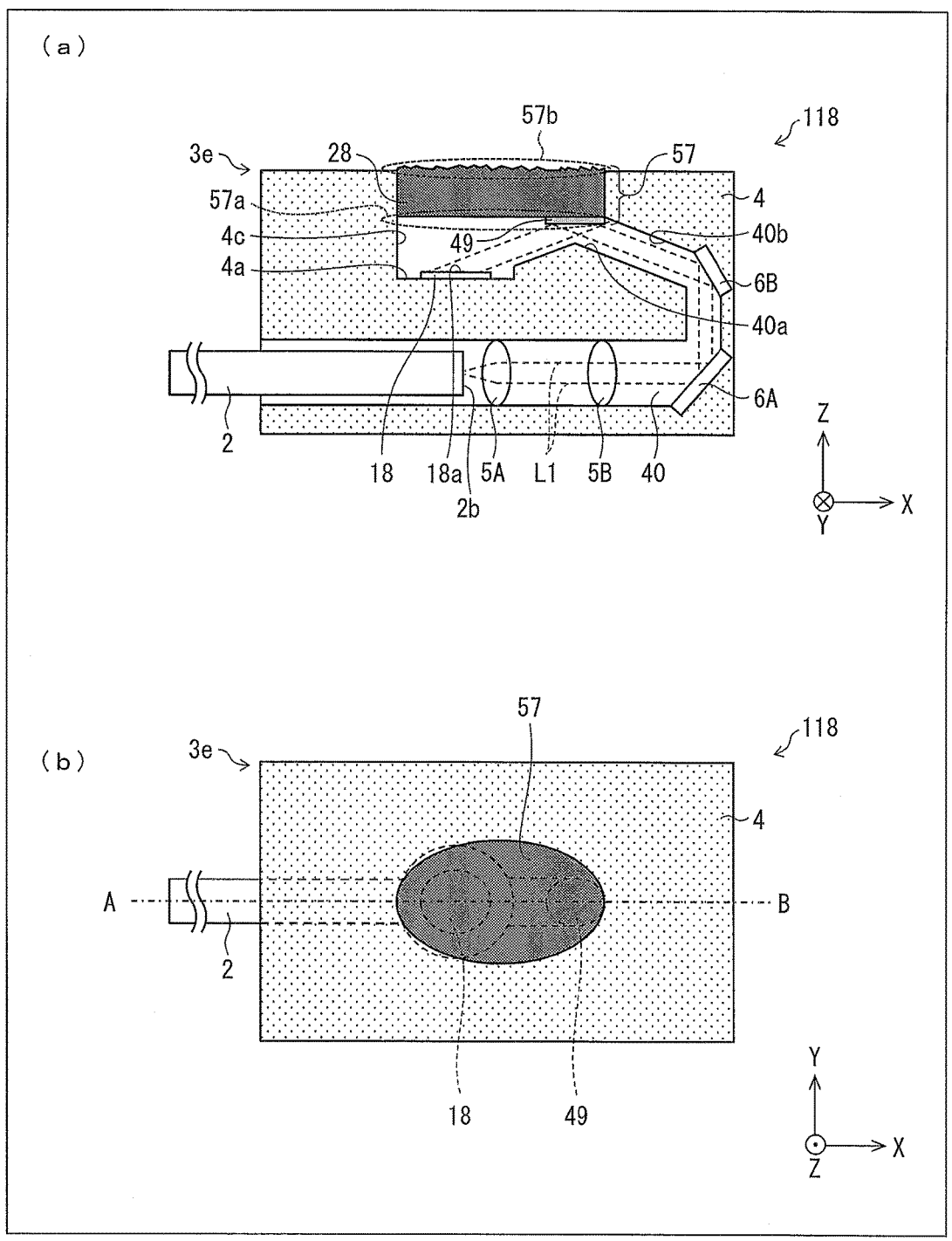
FIG. 34 (a) is a cross-sectional view illustrating the configuration of a light-emitting device in accordance with Embodiment 11, and FIG. 34 (b) is a top view illustrating the configuration of the light-emitting device illustrated in FIG. 34 (a).

The following will describe another embodiment of the present invention with reference to FIG. 34. In Embodiment 11, a light-emitting device will be described which includes, as a light-emitting section, a scattering section for scattering a laser beam.

For convenience of explanation, members of Embodiment 11 that are identical in function to their respective corresponding members described in Embodiments 1 to 10 are each assigned a common reference numeral, and are not described here.

First, a configuration of a light-emitting device 118 in accordance with Embodiment 11 will be described. The light-emitting device 118 emits, as illumination light, a laser beam L1.

(a) of FIG. 34 is a cross-sectional view illustrating the configuration of the light-emitting device 118. (b) of FIG. 34 is a top view illustrating the light-emitting device 118 of (a) of FIG. 34. (a) of FIG. 34 is a cross-sectional view illustrating the light-emitting device 118 of (b) of FIG. 34 taken along line A-B in (b) of FIG. 34. (a) of FIG. 34 illustrates the configuration of a central portion of the light-emitting device 118 in a cross section taken in the Z axis direction.

As illustrated in (a) of FIG. 34, the light-emitting device 118 includes a laser element 1 (not illustrated) and a light-emitting unit 3e. The light-emitting device 118 is configured such that the laser element 1 and the light-emitting unit 3e are connected to each other via the optical fiber 2.

The laser element 1 is a light emitting element to emit a laser beam L1. In Embodiment 11, a plurality of laser elements 1 are employed to output blue, green, and red laser beams L1, respectively. For example, the blue laser beam is emitted with an output power of 1 W at a wavelength of 460 nm. The green laser beam is emitted with an output power of 1.2 W at a wavelength of 530 nm. The red laser beam is emitted with an output power of 2 W at a wavelength of 640 nm. The laser beams L1 emitted from the respective laser elements 1 are guided to the inside of the light-emitting unit 3e by the optical fiber 2.

The optical fiber 2 is a light guiding section for guiding, to the light-emitting unit 3a, a laser beam L1 emitted from the laser element 1. The light guiding section employed in Embodiment 11 is a light guiding section configured such that a (a) bundle fiber in which a plurality of optical fibers 2 tied into bundle are optically coupled to the respective laser elements 1 and a (b) multimode fiber are optically coupled to each other. With such a configuration, the plurality of laser beams L1 are mixed, by being guided by the multimode fiber, to form a laser beam L1 having a continuous, smooth, top hat type intensity distribution, and the laser beam L1 is then emitted from an emission end of the multimode fiber.

The light-emitting unit 3e intends to release a laser beam L1 (emission light, scattered light) that is scattered by irradiation of the scattering section 18 with a laser beam L1 emitted from the emission end 2b of the optical fiber 2. The light-emitting unit 3e includes: the casing (placement section) 4; two lenses 5A and 5B; mirrors (reflection mirrors) 6A and 6B; a reflecting/diffusing plate (optical plate) 57; and a scattering section (light-emitting section) 18.

In the casing 4, the emission end 2b of the optical fiber 2, which is inserted into the casing 4 from a side surface of the casing 4, is fixed on the side of the starting end of the internal passage 40, so that a laser beam L1 entering the starting end passes through the internal passage 40 and then exits from the opening 40a toward the reflecting/diffusing plate 57. In the internal passage 40, the lenses 5A and 5B and the mirrors 6A and 6B are provided in this order when seen from an upstream side of the internal passage 40 along a direction in which the laser beam L1 travels through the internal passage 40.

The lenses 5A and 5B are optical elements for adjusting (for example, enlarging and reducing) a beam diameter (irradiation range) of an incoming laser beam L1 so that the laser beam L1 can properly strike a laser beam irradiation surface 18a of the scattering section 18. Control of the beam diameter with use of the lenses 5A and 5B further facilitates adjustment in spot size of a final laser beam L1 with which the scattering section 18 is to be irradiated.

The mirrors 6A and 6B intend to reflect a laser beam L1. The mirrors 6A and 6B are provided respectively at two bending parts of the internal passage 40. The mirror 6A intends to reflect the laser beam L1 toward the mirror 6B. Further, the mirror 6B intends to reflect, toward the reflecting/diffusing plate 57, the laser beam L1 reflected by the mirror 6A. Provision of these two mirrors 6A and 6B facilitates adjusting the angle of incidence of the laser beam L1 with respect to the vapor deposition mirror 49. Further, folding an optical path of the laser beam L1 at a plurality of times in the casing 4 enables an increase in degree of freedom in designing the layout of an interior of the casing 4.

The reflecting/diffusing plate 57 intends to reflect, toward the scattering section 18, a laser beam L1 emitted from the emission end 2b of the optical fiber 2 and to transmit and diffuse a laser beam L1 scattered by the scattering section 18 upon irradiation with the laser beam L1 reflected.

In Embodiment 11, the reflecting/diffusing plate 57 includes the diffusing plate 28 and the vapor deposition mirror 49.

The diffusing plate 28 intends to transmit and diffuse the laser beam L1 scattered by the scattering section 18. The diffusing plate 28 is, for example, a frosted diffusing plate that is made of glass or the like and that has a surface (that is, the light exit surface 57b) opposite to the scattering section 18, the surface being processed to be a ground glass-like surface. The material and arrangement of the diffusing plate 28 are selected as appropriate according to need.

The vapor deposition mirror 49 intends to reflect the laser beam L1 toward the scattering section 18. The vapor deposition mirror 49 is provided at a portion of a surface (light entry surface 57a) of the scattering section 18 which surface faces the diffusing plate 28. The laser beam L1 scattered by the scattering section 18 passes through a region of the diffusing plate 28 in which region the vapor deposition mirror 49 is absent. Thus, the region in which the vapor deposition mirror 49 is absent has a shape corresponding to the shape (in Embodiment 11, a circular opening) of an apparent light source of the light-emitting device 118.

The reflecting/diffusing plate 57, which has the above arrangement, is located so as to face the laser beam irradiation surface 18a of the scattering section 18 and is held at its edge by the inner surface of the casing 4. The reflecting/diffusing plate 57 is positioned so that the region in which the vapor deposition mirror 49 is absent is placed at such a position as to face the laser beam irradiation surface 18a of the scattering section 18.

The scattering section 18 intends to scatter an incoming laser beam L1. In Embodiment 11, the scattering section 18 diffuse-reflects the laser beam L1 reflected by the vapor deposition mirror 49, thereby emitting scattered light (emission light) that is the laser beam L1 in scattered state. Diffuse reflection refers to diffusing light by reflecting a portion of incoming light at a reflection angle that is different from an incidence angle of the incoming light. The scattering section 18 can be a metal plate or the like having minute irregularities on its surface. In particular, a metal from which the scattering section 18 is made is preferably a material, such as aluminum, having a high reflectivity with respect to white light. Note that the scattering section 18 needs only to diffuse-reflect the laser beam L1. For example, the scattering section 18 can be a ceramic member having a high reflectivity or a member coated with a material having a high reflectivity, such as barium sulfate. Alternatively, the scattering section 18 can be prepared by dispersing scattered particles in a sealant having transparency to light.

As described above, the light-emitting device 118 includes the scattering section 18 and is configured to release a laser beam L1 scattered by the scattering section 18.

In a case where the fluorescent material is not used, and mixture light composed of a plurality of laser beams L1 is employed as the illumination light, uneven distribution of the laser beams L1 may occur due to the state of mixture, aberration, etc., and thus lead to color unevenness.

In view of this, the light-emitting device 118 is arranged such that the laser beams L1 scattered by the scattering section 18 are diffused by the reflecting/diffusing plate 57.

This arrangement mixes the laser beams L1 to be released out of the light-emitting device 118, thus preventing the occurrence of color unevenness. This arrangement suitably prevents, in particular, color unevenness that is caused by aberration or the like of an optical system in a case where a plurality of laser beams L1 of different colors are scattered in mixed state.

Consequently, the light-emitting device 118 of Embodiment 11 has high luminance with use of the laser beam L1 emitted as the illumination light, while having improved efficiency of light use and preventing the occurrence of color unevenness.

Since the light exit surface 57b has the function of diffusing fluorescence L2, the light exit surface 57b is, as mentioned above, seen as an apparent light source when the light-emitting device is seen from the outside. This allows other optical elements to be optically designed on the assumption that while it is the scattering section 18 in the light-emitting unit 3e that actually emits light, the portion (circular window portion) of the light exit surface 57b at which portion light is not blocked by the vapor deposition mirror 49 is seen as emitting light when the light-emitting device 118 is seen from the outside. Thus, selecting the sizes and shapes of the light exit surface 57b and the vapor deposition mirror 49 makes it possible to freely set the size and shape of an apparent light source that is seen as such when the light-emitting device 118 is seen from the outside.

The light-emitting device 118 is particularly preferably used in a configuration with an optical system installed which uses the outermost portion (light exit surface 57b) of the diffusing plate 28 as an apparent light source to, for example, cast light to the outside of the optical system as in the configurations illustrated in FIGS. 26, 27, 29, and 30.

A light-emitting unit in accordance with Aspect 1 of the present invention includes: a light-emitting section (fluorescent section 8, scattering section 18) for emitting emission light (fluorescence L2, scattered light) upon irradiation with excitation light (laser beam L1); and an optical plate (wavelength selection filter 7, reflecting/diffusing plate 27, 47, 57, light reflecting/transmitting plate 74) being provided so as to face the light-emitting section, the optical plate (i) reflecting, toward the light-emitting section, the excitation light emitted from an excitation light source (laser element 1) and (ii) transmitting the emission light emitted from the light-emitting section upon irradiation with the excitation light.

According to the above arrangement, the light-emitting unit includes the optical plate that is provided so as to face the light-emitting section. The optical plate (i) reflects the excitation light toward the light-emitting section and (ii) transmits emission light generated by the light-emitting section upon irradiation with the excitation light reflected.

With the above arrangement, the optical plate reflecting the excitation light, emitted from the excitation light source, toward the light-emitting section allows the light-emitting section to generate the emission light upon irradiation with the excitation light. The above arrangement thus eliminates the need to place, between the light-emitting section and the optical plate, (i) an excitation light source for irradiating the light-emitting section with excitation light and (ii) a mirror.

The above arrangement prevents a component such as an excitation light source, which is placed between the light-emitting section and the optical plate, from blocking a portion of emission light generated by the light-emitting section, and consequently allows efficient use of the emission light.

In addition, the above arrangement eliminates the need for finding a room to place a component such as an excitation light source between the light-emitting section and the optical plate, and therefore makes it possible to place the optical plate in proximity to the light-emitting section. Thus, in a case where emission light transmitted by the optical plate is to be cast through a light distribution controlling member such as a projection lens, it is possible to place the projection lens or the like in proximity to the light-emitting section. This allows emission light released in Lambertian distribution by the light-emitting section to enter the projection lens or the like without losses and to be cast through the projection lens or the like.

As such, the above arrangement makes it possible to realize a light-emitting unit having improved efficiency of light use.

Further, a light-emitting unit in accordance with Aspect 2 of the present invention may be arranged such that, in the Aspect 1, the light-emitting section (fluorescent section 8) contains a fluorescent material that emits fluorescence upon irradiation with the excitation light, and the emission light contains the fluorescence.

According to the above arrangement, the light-emitting section contains a fluorescent material that emits fluorescence upon irradiation with the excitation light. This arrangement allows the emission light containing fluorescence to be emitted as illumination light.

Still further, a light-emitting unit in accordance with Aspect 3 of the present invention may be arranged such that, in the Aspect 2, the optical plate is provided so as to face an excitation light irradiation surface of the light-emitting section, which surface is to be irradiated with the excitation light, and the excitation light irradiation surface of the light-emitting section mainly emits the fluorescence.

According to the above arrangement, the excitation light irradiation surface of the light-emitting section mainly emits the fluorescence, and the optical plate is provided so as to face the excitation light irradiation surface. This arrangement allows the fluorescence emitted from the excitation light irradiation surface to efficiently enter the optical plate and then be released out of the light-emitting unit.

According to the above arrangement, it is thus possible to further increase the efficiency of light use.

Yet further, a light-emitting unit in accordance with Aspect 4 of the present invention may be arranged such that, in the Aspect 2 or 3, the optical plate contains a reflection-type filter for reflecting the excitation light and transmitting the fluorescence.

The above arrangement allows the optical plate of the present invention to be suitably realized with use of the reflection-type filter for transmitting light (fluorescence) in a particular wavelength range and reflecting light (excitation light) in the other wavelength range.

Further, a light-emitting unit in accordance with Aspect 5 of the present invention may be arranged such that, in the Aspect 4, the optical plate further contains an absorption-type filter for selectively absorbing the excitation light, the absorption-type filter being provided on one surface of the reflection-type filter which surface is opposite to the other surface thereof that reflects the excitation light.

According to the above arrangement, the optical plate further contains the absorption-type filter for transmitting light (fluorescence) in a particular wavelength range and absorbing light (excitation light) in the other wavelength range. As such, even in a case where the reflection-type filter transmits a stray-light component of the excitation light entering the light-emitting section, which stray-light component is a component that was not converted into the fluorescence, the absorption-type filter absorbs the stray-light component thus transmitted of the excitation light.

According to the above arrangement, it is thus possible to more reliably prevent the stray-light component of the excitation light from leaking to the outside.

Still further, a light-emitting unit in accordance with Aspect 6 of the present invention may be arranged such that, in the Aspect 4 or 5, the excitation light has a wavelength of not less than 390 nm and not more than 410 nm.

According to the above arrangement, for example, a bluish-purple laser beam or a blue laser beam can be suitably used as the excitation light.

Yet further, a light-emitting unit in accordance with Aspect 7 of the present invention may be arranged such that, in the Aspect 2, the optical plate (light reflecting/transmitting plate 74) includes: a light transmission member for transmitting the excitation light and the fluorescence; and a reflection film, provided at a portion of the light transmission member, for reflecting the excitation light toward the light-emitting section.

In the above arrangement, the optical plate allows the reflection film, which is provided at a portion of the light transmission member, to reflect, toward the light-emitting section, the excitation light emitted from the excitation light source, so that the light-emitting section is irradiated with the excitation light thus reflected and thus generates fluorescence. In addition, the optical plate allows the light transmission member to transmit the fluorescence generated by the light-emitting section, so that the fluorescence is released to the outside.

According to the above arrangement, it is thus possible to suitably realize the optical plate of the present invention with use of the light transmission member and the reflection film, which is provided at a portion of the light transmission member.

Further, a light-emitting unit in accordance with Aspect 8 of the present invention may be arranged such that, in the Aspect 7, the light-emitting section is provided to be slanted with respect to the reflection film so that the reflection film is prevented from being irradiated with the fluorescence emitted from the light-emitting section.

According to the above arrangement, it is possible to reduce the amount of fluorescence blocked by the reflection film and to thus increase the efficiency with which the light-emitting unit extracts fluorescence.

Still further, a light-emitting unit in accordance with Aspect 9 of the present invention may be arranged such that, in the Aspect 7 or 8, the excitation light has a wavelength of not less than 440 nm and not more than 480 nm.

According to the above arrangement, it is possible to (i) use, as a portion of illumination light, the excitation light, which is visible light, together with the fluorescence and to (ii) prevent a decreased excitation efficiency of the light-emitting section due to the excitation light.

Yet further, a light-emitting unit in accordance with Aspect 10 of the present invention may be arranged such that, in any one of the Aspects 1 through 9, the optical plate diffuses the emission light emitted from the light-emitting section.

In the above arrangement, the optical plate transmits and diffuses the emission light emitted from the light-emitting section. This causes the emission light to be evened out when released out of the light-emitting unit, thus preventing color unevenness.

According to the above arrangement, it is thus possible to realize a light-emitting unit capable of improving the efficiency of light use and preventing color unevenness.

Since the optical plate has the function of diffusing the emission light, the optical plate operates as an apparent light source when a light exit surface of the optical plate is seen from the outside of the light-emitting unit. As such, selecting the size and shape of the light exit surface of the optical plate makes it possible to obtain any light source (apparent light source).

Further, a light-emitting unit in accordance with Aspect 11 of the present invention may be arranged such that, in the Aspect 1, the light-emitting section (scattering section 18) scatters the excitation light upon irradiation with the excitation light, and the emission light is scattered light which is the excitation light in scattered state.

According to the above arrangement, the light-emitting section intends to scatter the excitation light upon irradiation with the excitation light. This makes it possible to use, as illumination light, the excitation light scattered by the light-emitting section.

Still further, a light-emitting unit in accordance with Aspect 12 of the present invention may be arranged such that, in any one of the Aspects 1 through 11, the light-emitting unit further includes: a placement section (casing 4, 24, lower casing part 41) having a placement surface on which the light-emitting section is placed, the placement section having an internal passage to guide the excitation light, the internal passage having one end that has an opening provided at the placement surface, and the optical plate reflecting, toward the light-emitting section, the excitation light exiting from the opening.

According to the above arrangement, the optical plate reflects, toward the light-emitting section, the excitation light exiting from the opening that is provided at the placement surface where the light-emitting section is placed. This makes it possible to place the excitation light source on the side of the placement section with respect to the light-emitting section.

According to the above arrangement, it is thus possible to suitably place the excitation light source at such a position that the excitation light source does not block the emission light emitted from the light-emitting section.

Yet further, a light-emitting unit in accordance with Aspect 13 of the present invention may be arranged such that, in the Aspect 12, the light-emitting unit further includes: a reflection mirror (mirror 6, dielectric multilayer film mirror 65, MEMS mirror 66, concave mirror 68), provided in the internal passage, for reflecting, toward the optical plate, the excitation light emitted from the excitation light source, the reflection mirror reflecting, toward the opening, the excitation light entering the internal passage from the other end of the internal passage.

According to the above arrangement, since the excitation light entering the internal passage from the other end of the internal passage is reflected toward the opening by the reflection mirror, it is possible to adjust the angle of incidence of excitation light with respect to the optical plate by changing an installation angle (inclination) of the reflection mirror.

According to the above arrangement, it is thus possible to easily adjust the incidence angle of the excitation light with respect to the optical plate, as compared with the arrangement in which a change is made in installation angle of the excitation light source.

Further, a light-emitting unit in accordance with Aspect 14 of the present invention may be arranged such that, in the Aspect 13, the light-emitting unit further includes: an angle changing section (drive section 66b) for changing an angle of the reflection mirror.

According to the above arrangement, the angle changing section is controlled to change the angle of the reflection mirror, so that the excitation light can strike any desired position on the light-emitting section. This arrangement thus makes it possible to shift a luminescent center for the light-emitting section, and consequently makes it possible to change the position from which the emission light passes through the optical plate and is then released.

According to the above arrangement, in a case where, for instance, the emission light transmitted by the optical plate is to be cast through the projection lens or the like light distribution controlling member, it is possible to shift the position of irradiation of the excitation light on the light-emitting section to easily change the position of the pattern in which the emission light is cast through the projection lens or the like.

Still further, a light-emitting unit in accordance with Aspect 15 of the present invention may be arranged such that, in the Aspect 13 or 14, the reflection mirror (dielectric multilayer film mirror 65) transmits a portion of the excitation light, and the light-emitting unit further includes a detecting section (light intensity detecting section 9) for detecting an intensity of the excitation light transmitted by the reflection mirror.

According to the above arrangement, the light-emitting unit further includes the detecting section for detecting the intensity of a portion of the excitation light which portion has been transmitted by the reflection mirror. Thus, monitoring the result of detection by the detecting section allows detection of a change in intensity of the excitation light.

The above arrangement thus enables feedback control on the excitation light source on the basis of the result of detection by the detecting section so that the excitation light has a constant intensity. The above arrangement further makes it possible to find early, on the basis of the result of detection by the detecting section, the occurrence of defect, such as deterioration of the excitation light source, displacement of the optical member(s), and breakage of the optical member(s).

The above arrangement thus allows the light-emitting unit to have a stable light emitting function, and also makes it possible to find a defect of the excitation light source and other component(s) early for improved safety of the light-emitting unit.

Yet further, a light-emitting unit in accordance with Aspect 16 of the present invention may be arranged such that, in any one of the Aspects 12 through 15,
the light-emitting unit further includes: a light guiding section (optical fiber 2, rod lens 32) for causing the excitation light emitted from the excitation light source, which is provided outside the placement section, to enter the internal passage from the other end of the internal passage.

According to the above arrangement, provision of the light guiding section allows the excitation light source to be provided outside the placement section and thus makes it possible to downsize the light-emitting unit. Further, the above arrangement enables an increased space between the excitation light source and the light-emitting section, thus making it possible to avoid the light-emitting section from being deteriorated by heat generated by the excitation light source.

Still further, according to the above arrangement, the light guiding section causes the excitation light emitted from the excitation light source, which is provided outside the placement section, to enter the internal passage. This makes it possible to offer a high degree of freedom in designing the position where the excitation light source is provided.

Further, a light-emitting unit in accordance with Aspect 17 of the present invention may be arranged such that, in the Aspect 16, the light guiding section comprises an optical fiber that includes a core having a quadrangular shape at an excitation light emission end from which the excitation light exits.

According to the above arrangement, an image corresponding to the excitation light exiting from the optical fiber that includes the core having a quadrangular shape at the emission end is formed on the light-emitting section. This allows the light-emitting section to emit light in a rectangular shape.

According to the above arrangement, it is thus possible to cast light, to a far position, in a shape that is identical to the shape of the light emitted from the light-emitting section, and is therefore possible to cast light with a rectangular pattern. Consequently, the light cast with such a pattern can be suitably utilized as, for example, a part of a cutoff line of a low beam (dipped beam) for an automobile headlamp.

Still further, a light-emitting unit in accordance with Aspect 18 of the present invention may be arranged such that, in any one of the Aspects 1 through 17, the optical plate (wavelength selection filters 7a and 7b) has a curved surface shape and is open to a side of the light-emitting section.

According to the above arrangement, the optical plate has a curved surface shape and is open to a side of the light-emitting section. This arrangement allows the optical plate to efficiently receive the emission light released in Lambertian distribution from the light-emitting section and then release the light thus received to the outside.

According to the above arrangement, it is thus possible to further improve the efficiency of light use.

Yet further, a light-emitting unit in accordance with Aspect 19 of the present invention may be arranged such that, in the Aspect 18, the optical plate (wavelength selection filters 7a and 7b) has one of (a) a shape of a paraboloid of revolution and (b) a shape of an ellipsoid of revolution.

According to the above arrangement, it is possible to suitably obtain an optical plate having a curved surface shape and being capable of efficiently receiving the emission light released in Lambertian distribution from the light-emitting section and then releasing the light thus received to the outside.

A light-emitting device in accordance with Aspect 20 includes: the foregoing light-emitting unit; and the excitation light source according to any one of the Aspects 1 through 19.

According to the above arrangement, it is possible to realize a light-emitting device having improved efficiency of light use.

An illumination device (headlamps 200 through 204) in accordance with Aspect 21 of the present invention includes: the light-emitting device according to the Aspect 20; and a light casting section (projection lens 10, reflector 15) for casting the emission light transmitted by the optical plate.

According to the above arrangement, it is possible to realize an illumination device having improved efficiency of light use.

An illumination device in accordance with Aspect 22 of the present invention may be arranged such that, in the Aspect 21, the light casting section (i) enlarges light distributed at a light exit surface, as a reference surface, of the optical plate that emits the emission light, and (ii) projects the light thus enlarged.

According to the above arrangement, the light casting section enlarges light distributed at a light exit surface of the optical plate and projects the enlarged light. This allows the illumination device to (i) enlarge a light source image corresponding to the shape and position of the light-emitting section and (ii) cast light corresponding to the enlarged image.

A vehicle headlight (headlamps 200 through 204) in accordance with Aspect 23 of the present invention includes: the light-emitting device according to the Aspect 20; and a light casting section for casting the emission light transmitted by the optical plate.

According to the above arrangement, it is possible to realize a vehicle headlight having improved efficiency of light use.

The present invention is not limited to the descriptions of the Embodiments, but can be altered by a person skilled in the art within the scope of the claims. An embodiment derived from a proper combination of technical means disclosed in different embodiments is also encompassed in the technical scope of the present invention. Moreover, a novel technical feature can be created by a combination of technical means disclosed in these embodiments.

The present invention can be presented as follows. That is, a light-emitting unit in accordance with Aspect 24 of the present invention is preferably arranged such that, in any one of the Aspects 2 through 6, the optical plate reflects, toward the light-emitting section, a portion of the excitation light emitted to the light-emitting section, the portion failing to be converted into the fluorescence.

Most of the excitation light emitted to the light-emitting section is absorbed by the fluorescent material to be converted into fluorescence. However, an event that a portion of the excitation light fails to be converted into the fluorescence can occur due to some cause.

According to the above arrangement, even in such an event, the optical plate reflects, toward the light-emitting section, the excitation light which has failed to be converted into the fluorescence. This makes it possible to prevent the excitation light from being leaked to the outside.

A light-emitting unit in accordance with Aspect 25 of the present invention includes: a light-emitting section for emitting fluorescence upon irradiation with excitation light; and an optical plate (light reflecting/transmitting plate 74) located so as to face the light-emitting section, the optical plate having a reflection region (reflection film 76) for reflecting the excitation light from the excitation light source toward the light-emitting section, and the optical plate transmitting the fluorescence that the light-emitting section emits upon irradiation with the excitation light reflected by the reflection region.

According to the above arrangement, the light-emitting unit includes the optical plate located so as to face the light-emitting section, the optical plate having a reflection region for reflecting the excitation light toward the light-emitting section. Using the reflection region of the optical plate to reflect the excitation light emitted from the excitation light source toward the light-emitting section allows the excitation light to be emitted to the light-emitting section for generation of fluorescence. This arrangement eliminates the need to provide, between the light-emitting section and the optical plate, a separate excitation light source or mirror for illuminating the light-emitting section with the excitation light.

The light-emitting unit, with the above arrangement, eliminates the need for finding a room for an excitation light source or the like between the light-emitting section and the optical plate, thus allowing the optical plate to be placed in proximity to the light-emitting section. Thus, in a case where fluorescence transmitted by the optical plate is to be cast through a light distribution controlling member such as a projection lens, it is possible to place the projection lens or the like in proximity to the light-emitting section. This allows fluorescence released in Lambertian distribution by the light-emitting section to enter the projection lens or the like without losses and to be cast through the projection lens or the like.

According to the above arrangement, it is thus possible to provide the light-emitting unit having improved efficiency of light use. Further, according to the above arrangement, it is possible to provide a light-emitting device having high luminance as it is capable of releasing excitation light to the outside together with fluorescence for use as a portion of illumination light.

A light-emitting unit in accordance with Aspect 26 of the present invention is preferably arranged such that, in the Aspect 25, in an optical path that extends from (i) the excitation light emission end of the excitation light source for emitting the excitation light to (ii) the excitation light irradiation surface of the light-emitting section, which surface is to be irradiated with the excitation light, a first optical path length is smaller than a second optical path length, wherein the first optical path length is a length of a portion of the above optical path which portion extends from the excitation light emission end to a nonplanar first optical element surface located most upstream along the optical path, and the second optical path length is a length of a portion of the above optical path which portion extends from a nonplanar second optical element surface located most downstream along the optical path to the excitation light irradiation surface.

According to the above arrangement, relatively decreasing the first optical path length makes it possible to (i) suitably guide, to the first optical element surface, the excitation light emitted from the excitation light emission end and to (ii) control the beam diameter of the excitation light. Further, relatively increasing the second optical path makes it possible to (i) easily control the beam diameter of the excitation light emitted from the second optical element surface and entering the excitation light irradiation surface, and consequently to (ii) emit the excitation light with an optimal beam diameter to the excitation light irradiation surface.

A light-emitting unit in accordance with Aspect 27 of the present invention includes: one of a (a) light-emitting section for emitting fluorescence upon irradiation with a laser beam and a (b) diffusing section for diffusing a laser beam; and an optical plate being placed so as to face one of the (a) light-emitting section and the (b) diffusing section, the optical plate (i) reflecting, toward one of the (a) light-emitting section and the (b) diffusing section, the laser beam emitted from a laser light source and (ii) scattering illumination light emitted from one of the (a) light-emitting section and the (b) diffusing section upon irradiation with the laser beam.

Further, a light-emitting unit in accordance with Aspect 28 of the present invention may be arranged such that, in the Aspect 27, the optical plate is provided so as to face a laser beam irradiation surface of one of the (a) light-emitting section and the (b) diffusing section, which surface is to be irradiated with the laser beam, and the laser beam irradiation surface of one of the (a) light-emitting section and the (b) diffusing section mainly emits the illumination light.

Still further, a light-emitting unit in accordance with Aspect 29 of the present invention may be arranged such that, in the Aspect 27 or 28, the light-emitting unit further includes: a placement section having a placement surface on which one of the (a) light-emitting section and the (b) diffusing section is placed, the placement section having an internal passage to guide the laser beam, the internal passage having one end that has an opening provided at the placement surface, and the optical plate reflecting, toward one of the (a) light-emitting section and the (b) diffusing section, the laser beam exiting from the opening.

A light-emitting device in accordance with Aspect 30 of the present invention includes: the light-emitting unit of the Aspect 27 through 30; and a light casting member.

A light-emitting device in accordance with Aspect 31 of the present invention may be arranged such that, in the Aspect 30, the light-emitting device includes: one of a (a) light-emitting section for emitting fluorescence and a (b) diffusing section for diffusing a laser beam, upon irradiation with a laser beam; and a scattering member being provided at such a position so as to face one of the (a) light-emitting section and the (b) diffusing section, and further includes an optical component for enlarging light distributed at a surface of the scattering member as a reference surface and projecting the enlarged light.

The present invention is applicable to a light-emitting device and an illumination device, and particularly to a headlamp for a vehicle and the like, to allow them to have an increased efficiency of light use.

REFERENCE SIGNS LIST

1 Laser element (excitation light source)
1a Laser beam (laser light emission end)
2 Optical fiber (light guiding section)
2b Emission end (excitation light emission end)
3, 3a to 3e, and 35 to 39 Light-emitting unit
4, 24 Casing (placement section)
4a Placement surface
4c Inner wall
5a Entry surface (first optical element surface)
6, 6A, 6B Mirror (reflection mirror)
7, 7a, 7b Wavelength selection filter (optical plate, reflection-type filter)
8 Fluorescent section (light-emitting section)
8a Laser beam irradiation surface (excitation light irradiation surface)
9 Light intensity detecting section (detecting section)
10 projection lens (light casting section)
15 Reflector (light casting section)
16b Exit surface (second optical element surface)
17 Absorption-type filter (optical plate)
18 Scattering section (light-emitting section)
21 Core
27, 47, 57 Reflecting/diffusing plate (optical plate)
27a Light entry surface
27b Light exit surface
28, 48 Diffusing plate 28 (optical plate)
32 Rod lens (light guiding section)
40 Internal passage
40a Opening
48a diffusion film (optical plate)
48b Glass substrate (optical plate)
49 Vapor deposition mirror (optical plate)
65 Dielectric multilayer film mirror (reflection mirror)
66 MEMS mirror (reflection mirror)
66a Mirror section (reflection mirror)
66b Drive section (angle changing section)
68 Concave mirror (reflection mirror)
68a Reflective surface (second optical element surface)
72 Multilayer film (optical plate)
74 Light reflecting/transmitting plate (optical plate)
75 Glass plate (light transmitting plate)
76 Reflection film (reflection region)
100 to 118 Light-emitting device
200 to 204 Headlamp (vehicle headlight, illumination device)
A Optical path length (first optical path length)
B Optical path length (second optical path length)
F1 First focal point
F2 Second focal point
L1 Laser beam (excitation light)
L2 Fluorescence (emission light)

The invention claimed is:

1. A light-emitting unit comprising:
a light-emitting section for emitting emission light upon irradiation with excitation light emitted from a laser device;
an optical plate provided so as to face the light-emitting section;
a convex lens provided between the laser device and the optical plate in an optical path of the excitation light; and
a placement section having a placement surface on which the light-emitting section is placed,
the optical plate (i) reflecting, toward the light-emitting section, the excitation light emitted from the laser device and (ii) transmitting the emission light emitted from the light-emitting section upon irradiation with the excitation light,
the placement section having an internal passage to guide the excitation light, the internal passage having one end that has an opening provided at the placement surface, and the optical plate reflecting, toward the light-emitting section, the excitation light exiting from the open end,
the light emitting unit being configured such that the excitation light emitted from the laser device is first led to the convex lens, thereafter to the optical plate, and then to the light-emitting section after reflection at the optical plate, wherein substantially all of the excitation light having passed through the convex lens is led to the optical plate before reaching the light-emitting section, and
a surface of the optical plate for the reflection being flat.

2. The light-emitting unit according to claim 1, wherein the light-emitting section contains a fluorescent material that emits fluorescence upon irradiation with the excitation light, and
the emission light contains the fluorescence.

3. The light-emitting unit according to claim 2, wherein the optical plate is provided so as to face an excitation light irradiation surface of the light-emitting section, which surface is to be irradiated with the excitation light, and
the excitation light irradiation surface of the light-emitting section mainly emits the fluorescence.

4. The light-emitting unit according to claim 2, wherein the optical plate contains a reflection filter for reflecting the excitation light and transmitting the fluorescence.

5. The light-emitting unit according to claim 4, wherein the optical plate further contains an absorption filter for selectively absorbing the excitation light, the absorption filter being provided on one surface of the reflection filter which surface is opposite to the other surface thereof that reflects the excitation light.

6. The light-emitting unit according to claim 4, wherein the excitation light has a wavelength of not less than 390 nm and not more than 410 nm.

7. The light-emitting unit according to claim 2, wherein the optical plate comprises: a light transmission member for transmitting the excitation light and the fluorescence; and a reflection film, provided at a portion of the light transmission member, for reflecting the excitation light toward the light-emitting section.

8. The light-emitting unit according to claim 7, wherein the light-emitting section is provided to be slanted with respect to the reflection film so that the reflection film is prevented from being irradiated with the fluorescence emitted from the light-emitting section.

9. The light-emitting unit according to claim 1, wherein the optical plate diffuses the emission light emitted from the light-emitting section.

10. The light-emitting unit according to claim 1, wherein the light-emitting section scatters the excitation light upon irradiation with the excitation light, and
the emission light is scattered light which is the excitation light in scattered state.

11. The light-emitting unit according to claim 1, further comprising:
a reflection mirror, provided in the internal passage, for reflecting, toward the optical plate, the excitation light emitted from the excitation light source,
the reflection mirror reflecting, toward the opening, the excitation light entering the internal passage from the other end of the internal passage.

12. The light-emitting unit according to claim 11, further comprising:
an angle changing section for changing an angle of the reflection mirror.

13. The light-emitting unit according to claim 11, wherein
the reflection mirror transmits a portion of the excitation light, and
said light-emitting unit further comprises a detecting section for detecting an intensity of the excitation light transmitted by the reflection mirror.

14. The light-emitting unit according to claim 1, further comprising:
a light guiding section for causing the excitation light emitted from the excitation light source, which is provided outside the placement section, to enter the internal passage from the other end of the internal passage.

15. A light-emitting device comprising:
the light-emitting unit according to claim 1; and
the excitation light source.

16. An illumination device comprising:
the light-emitting device according to claim 15; and
a light casting section for casting the emission light transmitted by the optical plate.

17. The illumination device according to claim 16, wherein
the light casting section (i) enlarges light distributed at a light exit surface, as a reference surface, of the optical plate that emits the emission light, and (ii) projects the light thus enlarged.

18. A vehicle headlight comprising:
the light-emitting device according to claim 15; and
a light casting section for casting the emission light transmitted by the optical plate.

* * * * *